(12) United States Patent
Asai et al.

(10) Patent No.: US 8,021,748 B2
(45) Date of Patent: Sep. 20, 2011

(54) INTERLAYER INSULATING LAYER FOR PRINTED WIRING BOARD, PRINTED WIRING BOARD AND METHOD FOR MANUFACTURING SAME

(75) Inventors: Motoo Asai, Gifu (JP); Kouta Noda, Gifu (JP); Yasushi Inagaki, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 10/557,206

(22) PCT Filed: Sep. 29, 2004

(86) PCT No.: PCT/JP2004/014672
§ 371 (c)(1),
(2), (4) Date: Nov. 17, 2005

(87) PCT Pub. No.: WO2005/032227
PCT Pub. Date: Apr. 7, 2005

(65) Prior Publication Data
US 2007/0013049 A1    Jan. 18, 2007

(30) Foreign Application Priority Data

Sep. 29, 2003  (JP) ................................ 2003-336861
Jun. 30, 2004  (JP) ................................ 2004-194868

(51) Int. Cl.
*B32B 5/16* (2006.01)
(52) U.S. Cl. ...................................... 428/323
(58) Field of Classification Search ............ 428/323
See application file for complete search history.

(56) References Cited

U.S. PATENT DOCUMENTS
5,173,442 A    12/1992 Carey
(Continued)

FOREIGN PATENT DOCUMENTS
JP    2000 194142    7/2000
(Continued)

OTHER PUBLICATIONS

Xu et al., Effect of clay type on morphology and thermal stability of PMMA-clay nanocomposites prepared by heterocoagulation method, Elsevier Ltd., Polymer (2004) 3735-3746.*

(Continued)

*Primary Examiner* — Callie Shosho
*Assistant Examiner* — Elizabeth Robinson
(74) *Attorney, Agent, or Firm* — Oblon, Spivak, McClelland, Maier & Neustadt, L.L.P.

(57) ABSTRACT

A printed wiring board is provided which includes an interlayer dielectric layer formed on a substrate from a curable resin having flaky particles dispersed therein. The printed wiring board is excellent in cooling/heating cycle resistance and packaging reliability while maintaining a satisfactory heat resistance, electrical insulation, heat liberation, connection reliability and chemical stability. Also a method of producing a printed wiring board is proposed in which an imprint method using a mold having formed thereon convexities corresponding to wiring patterns and viaholes to be formed being buried in an interlayer dielectric layer is used to form the wiring patterns and viaholes by transcribing the concavities of the mold to the interlayer dielectric layer. The imprint method permits to form the wiring patterns and viaholes but assures an easy and accurate transcription without any optical transcription or complicated etching. Thus, a multilayer printed wiring board excellent in insulation reliability and interlayer connection and having fine wiring patterns formed therein can be mass-produced extremely easily and inexpensively.

10 Claims, 17 Drawing Sheets

U.S. PATENT DOCUMENTS

| | | | |
|---|---|---|---|
| 5,772,905 | A | 6/1998 | Chou |
| 5,841,102 | A * | 11/1998 | Noddin .................... 219/121.71 |
| 6,005,198 | A | 12/1999 | Gregoire |
| 2002/0066672 | A1 | 6/2002 | Lijima et al. |
| 2003/0180510 | A1 | 9/2003 | Ogawa et al. |
| 2005/0107497 | A1* | 5/2005 | Akaho et al. .................. 523/457 |

FOREIGN PATENT DOCUMENTS

| | | |
|---|---|---|
| JP | 2002 76618 | 3/2002 |
| JP | 2002-134920 | 5/2002 |
| JP | 2002 151850 | 5/2002 |
| JP | 2002 184719 | 6/2002 |
| JP | 2002 261442 | 9/2002 |
| JP | 2003-023251 | 1/2003 |
| JP | 2003 026914 | 1/2003 |
| JP | 2003-026939 | 1/2003 |
| JP | 2003 073649 | 3/2003 |
| JP | 2002-171048 | 6/2009 |
| JP | 11-254485 | 9/2009 |
| WO | WO 03066741 A1 * | 8/2003 |

OTHER PUBLICATIONS

Picken et al., Structure and Mechanical Properties of Nanocomposites with Rod- and Plate-Shaped Nanoparticles, 2007, Springer, pp. 143-173.*

Chou et al. "Imprint of sub-25 nm vias and trenches in polymers", Appl. Phys. Lett., vol. 67, No. 21, pp. 3114-3116 1995.

* cited by examiner

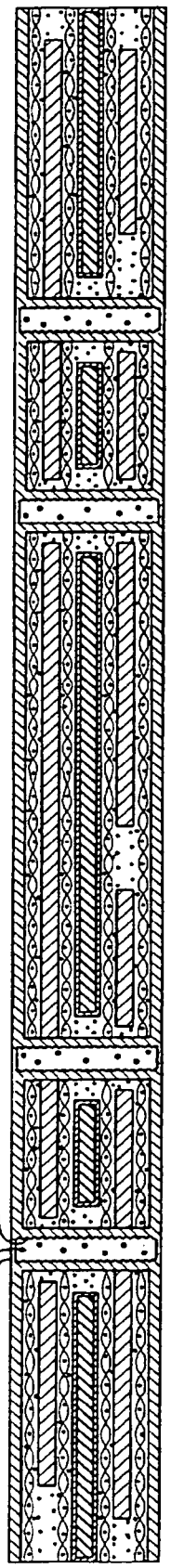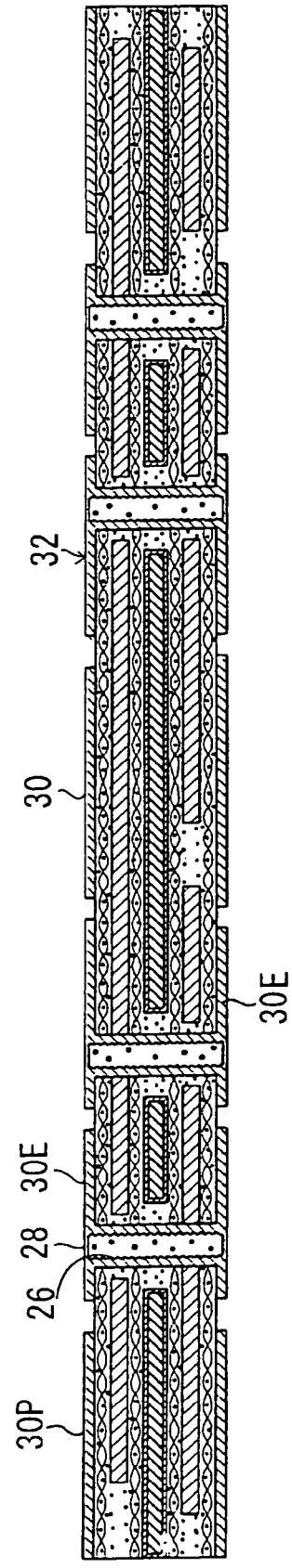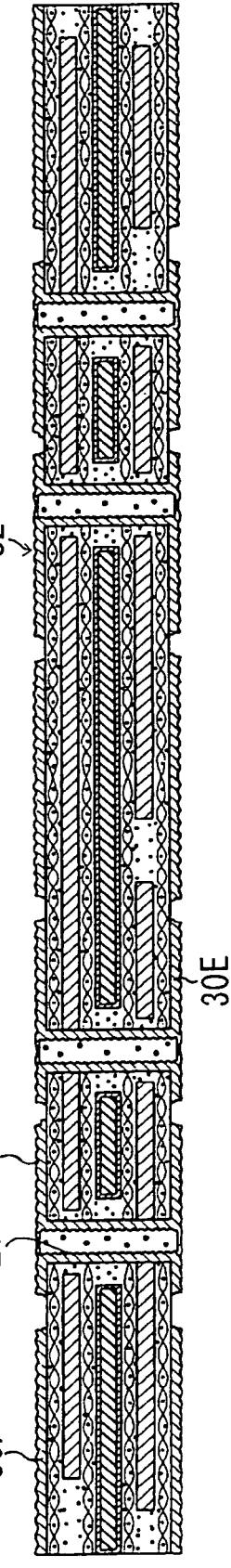

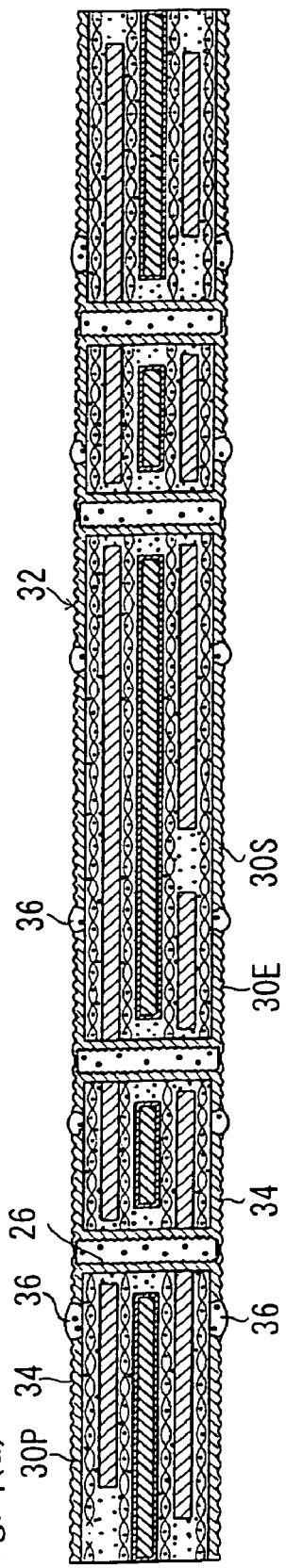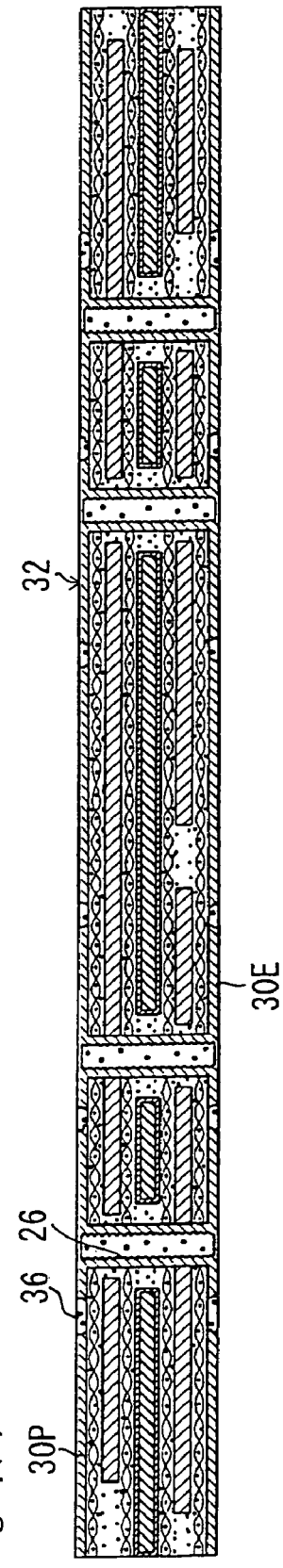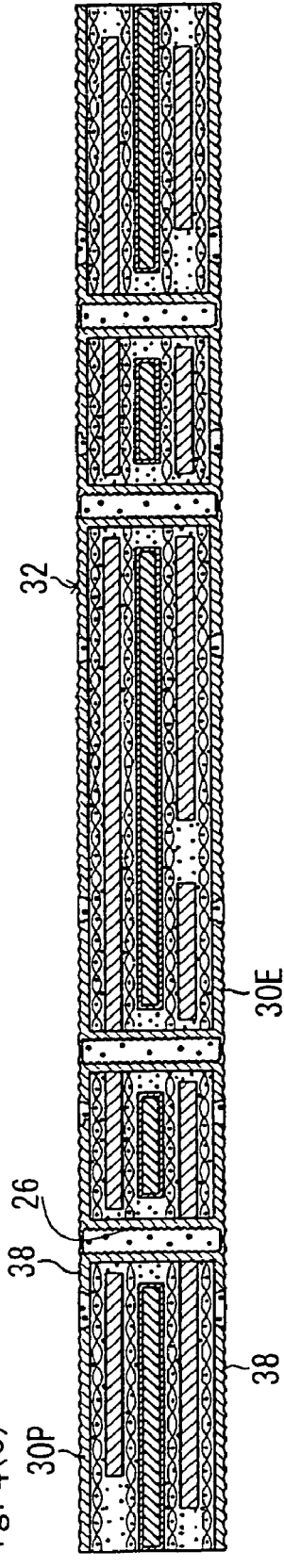

INTERLAYER INSULATING LAYER FOR PRINTED WIRING BOARD, PRINTED WIRING BOARD AND METHOD FOR MANUFACTURING SAME

FIELD OF THE INVENTION

The present invention relates to an interlayer dielectric layer formed by curing an interlayer dielectric material for a printed wiring board, a printed wiring board including the interlayer dielectric layer, and a method of producing the printed wiring board.

BACKGROUND ART

With the recent evolution of the electronics, there have been required printed circuit boards and wiring boards on which at least one LSI is to be mounted, formed to have a finer wiring pattern that assures a higher packaging density and reliability for a more compact design of electronic devices and higher speed of signal transmission.

On this account, it has recently been proposed to form a conductor circuit on a wiring board by applying an interlayer dielectric material to the surface of a substrate to form an interlayer dielectric layer, roughing the surface of the interlayer dielectric layer and forming the circuit by the additive or semi-additive method.

As the interlayer dielectric material used in the additive or semi-additive method, there is widely used a resin in which spherical particles such as inorganic particles are added to a resin mixture of thermosetting resin and/or photosensitive resin and thermoplastic resin (as disclosed in the Japanese Patent Application Laid Open No. 2003-73649).

The addition of such inorganic particles is intended to reduce the coefficient of thermal expansion of the interlayer dielectric material for making it difficult for any crack to occur in the interlayer dielectric layer and a bump between an IC and printed wiring board.

Recently, however, air is mixed in the dielectric layer of an IC chip for mounting on a printed wiring board to attain a higher driving frequency. Since the air-containing dielectric layer of the IC chip is fragile, it is necessary to further reduce the coefficient of thermal expansion of the interlayer dielectric layer. To attain such a lower coefficient of thermal expansion, it is required to increase the content of spherical inorganic particles to be added to the resin that forms the interlayer dielectric layer.

With the content of the spherical particles being increased, the coefficient of thermal expansion of the interlayer dielectric layer is reduced but crack is more likely to occur in the interlayer dielectric layer. However, if the content of the particles is excessive, the particles will remain in the viahole, leading to a lower connection reliability. Especially, viaholes of less than 70 μm in opening diameter will incur such lower connection reliability.

Also, since the particles in the interlayer dielectric layer are of about 5 to 10 μm in size, the irregularity (concavity and convexity) formed on the surface of the interlayer dielectric layer formed by curing the interlayer dielectric material will also be of 5 to 10 μm. Therefore, it is difficult to form a fine pattern of less than 15 μm/15 μm in L/S (line width/interline space), and the irregularity of the interlayer dielectric layer surface makes it difficult to form an interlayer dielectric layer having a uniform thickness. Thus, it is also difficult to control the impedance in transmitting a signal of 3 GHz or higher in frequency.

To form a circuit by the aforementioned additive or semi-additive method, a fine pattern is normally formed by transcribing the pattern optically. For example, a pattern of a photo mask is transcribed to a photosensitive resist by placing the photo mask directly or indirectly on the photosensitive resist and irradiating light to the photo mask from the back of the photo mask to selectively expose resist portions through which the light has passed.

The above-mentioned conventional pattern-forming method is not advantageous in that a pattern having a one-to-one relation with the pattern of the photo mask cannot be formed because of the influence of the light diffraction and miniaturization of the pattern is limited because the resist will be made to fly in all directions under a pressure applied during spray development.

On the other hand, S. Y. Chou et al. have proposed a method, called "imprint method", very simple but suitable for use in mass production and capable of transcribing a finer pattern than with the conventional techniques (as in the Applied Physical Letters, Vol. 67, No. 21, pp. 3114-3116 (1995) and U.S. Pat. No. 5,772,905).

The "imprint method" proposed by the S. Y. Chou et al. will briefly be explained herebelow with reference to FIG. 19.

(1) First, a silicon substrate 202 having a silicon dioxide film 204 formed on the surface thereof is prepared, and a reversal pattern corresponding to a mirror image of a pattern to be transcribed is formed on the silicon dioxide film 204. The silicon dioxide film 204 can be patterned using the normal electron beam transcription, for example. Thus, a mold 200 is formed which has formed on the surface thereof an irregularity 203 corresponding to the mirror image of the pattern to be transcribed (as shown in FIG. 19(*a*)).

(2) Next, a dielectric material such as PMMA (polymethylmethacrylate) or the like is applied to a silicon substrate 210 going to be patterned, and cured to form a dielectric layer 212 on the silicon substrate 210. Further, the silicon substrate 210 having the dielectric layer 212 thus formed thereon is heated at a temperature of about 200° C. to soften the dielectric layer 212.

(3) The mold 200 formed in the step (1) is superposed on the silicon substrate 210 with the side thereof on which the irregularity 203 is formed being placed opposite to the surface (coated side) of the dielectric layer 212 on the silicon substrate 210. Thereafter, the mold 200 is pressed to the surface of the silicon substrate 210 with a pressure equivalent to a barometric pressure of about 140 hPa (as shown in FIG. 19(*b*)).

(4) Next, with the mold 200 being kept pressed to the silicon substrate 210, the temperature is lowered to about 105° C. to cure the dielectric layer 212, and then the mold 200 is removed. Thus, on the dielectric layer 212 on the silicon substrate 210, there will be formed a mirror-image pattern corresponding to the pattern of the irregularity 203 on the mold 200, that is, a pattern 214 going to be formed on the silicon substrate 210 (as shown in FIG. 19(*c*)).

For miniaturization of wiring, the "imprint method" was proposed as mentioned above. The "imprint method" was found not advantageous in application to the pattern-forming process in production of a multilayer printed wiring board as will be described below:

Firstly, when a thermoplastic resin such as PMMA used in the "imprint method" is used as an interlayer dielectric material for forming a multilayer printed wiring board, lower layers of the interlayer dielectric material will be softened at the same time in the pattern-forming process for the multilayer printed wiring board. The position and shape of the pattern and thickness of the interlayer dielectric layer cannot be maintained. That is, no multilayering is possible.

For example, in the step of forming a pattern on the first interlayer dielectric layer, a wiring pattern and viahole can be formed without any problem. To form a second interlayer dielectric layer and a wiring pattern on the second interlayer dielectric layer, there should be provided a step of softening the second interlayer dielectric layer. However, it is difficult to heat only the second interlayer dielectric layer. That is, when the second interlayer dielectric layer is heated to a temperature, the first interlayer dielectric layer is also heated up to the same temperature. Thus, the first interlayer dielectric layer will also be softened.

Thus, the first interlayer dielectric layer will be fluidized under a pressure applied during forming a wiring pattern on the second interlayer dielectric layer. The wiring pattern formed in the first interlayer dielectric layer will move, resulting in misalignment with an upper layer, short-circuiting between adjacent patterns and crushing of the interlayer dielectric layer under the pressure. Therefore, the reliability on the interlayer connection will be lower.

Secondly, it is difficult to maintain, after the mold is removed, the shape of the wiring pattern-forming groove transcribed from the mold to the interlayer dielectric layer and shape of the viahole-forming groove.

The reason for the above is that the step of removing the mold is followed by a step of heat treatment in which the interlayer dielectric layer will be softened. Especially, when the interlayer dielectric layer is softened in the heat-treatment step, the grooves transcribed to the interlayer dielectric layer is shaped to have such a trapezoidal form that the space between conductor circuits filled in the wiring pattern-forming groove and viahole-forming groove is narrowed. That is, to assure high insulation reliability, the wiring pattern may not be miniaturized.

Thirdly, the aforementioned "imprint method" does not include any measure to assure a good adhesion between an interlayer dielectric layer of a thermoplastic resin and the wiring pattern. If the "imprint method" is applied as it is to production of a multilayer printed wiring layer, the latter will not be highly reliable.

For example, in case the side walls and bottom of the wiring pattern-forming groove and viahole-forming groove, transcribed from the mold, are flat, the adhesion between the conductor circuit filled in the grooves and the interlayer dielectric layer will not be sufficient. Further, the finer the wiring pattern, the more easily the conductor circuit (copper or the like) will be separated due to a difference in coefficient of thermal expansion between the conductor circuit and resin and the more possibly crack will occur at the boundary between the conductor circuit and resin. Therefore, no multilayer printed wiring board that is highly reliable can be produced by the "imprint method".

Fourthly, in case the "imprint method" is applied directly to the pattern-forming process for a multilayer printed wiring board, the interlayer dielectric layer has to be heated up to a temperature of about 200° C. However, the mold having been subjected to a cycle between such a high temperature and the normal temperature will not able to restore its initial shape.

Also, because the mold is used at such a high temperature, it is extremely difficult to assure any high dimensional accuracy of the mold. For transcription of the shape of a mold to an interlayer dielectric layer, the assembly of the mold and layer is heated at a temperature higher than 200° C. However, since the mold is prepared at the normal temperature, it has to be formed with the thermal expansion thereof being taken in consideration. It is very difficult to correct the shape correction of the mold in the step of mold preparation, and the mold thus prepared cannot be used repeatedly. Therefore, the mold itself is very expensive.

DISCLOSURE OF THE INVENTION

The present invention has an object to overcome the above-mentioned drawbacks of the related art by providing an interlayer dielectric layer for use in a multilayer printed wiring board, capable of improving the cooling/heating cycle (thermo cycle) resistance and packaging reliability of the multilayer printed wiring board without deterioration of the thermal resistance, electrical insulation, connection reliability and chemical stability.

The present invention has another object to provide a printed wiring board of which the impedance can easily be controlled and electrical connection is stable for a long term.

The present invention has still another object to provide a multilayer printed wiring board excellent in insulation and interlayer connection between wiring patterns formed in interlayer dielectric layers and a method of producing the multilayer printed wiring board by transcribing a fine wiring pattern including viaholes to the interlayer dielectric layer by an "imprint method" using a mold shaped in a mirror-image relation with wiring patterns such as conductor layers, viaholes, etc.

The Inventors of the present invention had devoted themselves to attaining the above objects, and worked out the present invention that will briefly be described below:

(1) The above object can be attained by providing an interlayer dielectric layer for use in a printed wiring board, formed on a substrate from a curable resin having flaky particles dispersed therein.

The "flaky particle" refers herein to a particle having an extremely small thickness in relation to a mean length A of the surface thereof (will be referred to simply as "mean length" hereunder). The flaky particle has a mean length A ranging from 0.01 to 3 µm, a mean width B ranging from 0.01 to 3 µm and a thickness D ranging from 0.001 to 1 µm.

Also, the flaky particle may have a ratio of the mean length to the mean width (A/B), falling within a range of 1 to 20.

Also, the flaky particle may have a ratio of the mean length to the mean thickness (A/D), falling with a range of 20 to 2000.

Also, the content of the flaky particles may be 1 to 50% by weight in relation to the total including the resin and particles.

Also, the flaky particle may be a lamination of layered silicate of which the mean interlayer distance is 3 nm or more as determined by the wide-angle X-ray diffractometry or transmission electron microscopy and part or all includes less than 5 layers.

According to the present invention, the resin for the interlayer dielectric layer may be at least one selected from among a thermosetting resin, a mixture of thermosetting resin and thermoplastic resin, a photosensitized thermosetting resin, a mixture of photosensitized thermosetting resin and thermoplastic resin, and a photosensitive resin.

The thermosetting resin may contain at least a compound containing an epoxy group and a curing agent. The compound containing epoxy group may be of a conjugated diene structure and the curing agent have a phenol skeleton.

(2) Also the above object can be attained by providing a printed wiring board in which conductor circuits and interlayer dielectric layers are stacked alternately on a substrate and conductor circuits at different levels are electrically connected to each other via through-holes and/or viaholes, wherein:

the interlayer dielectric layers are formed by dispersing flaky particles in the curable resin defined in (1) above.

(3) Also the above object can be attained by providing a printed wiring board in which conductor circuits and viaholes formed buried in interlayer dielectric layers on a substrate are formed by the imprint method using a mold having convexities which are in a mirror-image relation with the conductor circuits and viaholes, wherein:

the interlayer dielectric layers are formed by dispersing flaky particles in the curable resin defined in (1) above.

(4) Also the above object can be attained by providing a multilayer printed wiring board in which conductor circuits and viaholes formed buried in interlayer dielectric layers on a core substrate are formed by the imprint method using a mold having convexities that are in a mirror-image relation with the conductor circuits and viaholes, wherein:

the interlayer dielectric layers is formed from at least one selected from among a thermosetting resin, a mixture of thermosetting resin and thermoplastic resin, a photosensitized thermosetting resin, a mixture of photosensitized thermosetting resin and thermoplastic resin, and a photosensitive resin.

The above interlayer dielectric layer may be a mixture of the above curable resin and flaky particles.

(5) Also the above object can be attained by providing a method of producing a multilayer printed wiring board including conductor circuits and viaholes formed being buried in interlayer dielectric layers on a dielectric substrate, the method including, according to the present invention, at least the following steps (a) to (e):

(a) forming a yet-to-cure interlayer dielectric layer by applying or attaching, to the dielectric substrate, an interlayer dielectric material of a liquid or dry film type comprising at least one resin selected from among a thermosetting resin, mixture of thermosetting resin and thermoplastic resin, a photosensitized thermosetting resin, a mixture of photosensitized thermosetting resin and thermoplastic resin, and a photosensitive resin;

(b) softening the yet-to-cure interlayer dielectric layer and then pressing a mold having convexities that are in a mirror-image relation with the conductor circuits and viaholes into the softened interlayer dielectric layer to form concavities where conductor circuits are to be formed and concavities or through-holes where viaholes are to be formed in the interlayer dielectric layer;

(c) cooling or heating the interlayer dielectric layer to a temperature at which the shapes of the concavities and/or through-holes formed in the softened interlayer dielectric layer can be maintained, and then removing the mold from the interlayer dielectric layer;

(d) heating, or irradiating ultraviolet rays to, the interlayer dielectric layer from which the mold has been removed, and then curing, by heating, the interlayer dielectric layer to provide a cured interlayer dielectric layer; and (e) forming the conductor circuits and viaholes by filling a conductive material in the concavities and/or through-holes formed in the cured interlayer dielectric layer.

According to the present invention, the interlayer dielectric material may be a mixture of the above curable resin and flaky particles.

Between the steps (d) and (e) of the production method (5) above, there may be included the step of forming a surface-roughed layer on the cured interlayer dielectric layer by roughing the surface of the cured interlayer dielectric layer with a surface roughing liquid.

(6) Also the above object can be attained by providing a method of producing a multilayer printed wiring board including conductor circuits and viaholes formed being buried in interlayer dielectric layers on a dielectric substrate, the method including, according to the present invention, at least the following steps (a) to (f):

(a) forming a yet-to-cure interlayer dielectric layer by applying or attaching, to the dielectric substrate, an interlayer dielectric material of a liquid or dry film type comprising at least one selected from among resin particles, elastomer particles and inorganic particles soluble in a surface roughing liquid dispersed in a resin matrix comprising at least one resin selected from among a thermosetting resin, mixture of thermosetting resin and thermoplastic resin, a photosensitized thermosetting resin, a mixture of photosensitized thermosetting resin and thermoplastic resin, and a photosensitive resin;

(b) softening the yet-to-cure interlayer dielectric layer and then pressing a mold having convexities that are in a mirror-image relation with the conductor circuits and viaholes into the softened interlayer dielectric layer to form concavities where conductor circuits are to be formed and concavities or through-holes where viaholes are to be formed in the surface of the interlayer dielectric layer;

(c) cooling or heating the softened interlayer dielectric layer to a temperature at which the shapes of the concavities and/or through-holes formed in the interlayer dielectric layer can be maintained, and then removing the mold from the interlayer dielectric layer;

(d) heating, or irradiating ultraviolet rays to, the interlayer dielectric layer from which the mold has been removed, and then curing, by heating, the interlayer dielectric layer to provide a cured interlayer dielectric layer;

(e) forming a surface-roughed layer on the cured interlayer dielectric layer by roughing the surface of the cured interlayer dielectric layer with a surface roughing liquid; and (f) forming the conductor circuits and viaholes by filling a conductive material in the concavities and/or through-holes formed in the cured interlayer dielectric layer.

(7) Also the above object can be attained by providing a method of producing a multilayer printed wiring board including conductor circuits and viaholes formed being buried in interlayer dielectric layers on a dielectric substrate, the method including, according to the present invention, at least the following steps (a) to (e):

(a) forming a yet-to-cure interlayer dielectric layer by applying or attaching, to the dielectric substrate, an interlayer dielectric material of a liquid or dry film type comprising at least one resin selected from among a thermosetting resin, mixture of thermosetting resin and thermoplastic resin, a photosensitized thermosetting resin, a mixture of photosensitized thermosetting resin and thermoplastic resin, and a photosensitive resin;

(b) softening the yet-to-cure interlayer dielectric layer and then pressing a mold having convexities that are in a mirror-image relation with the conductor circuits and viaholes and also fine irregularities on the surfaces of at least the convexities into the surface of the interlayer dielectric layer to form, in the surface of the interlayer dielectric layer, concavities where conductor circuits are to be formed and concavities or through-holes where viaholes are to be formed, in which concavities anchors are formed;

(c) cooling or heating the softened interlayer dielectric layer to a temperature at which the shapes of the concavities and/or through-holes formed in the interlayer dielectric layer can be maintained, and then removing the mold from the interlayer dielectric layer;

(d) heating, or irradiating ultraviolet rays to, the interlayer dielectric layer from which the mold has been removed, and then curing, by heating, the interlayer dielectric layer to provide a cured interlayer dielectric layer; and (e) forming the conductor circuits and viaholes by filling a conductive material in the concavities and/or through-holes formed in the cured interlayer dielectric layer.

In the interlayer dielectric layer according to the present invention for printed wiring boards, the particles dispersed in the curable resin are flaky in shape. So, different from any spherical particles, the flaky particles are dispersed at all angles in relation to the substrate surface. As the dielectric layer expands or contracts, the flaky particles will also move at the same time. However, since the particles dispersed at all angles in relation to the substrate surface collide with each other, a friction will occur between the particles and also between the particles and resin, and the expansion or contraction of the interlayer dielectric layer will thus be constricted (which will be referred to as "three-dimensional constraint effect" hereunder).

Also, since each of the flaky particles has a larger surface area than the spherical particle and the intermolecular force between the flaky particles and resin is larger than that between the spherical particles and resin, so the mutual adhesion between the flaky particles and resin is larger than that between the spherical particles and resin. Thus, the flaky particles are smaller in expansibility or contractility than the resin, and so they effectively inhibit the resin from expanding or contracting (which will be referred to as "inhibit effect" hereunder).

In the interlayer dielectric layer according to the present invention for printed wiring boards, the flaky particles having a relatively small coefficient of thermal expansion are dispersed in the resin having a relatively large coefficient of thermal expansion and will have a synergy of the three-dimensional constraint effect and inhibit effect. So, even a smaller amount of the flaky particles dispersed in the resin than that of spherical particles, if used, will lead to a smaller coefficient of thermal expansion of the resultant dielectric layer. Therefore, a printed wiring board including the interlayer dielectric layer according to the present invention and a circuit board including the interlayer dielectric layer and on which semiconductor devices are to be mounted will have an improved cooling/heating cycle resistance.

Among others, the above-mentioned synergy of the three-dimensional constraint effect and inhibit effect will result in a coefficient of thermal expansion $\alpha_2$ in a temperature domain in which the resin is at a higher temperature than the glass transition temperature (will be referred to simply as "Tg" hereunder). Normally, the coefficient of thermal expansion $\alpha_2$ will be three times larger at a temperature higher than Tg than that $\alpha_1$ at a temperature lower than Tg. However, the synergy of the three-dimensional constraint effect and inhibit effect will lower the coefficient of thermal expansion $\alpha_2$. For example, in case an electronic part is mounted on a printed wiring board on contact with a Pb-free solder (e.g., a solder of one or two selected from among Sn, Ag, Cu, Bi, In and Zn and whose melting point falls within a range of 205 to 300° C.), the packaging temperature is rather higher than Tg. Therefore, the interlayer dielectric layer according to the present invention will contribute to a considerably improved packaging reliability.

For the printed wiring board according to the present invention, the interlayer dielectric layer having provided therein conductor circuits (wiring patterns) and viaholes is formed by the imprint method using a mold having formed thereon convexities corresponding to the conductor circuits and viaholes. Namely, concavities where conductor circuits (wiring patterns) are to be formed and concavities and/or through-holes where viaholes are to be formed are formed in an interlayer dielectric layer containing mainly a thermosetting resin by transcribing the convexities of the mold to the interlayer dielectric layer, and then the conductor circuits and viaholes are formed by plating or with any other technique in the transcribed concavities and/or through-holes. Since an easy and accurate transcription is assured, the conductor circuits and viaholes can be formed to have fine wiring patterns excellent in inter-pattern insulation and interlayer connection. Also, since the conductor circuits are formed being buried in the substrate, so the interlayer dielectric layer is very flat and impedance matching can easily be attained.

Also, in the method of producing the multilayer printed wiring board according to the present invention, the concavities corresponding to the conductor circuit and concavity or through-hole corresponding to the viahole can be formed easily and accurately just by pressing the mold used by the imprint method into the softened resin layer containing mainly the thermosetting resin, not using any optical transcription or complicated etching. Also, after the concavities and through-holes are formed, the resin is completely cured by heating or by a combination of heating and ultraviolet-ray irradiation, and then the conductor circuit and viahole are formed in the interlayer dielectric layer by plating or with any other technique. With this simple process, the shapes of the conductor circuit and viahole can be transcribed accurately and finer wiring patterns can be formed. Thus, a multilayer printed wiring board excellent in insulation reliability and interlayer connection can be produced very easily and at a lower cost.

BRIEF DESCRIPTION OF THE DRAWINGS

FIGS. 3(a) to 3(c) show some steps of the process of producing the multilayer printed wiring board as the embodiment 1 of the present invention.

FIGS. 4(a) to 4(c) show some steps of the process of producing the multilayer printed wiring board as the embodiment 1 of the present invention.

BEST MODE FOR CARRYING OUT THE INVENTION

Figure 1A:
FIGS. 1(a) to 1(e) show some steps of the process of producing the multilayer printed wiring board as an embodiment 1 of the present invention.

The interlayer dielectric layer according to the present invention for use in a printed wiring board is characterized in dispersion of flaky particles in a curable resin formed on a substrate.

The "flaky particle" dispersed in the curable resin refers herein to a particle having an extremely small thickness in relation to a mean length A of the surface thereof). The flaky particle has a mean length A ranging from 0.01 to 3 μm, a mean width B ranging from 0.01 to 3 μm and a thickness D ranging from 0.001 to 1 μm.

In the interlayer dielectric layer according to the present invention, the flaky particles dispersed in the curable resin has the three-dimensional constraint effect and inhibit effect of inhibiting the resin from expanding or contracting. Therefore, even a small content of the flaky particles dispersed in the resin can impart, to the resin, such properties as coefficient of thermal expansion, toughness, heat resistance, flatness and cooling/heating cycle resistance, equal to or better than those of the interlayer dielectric layer used in the conventional printed wiring board and in which spherical particles are dispersed. Thus, viaholes can be formed more easily in the interlayer dielectric layer. So, even a viahole of less than 70 μm in opening direction, if formed in the interlayer dielectric layer, will have an improved electrical property and connection reliability.

The flaky particle used in the present invention has a large surface area. So, when laser irradiation is used to form an opening for a viahole in the interlayer dielectric layer, the flaky particles will easily absorb the laser energy. Also, being so thin, the flaky particles are easy to sublime. Therefore, the flaky particles will not possibly remain in the viahole, and thus a viahole of less than 70 μm in opening diameter, especially, less than 60 μm, will have a considerably improved connection reliability.

Also, since the particles dispersed in the curable resin in the present invention are flaky in shape, they are in closer contact with each other than the spherical particles used in the conventional interlayer dielectric layer. Thus, heat will easily be conducted through the particles in the curable resin. Hear occurring at a power layer and ground layer and heat having occurred in an IC can be liberated effectively to outside.

Therefore, the electrical resistance of the power layer and ground layer will be reduced. Since power supply to a transistor in an IC is made momentarily, an IC whose driving frequency is higher than 3 GHz, if any, mounted on the printed wiring board according to the present invention will be less likely to malfunction.

Also, since the particles dispersed in the curable resin are flaky in shape, they are excellent in mechanical or thermal shock resistance. Assume here that a crack has occurred in the curable resin and reached the particles. For further spreading, the crack should go on the surface of the particles. However, the long surface of the flaky particles will effectively prevent the crack from further spreading.

In the interlayer dielectric layer according to the present invention, the flaky particles included in the curable resin have a synergy of three-dimensional constraint effect and inhibit effect. So, the interlayer dielectric layer is not easily deformable. Therefore, a stress caused by a difference in coefficient of thermal expansion between the core substrate of the printed wiring board and IC chip will not be transmitted to the fragile dielectric layer of the IC chip. Therefore, the dielectric layer of the IC chip mounted on the printed wiring board according to the present invention will not be broken down when the IC chip is mounted on the printed wiring board or when the IC chip is in operation. Namely, the present invention provides a highly reliable printed wiring board one which semiconductor devices are to be mounted.

In the interlayer dielectric layer according to the present invention, the mean length A or mean width B of each of the flaky particles should preferably fall within a range of 0.01 to 3 μm, and the ratio of the mean length A to the mean width B (A/B) should preferably be within a range of 1 to 20. If the mean length A or mean width B is less than 0.01 μm, the flaky particles are excessively short and will not have any sufficient three-dimensional constraint effect and inhibit effect. Also, if the mean length A or mean width B is larger than 3 μM, the flaky particles are excessively long and likely to be broken. Also in this case, the flaky particles will not have any sufficient three-dimensional constraint effect and inhibit effect. If the ratio of the mean length A to mean width B of the flaky particles (A/B) is larger than 20, namely, if the mean length A is more than 20 times larger than the mean width B, the flaky particles are likely to be broken.

If the flaky particles are broken as above, a crack will occur starting at the broken point of the flaky particle. If the mean length A of the flaky particles are excessively large, the particles are likely to be oriented in layers, which will lead to a smaller three-dimensional constraint effect. When the mean length A fall within the specified range, the flaky particles will have sufficient three-dimensional constraint effect and inhibit effect.

In the interlayer dielectric layer according to the present invention, the thickness D of the flaky particles should preferably be within a range of 0.001 to 1 μm. If the thickness D is smaller than 0.001 μm, the flaky particle is excessively thin and are likely to be broken, which will lead to insufficient three-dimensional constraint effect. Also, the flaky particles are weaker so that they will expand or contract as the curable resin expands or contracts. Namely, the flaky particles will not effectively inhibit the curable resin from expanding or contracting. Thus, more than one of the contraction, expansion and coefficients of thermal expansion $\alpha_1$ and $\alpha_2$ will be increased. In this case, a crack will occur in the interlayer dielectric layer itself and the difference in contraction or expansion between an electronic device such as an IC chip or the like and the interlayer dielectric layer will be larger with the result that a wire break will occur in either the electronic part or printed wiring board. Also, the flaky particles are excessively thin and so likely to be broken when applied with an external force. Thus, the interlayer dielectric layer is likely to be cracked first at such a broken point of the flaky particle.

On the other hand, if the particle thickness is larger than 1 μm, each of the flaky particles will be heavier so that when the content of the flaky particles in the interlayer dielectric layer is kept unchanged, the relative amount of them will be smaller with the result that the number of the flaky particles in the interlayer dielectric layer will be smaller. Thus, the effect of lowering the coefficient of thermal expansion, attainable by the mixing of the flaky particles, will be reduced and also the flaky particles will have less three-dimensional constraint effect and inhibit effect. Thus, more than one of the contraction, expansion and coefficients of thermal expansion $\alpha_1$ and $\alpha_2$ will be increased. In this case, a crack will occur in the interlayer dielectric layer itself and the difference in contraction or expansion between an electronic device such as an IC chip or the like and the interlayer dielectric layer will be larger with the result that a wire break will occur in either the electronic part or printed wiring board. Also, the flaky particles will settle down, and so the interlayer dielectric layer will not be uniform in property. Thus, the interlayer dielectric layer is likely to be cracked and the flaky particles are likely to remain at the bottom of the viaholes, leading to lower connection reliability.

When the mean length, mean width and thickness of the flaky particles are within the above-specified respective ranges, the flaky particles will have sufficient three-dimensional constraint effect and inhibit effect. In this case, the expansion or contraction of the interlayer dielectric layer formed from an interlayer dielectric material by curing can be limited (for smaller coefficients of thermal expansion $\alpha_1$ and $\alpha_2$). Thus, the interlayer dielectric layer, and a printed wiring board including the interlayer dielectric layer or a circuit board including the interlayer dielectric layer and on which semiconductor devices are to be mounted will have an improved cooling/heating cycle resistance and packaging reliability. Especially, the connection via viaholes of less than 60 μm in opening diameter will also be more reliable than ever.

Further, the aspect ratio (A/D) of the flaky particle used in the interlayer dielectric layer according to the present invention should preferably fall within a range of 20 to 2000. When the aspect ratio is within this specified range, the flaky particles will have sufficient three-dimensional constraint effect and inhibit effect. Assume here that a crack has occurred in the curable resin and reached the particles. For further spreading, the crack should go on the surface of the particles. However, when the aspect ratio is within the above-specified range, the spreading crack has to go over a long distance on the particle surface and such flaky particles will thus assure an improved shock resistance of the interlayer dielectric layer.

If the aspect ratio is less than 20, both the three-dimensional constraint effect and inhibit effect will be lower and more than one of the contraction, expansion and coefficients of thermal expansion $\alpha_1$ and $\alpha_2$ will be larger. In this case, a crack, if any having occurred, will go over a shorter distance on the particle surface, which means that such flaky particles will have no effect of preventing a crack from spreading and thus will not contribute to any improved shock resistance of the interlayer dielectric layer.

On the other hand, if the aspect ratio is over 2000, the flaky particles are likely to be oriented in layers and will have lower three-dimensional constraint effect. Also, each flaky particle will have a larger surface area and the intermolecular force between the particles and resin will be excessively large. Thus, the particles cannot be dispersed uniformly in the resin. Thus, the interlayer dielectric layer will not be uniform in property and crack will occur at a weak point of the layer. Also, a stress will be transmitted from a layer portion largely expanded or contracted to the dielectric layer of an IC chip mounted on the printed wiring board including the interlayer dielectric layer and break down the IC chip. Also, a viahole formed, if any, in a layer portion where the particles are more densely distributed will be lower in connection reliability. In such a layer portion, there cannot be formed any viahole of less than 60 μm in opening diameter. Further, the flaky particles will be laid in layers. In this case, a crack having occurred in any particle will be transmitted in the direction crossing the length of the particle, and thus the shock resistance of the interlayer dielectric layer will be lower.

The aspect ratio of the flaky particle should more preferably be within a range of 100 to 2000. With such an aspect ratio, heat having occurred in the power layer, ground layer or an IC can efficiently be liberated to outside.

An aspect ratio of less than 100 results in less elongated flaky particles. Since the probability that the flaky particles will be in contact with each other is lower, heat cannot effectively be conducted through the particles to outside.

On the other hand, if the aspect ratio is more than 2000, the flaky particles will be laid in layers. Also in this case, heat cannot effectively be conducted through the flaky particles to outside because of a lower probability that the flaky particles will be in contact with each other. In case the aspect ratio is within the above-specified range, an IC driven with a frequency of 1 or 3 GHz (for which the front-side bus (FSB) is 100 to 800 MHz), mounted on the printed wiring board according to the present invention and mounted on the printed wiring board, will not malfunction even if subjected to repeated simultaneous switching. Even in case the aspect ratio is not within the specified range, an IC driven with a frequency of 1 GHz (for which the FSB is of 100 to 133 MHz), for example, mounted on the printed wiring board, will not malfunction. However, an IC whose driving frequency is 3 GHz (for which the FSB is of 400 to 800 MHz), for example, mounted on the wiring board, will malfunction in some cases. As proved by the results of simulation, an IC driven with a frequency for which the FSB is about 10 GHz does not malfunction when the aspect ratio is within the specified range.

The aspect ratio of the flaky particle should more preferably be within a range of 100 to 500. With the aspect ratio being within this range, the flaky particles will not remain inside the viahole being formed by laser irradiation. If the aspect ratio is less than 100, the laser light is likely to be incident upon the flaky particle in a direction crossing the length of the particle, so the flaky particles will be less apt to absorb the laser energy.

On other hand, if the aspect ratio is over 500, a trace of the flaky particles having sublimed under the action of the laser beam will remain as a void in the inner wall of the viahole. The void will be a cause of cracking. Also, since the void thus formed in the inner wall of the viahole normally has a thin elongated shape, the plating liquid will not easily enter the void. Even the void filled with the plating will cause a crack to occur and will spoil the reliability on the insulation between the adjacent viaholes. Further, the laser energy will be conducted between the particles and the resin will be sublimed due to the heat resulted from the laser energy, which makes it difficult to form a viahole of a fine diameter.

According to the present invention, the content of the flaky particles included in the interlayer dielectric layer should preferably fall within a range of 1 to 50% by weight. With the content being within this range, the flaky particles will have sufficient three-dimensional effect and inhibit effect. That is, if the content of the flaky particles is less than 1% by weight, that is, if the amount of the flaky particles is too small, the flaky particles will have no three-dimensional effect and inhibit effect and no high cooling/heating cycle resistance and lower coefficient of thermal expansion can be expected of the interlayer dielectric layer.

On the other hand, if the content of the flaky particles is more than 50% by weight, the particles cannot be uniformly dispersed in the resin and the resin having the flaky particles thus dispersed therein will be fragile. Also, no fine viahole of less than 60 μm in opening diameter can be formed. In this case, the interlayer dielectric layer will be lower in cooling/heating cycle resistance and connection reliability.

In the present invention, the flaky particle is not limited to any special material but it may be a flaky insulator. For example, flaky inorganic particle of alumina, zirconia or glass may be used as the flaky particle. The flaky particle may be a lamination of layered silicate or the like.

The layered silicate may be one selected from among, for example, smectites-family clay minerals including montmorillonite, saponite, hectorite, beidellite, stevensite, nontronite, etc., vermiculite, halloysite, swelling mica, etc. Among others, montmorillonite, swelling mica or hectorite should preferably be used as the layered silicate.

The layered silicate may be a natural one or a synthetic one. Also, the flaky particles may include particles of a single type or particles of two different types.

In the lamination of layered silicate, the mean interlayer distance in a (001) plane should preferably be 3 nm or more as measured by the wide-angle X-ray diffractometry or transmission electron microscopy and part or all of the laminations should preferably include less than 5 layers.

In the lamination of layered silicate, the mean interlayer distance should preferably fall within a range of 3 to 5 nm and part or all of the laminations dispersed in the resin should preferably include different numbers of layers counting less than 5 in number.

Note that the language "mean interlayer distance of the lamination of layered silicate" used herein refers to a mean interlayer distance between layers of fine slice-shaped crystal of layered silicate. The mean interlayer distance can be measured by calculation of an X-ray diffraction peak or by transmission electron microscopy.

The language "mean interlayer distance is more than 3 nm" used herein means that "layers in the lamination of layered silicate are split more than 3 nm from each other".

Also, the language "part or all of the laminations dispersed in the resin include different numbers of layers counting less than 5 in number" means that "part or all of the laminations of layered silicate each including less than 5 layers are dispersed in the resin".

When the mean interlayer distance of the lamination of layered silicate is within the range of 3 to 5 nm, the layered particles will be less apt to be separate from each other and thus the interlayer dielectric layer will have an improved shock resistance. With the mean interlayer distance being less than 3 nm, the interaction between the layers is too strong for the layered silicate to be uniformly dispersed in less than 5 layers in the resin. On the other hand, if the mean interlayer distance is over 5 nm, stress will cause the layers of the laminations of layered silicate to separate from each other and the interlayer dielectric layer will be cracked at the time of the layer separation.

More specifically the language "part or all of the laminations dispersed in the resin include different numbers of layers counting less than 5 in number" means that preferably more than 10% of the laminations of layered silicate, each including less than 5 layers, should be dispersed in the resin and more preferably more than 20% of the laminations of layered silicate each including less than 5 layers should be dispersed in the resin.

Note that the dispersion of the layered silicate can be determined by observing the resin with a magnification of 50,000 to 100,000 times by a transmission electron microscope to count the number (Y) of layers in total of the laminations of layered silicate each including less than 5 layers in the number (X) of layers in total of all the laminations of layered silicate that can be observed in a predetermined area and calculating a ratio (A) of the total number (A) to the total number (Y) as given by the following equation (1):

$$A=(Y/X)\times 100 \tag{1}$$

Each lamination of layered silicate should preferably include less than 5 layers, which assures the aforementioned effects. More preferably, the lamination should include less than 3 layers. Most preferably, the lamination should be formed as thin as a single layer in addition to the number of layers included therein.

In the interlayer dielectric layer according to the present invention, when the mean interlayer distance of the lamination of layered silicate is 3 nm or more and part or all of the laminations each including less than 5 layers are dispersed in the resin, that is, the layered silicate is dispersed densely in the resin, the area of the boundary between the resin and layered silicate is larger and thus the three-dimensional constraint effect and inhibit effect are higher.

The resin used in the interlayer dielectric layer according to the present invention should preferably be a resin of which the main skeleton is of a low polarity and end group has a thermosetting property and photosensitivity. Since the intermolecular force between such a resin and particles is weaker at the main skeleton, many flaky inorganic particles large in surface area can be dispersed uniformly in the resin.

Thus, in the interlayer dielectric layer, the coefficients of thermal expansion $\alpha_1$ and $\alpha_2$ of the interlayer dielectric layer are uniformly small and the heat resistance, heat conductivity, cooling/heating cycle resistance and reliability on the packaging using a high-temperature Pb-free solder are high. Also, since the main skeleton is of a low polarity, a signal of higher than 3 GHz can be transmitted without any delay.

The aforementioned thermosetting resin may be one selected from among, for example, phenol resin, epoxy resin, unsaturated polyester resin, alkyd resin, furan resin, urea resin, melamine resin, polyurethane resin, aniline resin, thermosetting denatured polyphenylene ether resin, thermosetting polyimide resin, allyl resin, bismaleimide triazine resin, silicon resin, benzo-oxazine resin, etc. Among these materials, epoxy resin, phenol resin, urea resin, unsaturated polyester resin, allyl resin, thermosetting polyimide resin, bismaleimide triazine resin, thermosetting denatured polyphenylene ether resin, silicon resin or benzo-oxazine resin may suitably be used as the thermosetting resin. Each of these resins may be used singly or two or more of them may be used in combination.

Note that the "epoxy resin" refers herein to an organic compound including at least one oxyrane ring (epoxy group).

Among the epoxy resins, one having an epoxidated double bond of unsaturated carbon in a polymer comprising mainly a conjugated diene compound such as epoxidated polybutadiene or the like or a polymer of a partially hydrogenated conjugated diene compound should preferably be used. The aforementioned resin is suitable for transmission of a high-speed signal of 3 GHz in frequency because of its low polarity. Also, it is suitable for uniform mixing of the flaky particles.

A curing agent is used in the thermosetting resin. The curing agent may be one selected from among, for example, polyphenol curing agent, polyamine curing agent, carboxylic acid hydrazide, diaminomaleonitrile, dicyandiamide and its derivative, nylon salt and phosphate of imidazole polyamine, Lewis acid and its amine complex. Each of these curing agents may be used singly or two or more of them may be used in combination.

The aforementioned thermoplastic resin may be one selected from among, for example, polyolefin resin, polystyrene resin, polyphenylene ether resin, functionality-denatured polyphenylene ether resin, mixture of polyphenylene ether resin or functional group-denatured polyphenylene ether resin and a thermoplastic resin compatible with polyphenylene ether resin or functional group-denatured polyphenylene ether resin, such as polystyrene resin, alicyclic hydrocarbon resin, thermoplastic polyimide resin, polyamide imide resin, polyester imide resin, polyester resin, polyether ether ketone (PEEK) resin, polyether sulfone resin, polyamide resin, polyvinyl acetal resin, polyvinyl alcohol resin, polyvinyl acetate resin, poly(metha)acrylic ester resin, polyoxymethylene resin, etc. Among these resins, the polyphenylene ether resin, functional group-denatured polyphenylene ether resin, mixture of polyphenylene ether resin or functional group-denatured polyphenylene ether resin and polystyrene resin, alicyclic hydrocarbon resin or thermoplastic polyimide resin may suitably be used as the thermosetting resin. Each of these resins may be used singly or two or more of them may be used in combination.

Note that the term "(metha)acryl" referred to herein means either "acryl" or "methacryl".

The aforementioned photosensitized thermosetting resin may be a resin in which a photosensitive group is substituted for part of the functional group contributing to thermosetting of one selected from among, for example, phenol resin, amino resin such as melamine resin, urea resin, etc., and thermosetting resin such as epoxy resin, phenoxy resin, epoxy-denatured polyimide resin, unsaturated polyester resin, polyimide resin, urethane resin, diallyl phthalate resin, etc.

The photosensitized thermosetting resin may be, for example, an epoxy resin of which 20 to 80%, preferably, 20 to 50%, is acrylated or otherwise processed. If the percentage of acrylation is less than 20%, the photo-curing will be insufficient and the interlayer dielectric material will be softened in the subsequent heat treatment. On the other hand, if the percentage of acrylation is more than 80%, the thermosetting will be insufficient.

Each of the above photosensitized thermosetting resins may be used singly or two or more of them may be used in combination.

The interlayer dielectric layer according to the present invention may of course be formed from other resin such as a mixture of photosensitized thermosetting resin and thermoplastic resin or a photosensitive resin.

The photosensitive resin should preferably be an acryl resin such as polymethyl methacrylate or thermosetting resin of which the functional group is acrylated in 100%.

Note here that as a photo-curing factor of the photosensitive resin, there may be suitably usable one or more of either the intramolecular chained/cleaved type photoinitiators such as benzoisobutyl ether, benzyl dimethyl ketal, diethoxyacetophenon, acyloxym ester, chlorinated acetophenon, hydroxyacetophenon, etc. or the intramolecular hydrogen-extracted photoinitiators such as benzophenon, Michler's ketone, dibenzosuberone, 2-ethylanthraquinone, isobutylthioxaneson, etc.

As an auxiliary for the photoinitiator, there may be used one or more of triethanolamine, Michler's ketone, 4,4-diethylaminobenzophenon, 2-dimethylaminoetyl benzoic acid, 4-dimethylaminobenzoic ethyl, 4-dimetylaminobenzoic(n-butoxy)ethyl, 4-dimethylaminobenzoic isoamyl, 4-dimethylaminobenzoic 2-ethihexacyl, polymerization tertiary amine, etc.

Note that Michler's ketone, IRGACURE 651, isopropylthioxane ketone or the like may be used suitably as a sensitizer in the resin. The above-mentioned photoinitiators include ones that act as a sensitizer, and any one of them may be used suitably in the resin.

The composition ratio between the photoinitiator and sensitizer should preferably be, as follows. For example, in 100 parts by weight of a photosensitive resin 100, the ratio between benzophenon and Michler's ketone is 5/0.5 parts by weight, the ratio between IRGACURE 184 and 651 is 5/0.5 parts by weight, and the ratio between IRGACURE 907 and isopropyl thioxane is 5/0.5 parts by weight.

Also, epoxy acrylate, epoxy methacrylate, urethane acrylate, polyester acrylate, polystyryl methacrylate or the like may be used suitably as a photosensitive monomer or photosensitive oligomer used in the photosensitive resin.

In the interlayer dielectric layer according to the present invention, since the flaky particles are dispersed in the curable resin, they are in close contact with each other. Therefore, in a printed wiring board in which the interlayer dielectric layers and conductor circuits are alternately stacked one on the other on a base material and the conductor circuits in different layers are electrically connected to each other via through-holes and/or viaholes, heat having occurred in the power layer and ground layer included in the conductor circuit and heat having occurred in an IC are easily conducted to outside via the particles. Thus, the heat can well be liberated to outside the printed wiring board. Therefore, for example, an IC chip that is to be driven at a high speed with a frequency of higher than 3 GHz and mounted, if any, on the printed wiring board will not be likely to malfunction. Also, since each of the flaky particles is less than 3 μm in length or width, the irregularity of the interlayer dielectric layer surface will be small.

That is, in the printed wiring board in which the interlayer dielectric layers according to the present invention and conductor layers are alternately stacked one on the other on a base material and the conductor circuits are electrically connected to each other via the through-holes and/or viaholes, the surfaces of the conductor circuits and interlayer dielectric layers can easily be flattened and the thickness of the interlayer dielectric layers can easily be uniformized. So, even if an IC chip driven with a frequency of higher than 3 GHz is mounted on this wiring board, impedance control can easily be effected and noise does not easily mix into any signal. Also, since the wiring board surface is formed flat, electronic parts can be mounted on the wiring board with an improved reliability. In addition, the printed wiring board is improved in shock resistance, reliability on connection via the viaholes and heat liberation.

The multilayer printed wiring board according to the present invention is characterized in that the conductor circuits and viaholes formed being buried in the interlayer dielectric layer on a substrate are formed by the imprint method using a mold having convexities that are in mirror-relation with the conductor circuits and viaholes. This multilayer printed wiring board should preferably use an interlayer dielectric layer formed from the curable resin in which the flaky particles are dispersed.

Since the coefficients of thermal expansion $\alpha_1$ and $\alpha_2$ of the interlayer dielectric layer can be reduced by adding fine flaky particles to the curable resin, even a thin wiring pattern whose ratio (L/S) between line width (L) and interline space (S) is smaller than 12.5/12.5 μm is excellent in reliability on interline insulation is less apt to incur a resin cracking and wiring pattern breaking, which would be caused by a difference between the coefficients of thermal expansion.

In case the flaky particle is the laminate of layered silicate, it can be considered that the resin is approximate in hardness to that of the conductor layer. Thus, the conditions under which the resin is polished will not be extremely different from those under which the conductor layer is polished. That is, since the surfaces of the interlayer dielectric layer and conductor layers formed buried in the layer can be polished under nearly same conditions, so they can easily be flattened. Thus, the thickness of one interlayer dielectric layer and that of another interlayer dielectric layer formed on the conductor layer buried in the one interlayer dielectric layer can easily be uniformized. Therefore, easier impedance matching is possible.

In case an IC or the like driven at a high speed with a frequency of higher than 3 GHz is mounted on the printed wiring board, the wiring pattern will be hot. However, since the heat can effectively be liberated through the flaky particles, the IC chip will be less apt to malfunction. Also, in case an IC or the like that is driven with a frequency of higher than 3 GHz is mounted on the printed wiring board in which there is formed a wiring pattern of less than 12.5/12.5 μm in L/S, crosstalk is likely to occur. However, since the flaky particles directed in all directions exist between the lines of the wiring pattern, crosstalk will be less likely to take place.

In the multilayer printed wiring board formed by the imprint method, the interlayer dielectric layer formed on a core substrate may be formed from at least one selected from among a thermosetting resin, a mixture of thermosetting resin and thermoplastic resin, a photosensitized thermosetting resin, a mixture of photosensitized thermosetting resin and thermoplastic resin, and a photosensitive resin.

The thermosetting resin as a material for forming the interlayer dielectric layer is characterized in that it will be softened once when its temperature is elevated, it will be completely cured with a further elevation of the temperature and it will not be softened again once thus thermally cured. With the use of a thermosetting resin having this feature or a yet-to-cure mixed resin containing at least such a thermosetting resin to form a yet-to-cure interlayer dielectric layer by applying the imprint method, a multilayer printed wiring board can be formed more easily.

Here will be described an example of the method of producing the multilayer printed wiring board according to the present invention by the imprint method.

First, a layer (yet-to-cure interlayer dielectric layer) formed from an interlayer dielectric material applied or attached to a core substrate is softened by heating. Then, a mold having formed thereon convexities corresponding to concavities for forming conductor circuits (wiring pattern) and concavities or through-holes for forming viaholes (these concavities and through-holes will be referred to simply as "grooves" hereunder), respectively, is pressed into the yet-to-cure interlayer dielectric layer to form conductor circuit-forming groove and viahole-forming groove in the latter.

Then, the temperature of the yet-to-cure interlayer dielectric layer having the grooves formed therein is lowered or elevated to such an extent that the grooves will not be deformed. Thereafter, the imprinting mold is removed from the yet-to-cure interlayer dielectric layer. The interlayer dielectric layer is further heated for complete curing or it is irradiated with ultraviolet rays and then further heated for complete curing. After this curing, the grooves thus transcribed in the interlayer dielectric layer are filled each with a conductor layer by plating to form the conductor circuits and viaholes.

Note that in the method of production, a plurality of the interlayer dielectric layers is formed by applying or attaching an interlayer dielectric layer having conductor circuits and viaholes formed therein to another interlayer dielectric layer to form an upper yet-to-cure interlayer dielectric layer, softening the yet-to-cure interlayer dielectric layer by re-heating, then pressing the mold into the upper interlayer dielectric layer as above to transcribe second grooves for forming a conductor circuit and viahole to the yet-to-cure interlayer dielectric layer. At this time, heat will be given to the lower interlayer dielectric layer. However, the lower interlayer dielectric layer has completely been cured by the hot curing or photo-curing and thus will not be softened by the heat thus given. Thus, since the position and shape of the lower conductor circuits and thickness of the interlayer dielectric layer will be maintained as they are, so a conductor circuit having an accurate wiring pattern can be formed in each of multiple layers.

The imprinting "mold" used in producing the multilayer printed wiring board according to the present invention refers herein to a "mold having formed thereon convexities for transcription of a conductor circuit-forming groove corresponding to a wiring pattern of a conductor circuit and viahole-forming groove to a yet-to-cure dielectric resin material used to form an interlayer dielectric layer".

The mold may be formed from a metal or ceramics. For example, the mold may be formed from nickel, copper, chrome or the like or from glass, silicon, carbon, aluminum nitride or the like.

Also, the interlayer dielectric layer used for production of a printed wiring board by the imprint method may be formed using the aforementioned thermosetting rein and curing agent.

In the multilayer printed wiring board according to the present invention, the yet-to-cure interlayer dielectric layer may be formed from a composite resin comprised of a thermosetting resin and any other resin under the condition that the thermosetting resin should be used as at least a part. For example, the composite resin should desirably be a mixture of thermosetting resin and thermoplastic resin. Since this composite resin contains the thermosetting resin, it will not be cured again after thermally cured. Namely, it is advantageous as above similarly to the thermosetting resin.

The mixture of thermosetting resin and thermoplastic resin is prepared by solving the thermosetting resin and thermoplastic resin in a solvent as necessary and mixing them uniformly.

The solvent may be for example dimethyl formaldehyde (DMF), methylene chloride, dimethyl sulfoxide (DMSO), normal methylpyrolidone (NMP), methyl ethyl ketone (MEK) or the like. Also, the solvent may be prepared by heating, solving and mixing the thermosetting resin and thermoplastic resin at a temperature lower than the curing-starting temperature.

In the composite resin, the mixing ratio of the thermoplastic resin, that is, the content of the thermoplastic resin in the composite resin, should preferably be about 10 to 70% by weight (in solid content) and more preferably 15 to 50% by weight. If the mixing ratio of the thermoplastic resin is less than 10% by weight, no toughness of the interlayer dielectric layer, expectable with mixing the thermoplastic resin, can be attained. On the other hand, if the mixing ratio is more than 70% by weight, the thermoplasticity will prevail and the imprint method will not suitably be applicable for forming the interlayer dielectric layer.

In the multilayer printed wiring board according to the present invention, the resin other than the thermosetting resin in the yet-to-cure interlayer dielectric layer may be a photo-sensitized thermosetting resin as having been described above. Since such a resin contains thermosetting and photo-curing components, it will not be re-softened after thermally cured or photo-cured. This resin may be formed in multiple layers similarly to the thermosetting resin.

In case a fine wiring pattern is formed from only a thermosetting resin or from a mixture of thermosetting resin or thermoplastic resin as the interlayer dielectric material, the temperature of the interlayer dielectric material will change through a temperature at which its melt viscosity is lowest when it is thermally cured after having the wiring pattern-forming groove and viahole-forming groove transcribed thereto by the mold. This will take place, for example, when the transcription of the mold shape to the internal dielectric material and thermal curing of the internal dielectric material are effected at different posts. In such a case, the yet-to-cure interlayer dielectric layer will be cooled once, and then heated. Since the yet-to-cure interlayer dielectric layer will be softened when changing through the temperature for the lowest melt viscosity, the transcribed wiring pattern- and viahole-forming grooves will be likely to be deformed.

However, in case the photosensitized thermosetting resin, mixture of photosensitized thermosetting resin and thermoplastic resin or photosensitive resin is used as the interlayer dielectric material, the latter will include a photo-curable component. The interlayer dielectric layer is photo-curable in this case. That is to say, a yet-to-cure interlayer dielectric layer from which the mold is removed and exposed to light is photo-cured. Thus, the interlayer dielectric layer will not be softened to such an extent that it will not be able to maintain its shape in a subsequent heat treatment. Therefore, it is possible to form a finer wiring pattern.

To well maintain the shapes of the conductor circuit- and viahole-forming grooves transcribed to the yet-to-cure interlayer dielectric layer even after removal of the mold, the interlayer dielectric layer should preferably be formed from at least one selected from among a thermosetting resin, a mixture of thermosetting resin and thermoplastic resin, a photosensitized thermosetting resin, a mixture of photosensitized thermosetting resin and a thermoplastic resin, and a photosensitive resin, to which the aforementioned flaky particles are added.

Being different from the spherical particles, the flaky particles dispersed in the yet-to-cure interlayer dielectric layer are dispersed at all angles in relation to the surface of the substrate because of their "flaky" shape. Thus, when the yet-to-cure internal dielectric layer, softened, is going to flow, the flaky particles will collide with each other, a friction will thus occur between the particles and also between the particles and resin, and the resin will not easily be movable freely even at a temperature at which the yet-to-cure interlayer dielectric layer will be softened ("three-dimensional constraint effect"). Also, because of the flaky shape, the particle has a larger surface area than the spherical particle. Therefore, the inter-molecular force acting between the flaky particles and resin is larger and the particles thus not easily movable freely will inhibit the resin from flowing. Therefore, the conductor circuit- and viahole-forming grooves transcribed to the interlayer dielectric layer will not easily be deformable.

The mean length or width of each of the flaky particles mixed in the resin should preferably be on the order of 0.01 to 3 μm, and more preferably on the order of 0.01 to 1 μm. If the lean length or width is less than 0.01 μm, the particle is too small to provide the three-dimensional constraint effect. On the other hand, if the mean length or width is more than 3 μm, no fine patterns can easily be formed. When a groove corresponding to a viahole is to be formed in the yet-to-cure interlayer dielectric layer by pressing in a mold, the excessively large particles cannot be pushed away by the mold and will remain on the bottom of the viahole, possibly causing a poor interlayer connection.

Also, the ratio (X/Y) between a mean length X and mean width Y of each flaky particle should preferably be about 1 to 20, and more preferably 1 to 10. If the mean length X of each flaky particle is 20 times larger than the mean width Y, the particle is likely to be broken. If the particle is broken, a crack will possibly occur at the breaking point. Also, if the mean length X of the flaky particles is excessively large, the particles are likely to be oriented in layers, which will lead to a smaller three-dimensional constraint effect. When the ration X/Y fall within the specified range, the flaky particles will provide sufficient three-dimensional constraint effect and inhibit effect.

The thickness of the flaky particles should preferably be within a range of about 0.001 to 1 μm and more preferably 0.005 to 1 μm. If the thickness is smaller than 0.001 μm, the flaky particle is excessively thin and is likely to be broken in the process of forming the interlayer dielectric layer, which will lead to an insufficient three-dimensional constraint effect. On the other hand, if the particle thickness is larger than 1 μm, each of the flaky particles will be heavier so that when the content of the flaky particles in the interlayer dielectric layer is kept unchanged, the relative amount of them will be smaller with the result that the number of the flaky particles in the interlayer dielectric layer will be smaller. Therefore, the flaky particles will provide less three-dimensional constraint effect and inhibit effect.

Further, the aspect ratio (mean length/thickness) of the flaky particle should preferably be within a range of about 20 to 2000, and more preferably 100 to 500. If the aspect ratio is less than 20, both the three-dimensional constraint effect and inhibit effect will be too small. On the other hand, if the aspect ratio is over 2000, the flaky particles are likely to be oriented in layers and will have lower three-dimensional constraint effect.

If the aspect ratio of the flaky particle is less than 100, when the mold is pressed into the interlayer dielectric layer, the intermolecular force between the particles and resin will act to exclude the particles together with the easy-to-flow resin from in the viahole. On the other hand, however, if the aspect ratio is more than 500, the particles laid perpendicular to the substrate inside the viahole are likely to remain inside the viahole because the resistance when the particles are forced out of the viahole is larger. Therefore, when the aspect ratio falls within the range of 100 to 500, it is possible to assure excellent connection reliability even with a viahole whose opening diameter is as small as 30 to 60 μm.

Further, the content of the flaky particles included in the interlayer dielectric layer should preferably be within a range of 1 to 50% by weight, and more preferably 20 to 50% by weight. If the content of the flaky particles is less than 1% by weight, the flaky particles will not provide sufficient three-dimensional constraint effect and inhibit effect. On the other hand, if the content of the flaky particles is above 50% by weight, the resin will be fragile, have the mechanical strength thereof reduced or the lowest melt viscosity there of elevated or the particles will remain at the bottom of the viahole without being pushed away by the mold with the result that the interlayer connection will be poor.

When the resin is immersed in a swelling liquid that will swell the resin, then rinsed in water and further immersed a roughing liquid that will solve the resin, the flaky particles will leave and fall down from the resin layer when the latter is solved and will form anchors that improve the strength of adhesion between the conductor layer and resin.

The interlayer dielectric material used to produce the multilayer printed wiring board according to the present invention by the imprint method may be a resin matrix of at least one selected from among a thermosetting resin, a mixture of thermosetting resin and thermoplastic resin, a photosensitized thermosetting resin, a mixture of photosensitized thermosetting resin and thermoplastic resin, and a photosensitive resin, in which at least one selected from among roughing liquid-soluble resin particles, elastomer particles and inorganic particles is dispersed. With this interlayer dielectric material, it is possible to assure a good strength of adhesion between the interlayer dielectric layer and conductor layer.

The above "roughing liquid" refers to a liquid that solves and decomposes a granular material under the chemical action of acid, alkali, oxidant, water, organic solvent or the like. In such a roughing liquid, the acid may be sulfuric acid, hydrofluoric acid, hydrochloric acid, formic acid or the like the acid. The alkali may be caustic soda, sodium carbonate, potassium hydroxide or the like as the alkali. Also, the oxidant may be permanganic acid, chromic acid, chromate acid mixture or the like as the oxidant. Further, the organic solvent may be acetone, DMF or the like.

The roughing liquid-soluble resin particle may be at least one selected from among epoxy resin, polyester resin, bismaleimide triazine resin and the like. Among these resins, the epoxy resin is excellent in properties and most suitable for use as the resin particle.

The roughing liquid-soluble elastomer particles may be of one of rubber-based resins such as polybutadiene rubber, butadiene styrene rubber, butadiene acrylonitrile rubber, polychloroprene rubber, polyisoprene rubber, acryl rubber, polysulfide synthetic rubber, urethane rubber, rubber fluoride, silicon rubber, ABS resin, etc. and thermoplastic elastomers including polyester elastomer, thermoplastic polystyrene polybutadiene polystyrene (SBS) elastomer, thermoplastic polyolefin elastomer (TPO), thermoplastic polyvinyl elastomer, etc. Use of such elastomer particles permits to reduce the elasticity of the interlayer dielectric material, provide an effect to absorb stress and improve the cooling/heating cycle resistance.

Also, the roughing liquid-soluble inorganic particles may be of one of oxides including silica, alumina, zirconia, zinc oxide, magnesia, cordierite, titania, etc., carbides including silicon carbide, boron carbide, etc., nitrides including aluminum nitride, silicon nitride, etc., carbonates including calcium carbonate, sodium carbonate, etc., barium sulfate, etc. Using such inorganic particles, it is possible to effectively reduce the coefficient of thermal expansion of the interlayer dielectric layer and improve the cooling/heating cycle resistance of the latter.

Use of one of the inorganic particles having a high heat conductivity such as the silicon carbide, aluminum nitride or the like leads to an improved heat conductivity of an adhesive layer.

The particles dispersed in the resin matrix may be spherical, hollow or non-crystalline in shape, and should preferably have a mean size of 0.05 to 10 μm, and more preferably 0.1 to 5 μm. If the mean size is over 10 μm, the anchors will be so deep that a so-called fine wiring pattern of less than 100 μm cannot be transcribed to the resin matrix. If the mean size is under 0.05 μm, no sufficient strength of adhesion can be assured between the conductor layer and interlayer dielectric material with the result that the conductor layer will be separated from the interlayer dielectric layer or a crack will occur in the interlayer dielectric layer.

The proportion of the particles in the interlayer dielectric layer should desirably be 5 to 100 and more preferably 10 to 70 in ratio of weight to a solid content of the resin taken as 100. If the ratio in weight is below 5, no anchors can be formed. On the other hand, if the ratio exceeds 100, it is difficult to knead the particles and resin together and the amount of heat-resistant resin matrix becomes relatively smaller, with the result that the strength of the adhesive layer will be lower.

The surface of the interlayer dielectric layer should desirably be roughed after the wiring pattern- and viahole-forming grooves are transcribed to the interlayer dielectric layer. With this roughing, the conductor circuit- and viahole-forming grooves formed in the interlayer dielectric layer can be roughed at the bottom wall thereof as well as at the side wall. Under the anchoring effect of the roughed surfaces, the strength of adhesion between the interlayer dielectric layer and conductor circuit is increased and a crack can be prevented from occurring first at the side wall or corner of the conductor circuit.

Alternatively, fine irregularities for forming anchors may be formed on the surface of a mold having irregularities that are in mirror-image relation with the conductor circuit- and viahole-forming grooves to improve the strength of adhesion between the interlayer dielectric layer and conductor circuit.

The irregularities should desirably of 0.01 to 3 μm in size. If the size is more than 3 μm, the anchors will be formed so deep that any fine wiring pattern of less than 20 μm cannot be transcribed. On the other hand, if the size is less than 0.05 μm, no sufficient strength of adhesion between the conductor circuit and interlayer dielectric layer can be assured, so that the conductor circuit will be separated from the interlayer dielectric layer or a crack will take place in the interlayer dielectric layer.

The multilayer printed wiring board according to the present invention is characterized, not in that the interlayer dielectric layer is formed from only the thermoplastic resin as by the conventional imprint method, but in that it is formed from at least one selected from among a thermosetting resin, mixture of thermosetting resin and thermoplastic resin, photosensitized thermosetting resin, mixture of photosensitized thermosetting resin and the thermoplastic resin and a photosensitive resin. Since any of the resins including the thermosetting resin or photosensitive resin can be softened at a relatively low temperature, it can advantageously solve the problem of the conventional imprint method that the mold cannot pressed into the interlayer dielectric layer when the latter is not heated to a high temperature.

The resin used in the present invention should desirably be softened at a temperature ranging from 60 to 150° C. at which the resin will show the lowest melt. If the softening temperature is under 60° C., the resin will be softened in the heat-treatment step after the interlayer dielectric layer is applied or attached to a substrate. On the other hand, if the softening temperature is over 150° C., the mold will be deformed.

Here will be described a concrete example of the method of producing the multilayer printed wiring board according to the present invention in which the interlayer dielectric layer is formed from only a thermosetting resin or from a mixture of thermosetting resin and thermoplastic resin.

(1) First, a liquid-state or dry film-state interlayer dielectric layer of only a thermoplastic resin or of a mixture of thermosetting resin and thermoplastic resin is applied or attached as an interlayer dielectric material to a core substrate having a conductor circuit formed thereon to form a yet-to-cure interlayer dielectric layer.

(2) The substrate is heated up to a temperature of ±20° C. at which the interlayer dielectric material will have the lowest melt viscosity. The temperature should preferably be within a range of ±10° C. at which the interlayer dielectric material will have the lowest melt viscosity. This temperature setting is advantageous for pressing in a mold with a low pressure.

(3) A mold having formed thereon convexities that are in mirror-image relation with a conductor circuit and viahole is positioned on the yet-to-cure interlayer dielectric layer formed on the core substrate and then pressed into the yet-to-cure interlayer dielectric layer to form a conductor circuit-forming groove and viahole-forming groove in the layer.

(4) The yet-to-cure interlayer dielectric layer having the grooves transcribed thereto is provisionally cured at the temperature for the lowest melt viscosity plus 5° C. or more, and then the mold is removed from the yet-to-cure interlayer dielectric resin.

(5) Next, the temperature of the yet-to-cure interlayer dielectric layer is elevated until the resin is completely hot-cured.

Through these steps, the conductor circuit- and viahole-forming grooves are formed in the yet-to-cure interlayer dielectric layer and the latter is cured. Thus, the groove shapes can always be maintained appropriately because the temperature of the yet-to-cure internal dielectric layer will not pass by the temperature for the lowest melt viscosity without the mold being pressed in the layer.

(6) After adding a catalyst to the interlayer dielectric layer surface having the grooves formed thereon, the layer surface is plated with electroless copper to form an electroless copper layer on the entire groove surface including the bottom and side wall.

(7) The electroless copper layer is plated with electrolytic copper to simultaneously fill the grooves formed in the interlayer dielectric layer fully with copper plating and cover the entire surface of the interlayer dielectric layer with the copper plating.

(8) The copper plating is polished until the interlayer dielectric layer surface is exposed to provide a conductor circuit and viahole formed from the conductor circuit- and viahole-forming grooves formed in the interlayer dielectric layer and filled with the copper plating.

Note that although in the above example, the conductor circuit and viahole are formed by filling the grooves with the plating, the present invention is not limited this method but the conductor circuit- and viahole-forming grooves may be filled with copper by printing a conductive paste or solder, for example or the conductor circuit and viahole may be formed by filling a conductive layer in each of the grooves with a physical technique such as sputtering, evaporation or the like. Also, the conductor circuit and viahole may be formed by a combination of the physical technique and plating.

Also, the interlayer dielectric layer surface may be chemically or physically cleaned after transcribing the conductor circuit- and viahole-forming grooves by pressing in the mold. This chemical or physical cleaning is intended for removing a resin residuum or the like at the groove bottom. Such a residual resin, if any, will possibly cause a poor interlayer connection.

Note that in case particles are mixed in a resin forming the interlayer dielectric layer, the surface of the latter should preferably be roughed after transcription of the grooves from the mold. With the roughing, the particles or the resin layer will be solved in the roughing liquid or the resin layer and leave from the resin layer to form anchors on the surface of the interlayer dielectric layer. As a result, the anchors will improve the adhesion between the resin layer and conductor circuit. Therefore, since the residua of the resin, particles, etc. at the bottom of the viahole-forming groove will be solved and removed in the roughing liquid, no special cleaning may be made of the interlayer dielectric layer.

The multilayer printed wiring board using the interlayer dielectric material and the method of producing the multilayer printed wiring board, both according to the present invention, will be described in detail based on embodiments of the present invention.

Embodiment 1

(A) Preparing a Kneaded Mixture Containing Flaky Particles

Fifteen grams of flaky particles ("ESPEN C" by the HOJUN; about 500 in aspect ratio when the particles are dispersed; about 0.5 µm in crystal size) was added to a mixed solvent containing 20 g of methyl ethyl ketone (will be referred to as "MEK" hereunder) and 80 g of xylene, and this mixture was kneaded using three rollers to prepare a kneaded mixture containing the flaky particles.

(B) Preparing a Solution Containing Epoxy Resin

Eighty five grams of solid epoxy resin ("EPICOAT 1007" by the Japan Epoxy Resin) was added to the mixed solvent containing 6.8 g of MEK and 27.2 g of xylene, and the resin and mixture were mixed together to prepare a solution containing the epoxy resin.

(C) Preparing a Resin Film for the Interlayer Dielectric Layer

The kneaded mixture containing the flaky particles, prepared in step (A) above, the solution containing the epoxy resin, prepared in step (B), dicyan diamide ("CG-1200" by the BTI Japan; 3.3 g for 100 g of the solid epoxy resin) as curing agent and a curing catalyst ("CURESOL 2E4 HZ" by the SHIKOKU KASEI); 3.3 g for 100 g of the solid epoxy resin) were kneaded together using three rollers to provide an adhesive solution.

The adhesive solution was applied to a sheet of polyethylene terephthalate using a roll coater (by the THERMATRONICS), and then the sheet was dried by heating at 160° C. for 5 min to remove solvent from the sheet. Thus, a dielectric film of 40 µm in thickness was prepared.

A transmission electron microscope (×50,000 to ×100,000 in magnification) was used to observe the flaky particles in the dielectric film. The microscopy showed that the minimum crystal size (minimum width or length of the particle, whichever is smaller) when the particles were dispersed was 0.1 µm. Thus, the aspect ratio of the flaky particle in this embodiment is 100 to 500.

(D) Producing a Multilayer Printed Wiring Board

Figure 9:
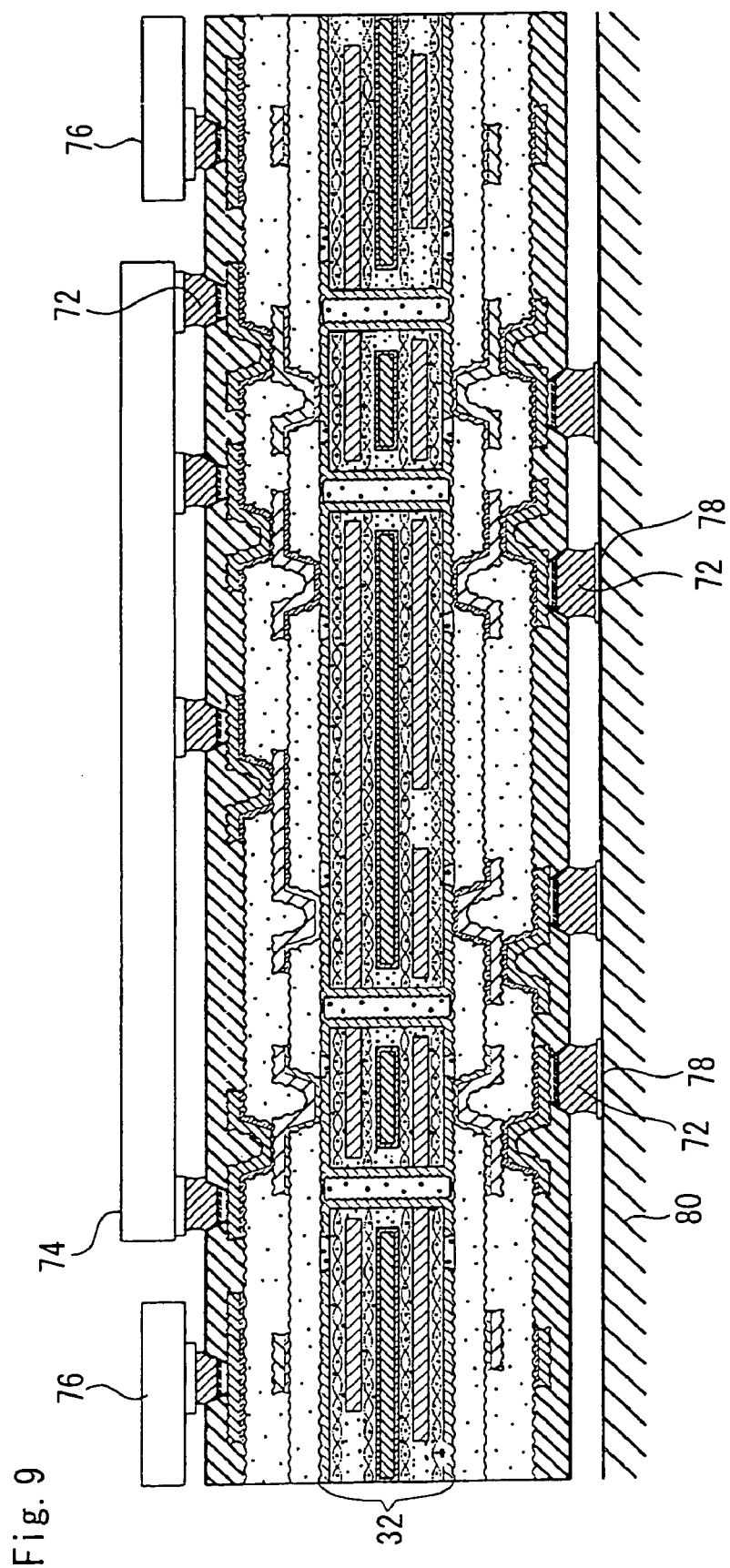
FIG. 9 shows the multilayer printed wiring board as the embodiment 1 having an IC chip mounted thereon.

The method of producing the multilayer printed wiring board as shown in FIG. 9 will be explained below with reference to FIGS. 1 to 8.

(1) Forming a Core Metal Layer

Figure 1B:

First, an opening 12 is formed through a metal sheet 10 of 50 to 400 μm in thickness as shown in FIG. 1(a) (see FIG. 1(b)). This metal sheet may be formed from a metal selected from copper, nickel, zinc, aluminum, iron, etc. or an alloy of them. It should be noted here that using an alloy of 36 or 42 in coefficient of thermal expansion, it is possible to approximate the coefficient of thermal expansion of the core substrate to that of an IC and thus reduce the thermal stress.

Figure 1C:
Figure 1D:
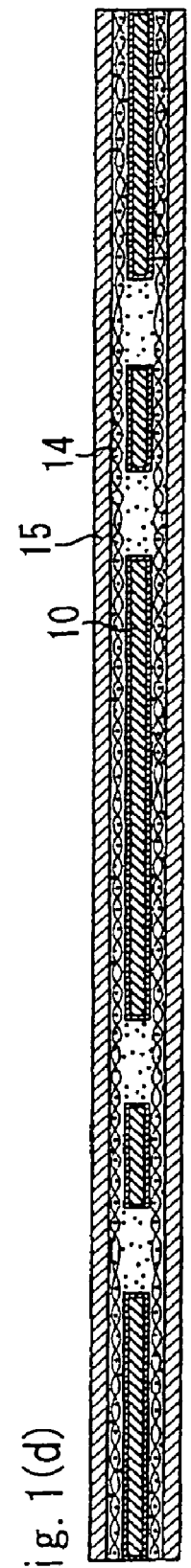

The opening 12 may be formed by punching, etching, drilling, lasering or the like, and the entire surface of the metal layer 10 including the opening 12 is coated with a metal film 13 by electrolytic plating, electroless plating, substitution plating, sputtering or the like to provide a core metal layer (see FIG. 1(c)).

Note that the metal sheet 10 may be of a single layer or of two or more layers.

Also, the corners of the opening 12 formed in the metal sheet 10 should preferably be rounded to eliminate points on which the stress will possibly be focused, which makes it possible to prevent cracking from occurring near the corners.

(2) Forming an Inner Dielectric Layer and Conductor Layer

A dielectric resin layer 14 is formed to cover the entire metal layer 10 and fill the opening 12 formed in the metal layer 10, and a conductor layer 15 is formed on the dielectric resin layer 14.

The dielectric layer may be formed from a thermosetting resin such as polyimide resin, epoxy resin, phenol resin, BT resin or the like, or a B-stage prepreg or the like formed by impregnating the thermosetting resin in a core such as a glass cloth, nonwoven aramide cloth or the like.

More specifically, the prepreg formed from the glass cloth having epoxy resin impregnated therein to have a thickness of 30 to 200 μm is disposed on either side of the metal sheet 10 to cover the metal film 13, a metal foil such as copper foil of 12 to 275 μm in thickness is stacked on the outer surface of the prepreg, and this assembly is hot-pressed from above the metal foil. Thus, the resin in the prepreg is filled in the opening 12 and the prepreg and metal foil are bonded integrally to each other by compression while covering either side of the metal sheet 10 to form an inner dielectric layer 14 and conductor layer 15 (see FIG. 1(d)).

The inner dielectric layer 14 may be applying a resin liquid to either side of the metal layer 10 to fill the resin in the opening 12 or by joining a resin film to either side of the metal layer 10 by hot-pressing in addition to the application of the resin liquid.

Note that although the conductor layer 15 formed on the inner dielectric layer 14 is formed from the metal foil, it may be formed from two or more metal layers by electrolytic plating, electroless plating and the like.

(3) Forming an Inner Conductor Circuit

Figure 1E:
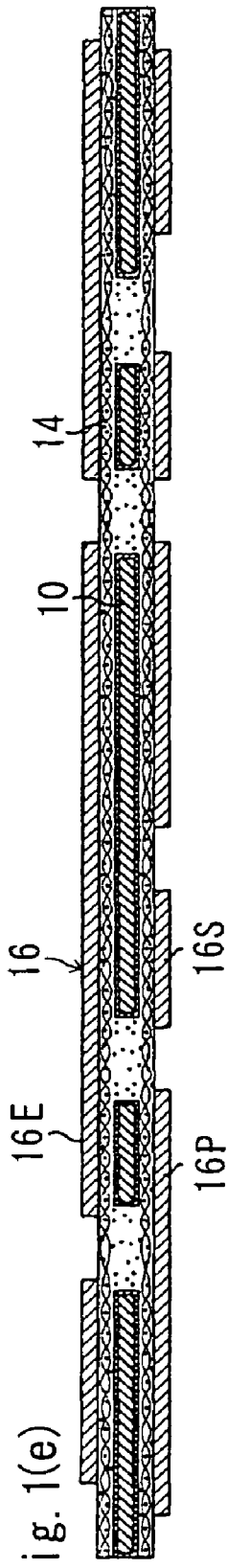

The inner dielectric layer 15 was etched with the tinting technique to form an inner conductor circuit 16 including a signal circuit 16S, power layer 16P and ground layer 16E (see FIG. 1(e)).

The thickness of the inner conductor circuit 16 should preferably fall within a range of 10 to 250 μm and more preferably within a range of 30 to 100 μm. If the thickness is less than 10 μm, the conductor will have too large an electrical resistance to instantaneously supply any power to an IC at the time of a voltage drop, that is, to instantaneously restore the drive voltage for the IC. On the other hand, if the thickness is more than 250 μm, the irregularities in regions where the circuit is to be formed and no circuit is to be formed will have an influence under which the interlayer dielectric layer cannot be formed to have a uniform thickness. Also, since the substrate is thicker, the loop inductance cannot be reduced.

Note that in this embodiment, the inner conductor circuit was formed to have a thickness of 60 μm.

Also note that there should not be formed such a wiring pattern that will extend out from a power through-hole when the power through-hole electrically connected to power sources of electronic parts on an IC or the like is formed to pass by the ground layer 16E. Similarly, there should not be formed such a wiring pattern that will extend out from a ground through-hole when the ground through-hole electrically connected to the ground of the electronic parts on an IC or the like is formed to pass by the power layer 16P.

With the above structure, the through-holes can be formed at a reduced pitch. Also, since the space between the through-hole and inner conductor circuit may be reduced to reduce the mutual inductance.

Note that although the inner conductor circuit was formed by the etching, it may be formed by the additive method.

(4) Forming an Outer Dielectric Layer and Conductor Circuit

As in step (2) above, a dielectric resin layer 18 was formed to cover the inner conductor circuit and fill an inter-circuit gap and an outer conductor circuit 20 was formed on the dielectric resin layer 18.

More particularly, a prepreg formed from a glass cloth having epoxy resin impregnated therein to have a thickness of about 30 to 200 μm is disposed on either side of the substrate formed through steps (1) to (3) above, and a metal foil such as copper foil of 10 to 275 μm in thickness is stacked on the outer surface of the prepreg, this assembly is hot-pressed from above the metal foil. Thus, the prepreg and metal foil are bonded integrally to each other by compression with the resin in the prepreg being filled between the conductor circuits while covering either side of the conductor circuit 16. Thus, there are formed an outer dielectric layer 18 and outer conductor circuit 20 (see FIG. 2(a)).

Note that the outer dielectric layer 18 may be formed by applying a resin liquid to either side of the substrate to cover the inner conductor circuit and fill the opening 13 similarly to the inner dielectric layer 14 or by hot-pressing of either side of the substrate and bonding a resin film to the substrate side by compression in addition to the application of the resin liquid to the substrate side. Also, the dielectric layer can have the surface thereof flattened during this hot-pressing process.

Note that although in this embodiment, the inner dielectric layer 14 and conductor circuit 16 are formed on either side of the metal sheet 10 as a core and the outer dielectric layer 18 and outer conductor circuit 20 are formed on the them, the metal sheet 10 may not always be used as the core but the core substrate may be formed from a stack of one- or double-side copper-clad laminates each having a circuit formed thereon.

(5) Forming a Through-Hole for a Plated Through-Hole

Figure 2A:
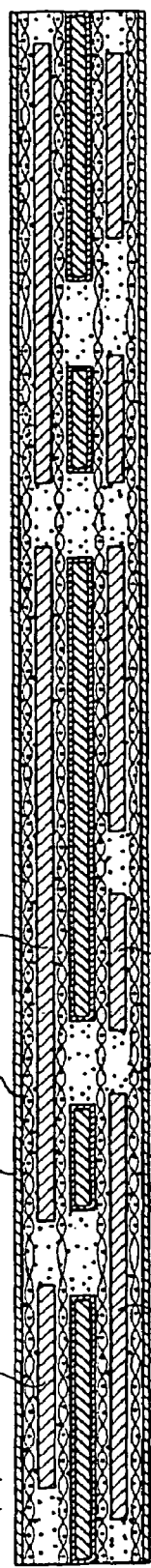
FIGS. 2(a) to 2(d) show some steps of the process of producing the multilayer printed wiring board as the embodiment 1 of the present invention.
Figure 2B:
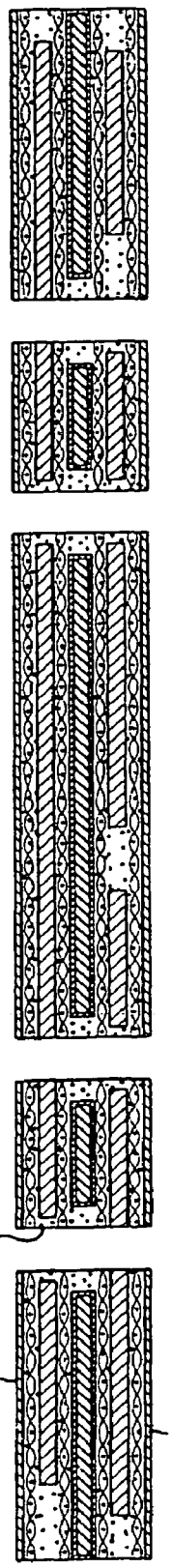
Figure 2C:
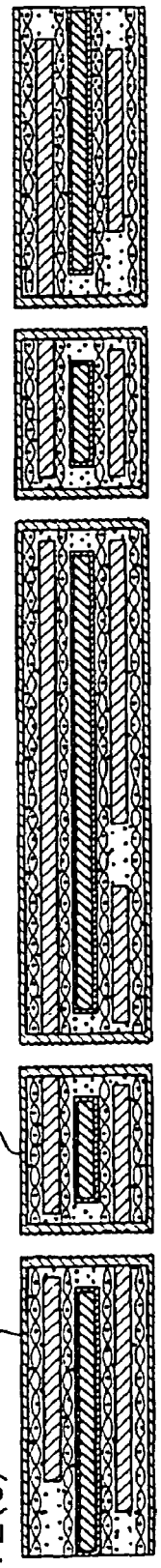
Figure 2D:
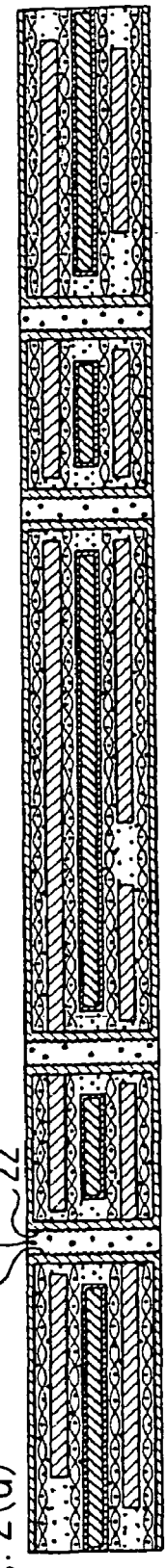
Figure 5A:
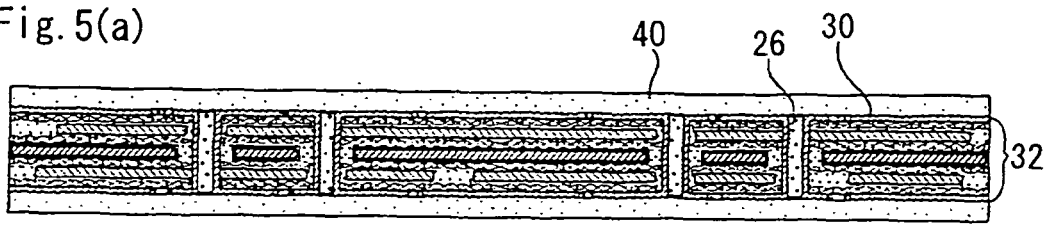
FIGS. 5(a) to 5(d) show some steps of the process of producing the multilayer printed wiring board as the embodiment 1 of the present invention.
Figure 5B:
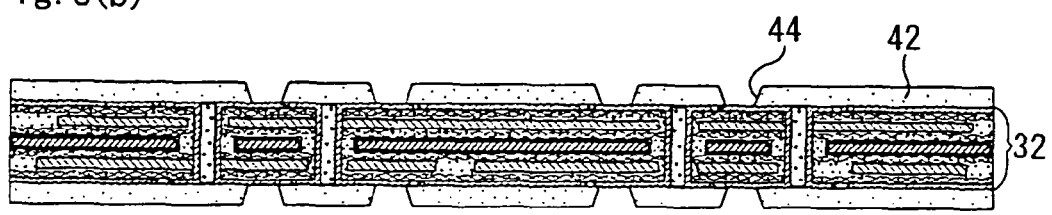
Figure 5C:
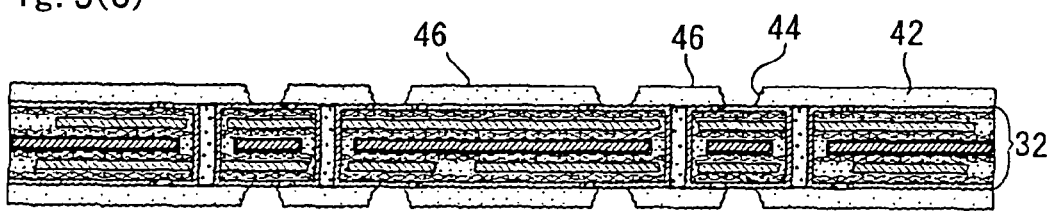
Figure 5D:
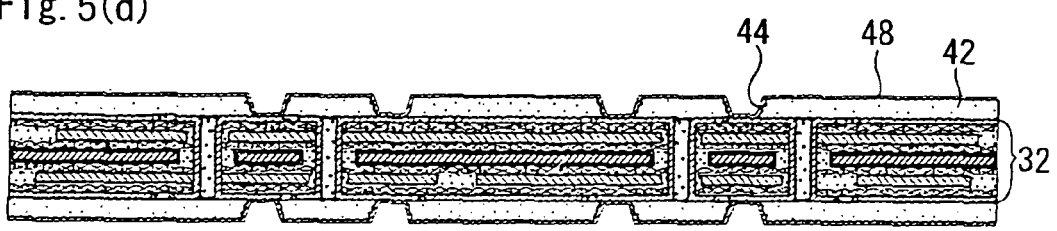

A through-hole 21 of 50 to 400 μm in opening diameter is formed trough the core substrate formed in step (4) above (see FIG. 2(b)). The through-hole 21 is formed in a position corresponding to the opening 12 formed in the meal sheet 10 by drilling, lasering or a combination of drilling and lasering. The through-hole should preferably be formed to have a linear side wall or may be tapered as necessary.

(6) Forming a Plated Through-Hole

To the side wall of the through-hole 21 formed in step (5) above electrically conductive, a plating 22 is formed on the side wall, the surface of the plating 22 is roughed (see FIG. 2(*c*)) and then a resin filler 24 is filled in the through-hole to form a plated through-hole 26 (see FIG. 2(*d*)).

The resin filler 24 filled in the through-hole 21 should preferably be completely cured by provisionally drying it, then removing, by polishing, excess resin filler from on the plating 22 formed on the substrate surface, and then drying it at 150° C. for 1 hour.

The plating 22 is formed by electrolytic plating, electroless plating, panel plating (electroless plating and electrolytic plating in combination) or the like. The plating metal may be copper, nickel, cobalt or metal containing phosphorus.

Also, the plating 22 should preferably be 5 to 30 μm thick.

The resin filler 24 should be any one of, for example, a dielectric resin material containing a resin, curing agent, particles, etc. and a conductive resin material containing a resin, metal particles of gold, copper or the like, curing agent, etc.

The dielectric resin material may be, for example, an epoxy resin such as bisphenol epoxy resin, Novolak epoxy resin or the like, thermosetting resin such as phenol resin or the like, photosensitive ultraviolet-curable resin, thermoplastic resin or the like. Any one of these resins or a mixture of a plurality of these resins may be used as the dielectric resin material.

The particles may be inorganic particles of silica, alumina or the like, metal particles of gold, silver, copper or the like, resin particles or the like. Any one of these kinds of particles or a mixture of a plurality of these kinds of particles may be used as the particles.

The particle should preferably have a size of 0.1 to 5 μm. The particles may be ones equal in size to each other or a mixture of particles different in size from each other.

The curing agent may be an imidazole type, amine type or the like. In addition, it may contain a curing stabilizer, reaction stabilizer, particles, etc.

Also, the conductive resin material may be a conductive paste containing a resin and metal particles, curing agent, etc. mixed in the resin component.

Also, the through-hole 21 may be plated, not filled with a conductive. In this case, no concavities will be formed on the surface layer because of curing and shrinkage. In case the through-hole is filled with the conductive paste, such concavities are formed.

(7) Forming an Outer Conductor Layer and Conductor Circuit on the Core Substrate A plating is formed over either side of the substrate having the through-hole 26 formed through it in step (6) above (see FIG. 3(*a*)), and then the plating is etched with the tinting technique to form a lid plating 28 right above the plated through-hole 26, while an outer conductor circuit 30 including a signal layer 30S, power layer 30P and ground layer 30E is formed on either side of the substrate (see FIG. 3(*b*)).

The outer conductor circuit 30 should preferably have a thickness ranging from 10 to 75 μm and more preferably 20 to 40 μm. If the thickness is less than 10 μm, the conductor will have a large electrical resistance. On the other hand, if the thickness is more than 75 μm, the interlayer dielectric layer formed on the core substrate will be difficult to flatten or the substrate thickness will be increased.

In this embodiment, the outer conductor circuit 30 is 35 μm thick.

The outer conductor circuits 30 formed on both sides of the substrate through steps (1) to (7) above are electrically connected to each other trough the plated through-hole 26, while the inner conductor circuit 16 and outer conductor circuits 30 are electrically connected to each other through the plated through-hole 26. Thus, a multilayer core substrate 32 is formed.

(8) Forming a Roughed Layer 34 on the Outer Conductor Circuit

Either side of the multilayer core substrate 32 was blackened and deoxidized to form a roughed layer 34 on the side and top (including the land surface of the through-hole) of the outer conductor circuit 30 (see FIG. 3(*c*)).

(9) A resin filler 36 was filled in the region of the multilayer core substrate 32 where the outer conductor circuit is not formed, that is, in a space between the outer conductor circuits (see FIG. 4(*a*)). The resin filler may be the same one as the rein filler 24 filled in the through-hole 21 in step (6) above.

(10) Polishing the Upper Surface of the Outer Conductor Circuit

One side of the substrate after subjected to the resin filling was polished using a belt sander to remove one, formed on the upper surface, of the roughed surfaces 34 formed on the side and upper surface of the outer conductor circuit 30, the outer edge of the conductor circuit 30 was polished to the resin filler 36, if any, remaining there, and then the upper surface of the outer conductor circuit 30 was further polished by buffing or the like. Also, this series of polishing was made similarly on the other side of the substrate to flatten the substrate surface. Next, the assembly was heated at 100° C. for 1 hour, and then at 150° C. for 1 hour to cure the resin filler 36 (see FIG. 4(*b*)).

Note that the polishing of the resin filler applied to the space between the outer conductor circuits may be omitted as necessary. In this case, the interlayer dielectric layer can also be formed from the resin layer of the interlayer dielectric layer, stacked on the multilayer core substrate simultaneously with filing of the resin layer into the space between the outer conductor circuits.

(11) Forming a Roughed Layer on the Outer Conductor Circuits

An etchant was applied, by spraying, to the surfaces (including the land surface of the through-hole) of the outer conductor circuits 30S, 30P and 30E flattened in step (10) above to form a roughed layer 38 on the upper surface of the outer conductor circuits (see FIG. 4(*c*)).

(12) Forming an Interlayer Dielectric Resin Layer

The resin film 40 formed by the process (C) above was placed on the surface of the outer conductor circuit formed on the roughed layer 38 and the resin film and outer conductor circuit were provisionally bonded to each other. This assembly was cut. Then, using a vacuum laminator, a cut piece was attached to the substrate surface to form an interlayer dielectric resin layer 42 (see FIG. 5(*a*)).

(13) Forming a Viahole-Forming Opening

A Top Hat-mode carbon dioxide laser of 10.4 μm in wavelength, 4.0 mm in beam diameter and 10 to 25 μsec in pulse width was irradiated to the interlayer dielectric resin layer 42 at a rate of one to 3 shots through a through-hole of 1.0 to 2.2 mm in diameter formed in a mask of 1.2 mm in thickness to form a viahole-forming opening 44 of 30 to 70 μm (see FIG. 5(*b*)).

(14) Forming a Roughed Layer

The substrate 32 having the viahole-forming opening 44 formed therein was immersed in a swelling liquid and then rinsed in water, and then immersed in a solution containing 60 g/litter of permanganic acid at 80° C. for 10 min to allow the flaky particles dispersed in the curing resin of the interlayer dielectric resin layer 42 to leave the surface of the interlayer dielectric resin layer 42, whereby a roughed layer 46 was formed on the surface of the interlayer dielectric resin layer 42, containing the inner wall of the viahole-forming opening 44 (see FIG. 5(*c*)). The roughed slayer 46 was 0.01 to 2 μm in roughness.

(15) Applying a Catalyst Nucleus

Next, the substrate 32 having been processed as above was immersed in a neutralizer solution (by the SIPLAY) and then rinsed in water. Thereafter, the substrate may be subjected to a desmearing process in which residual resin and particles are removed from at the bottom of the viahole by a physical process using $O_2$ plasma, $CF_4$ plasma or the like.

Further, a palladium nucleus was applied to the surface of the substrate whose surface had been roughed to apply a catalyst nucleus to the surface of the interlayer dielectric resin layer 40 and inner wall of the viahole-forming opening 44.

(16) Forming an Electroless Copper Plating

Next, the substrate 32 having the catalyst applied thereto in step (15) above was immersed in an electroless copper plating aqueous solution composed as will be specified below to form an electroless copper plating 48 of 0.6 to 3.0 μm in thickness over the surface of the roughed layer 46. Thus, there is provided a substrate having a conductor layer formed on the surface of the interlayer dielectric resin layer 42, including the inner wall of the viahole-forming opening 44 (see FIG. 4(d)):

Electroless Copper Plating Aqueous Solution:

| Electroless copper plating aqueous solution: | |
|---|---|
| Copper sulfate | 0.030 mol/l |
| EDTA | 0.200 mol/l |
| HCHO | 0.18 g/l |
| NaOH | 0.100 mol/l |
| α,α'-bipyridyl | 100 mg/l |
| Polyethylene glycol | 0.10 g/l |
| Plating conditions: | |
| 34° C. for 40 min | |

(17) Preparing a Plating Resist

Figure 6A:
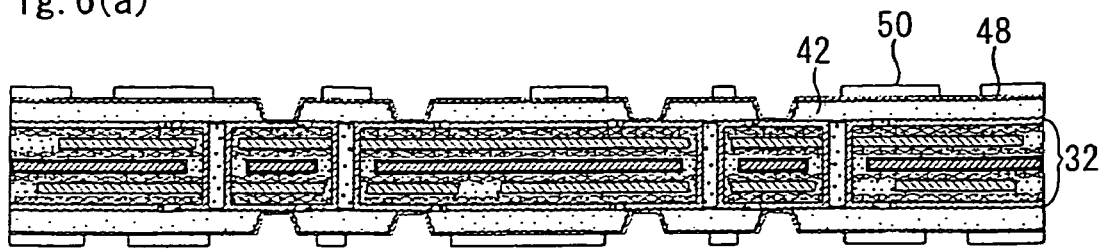
FIGS. 6(a) to 6(d) show some steps of the process of producing the multilayer printed wiring board as the embodiment 1 of the present invention.

A commercially available dry film was attached to the electroless copper plating 48, a mask was placed on the dry film, and this assembly was developed to form a plating resist 50 of 10 to 30 μm in thickness (see FIG. 6(a)).

(18) Forming an Electrolytic Copper Plating

Figure 6B:
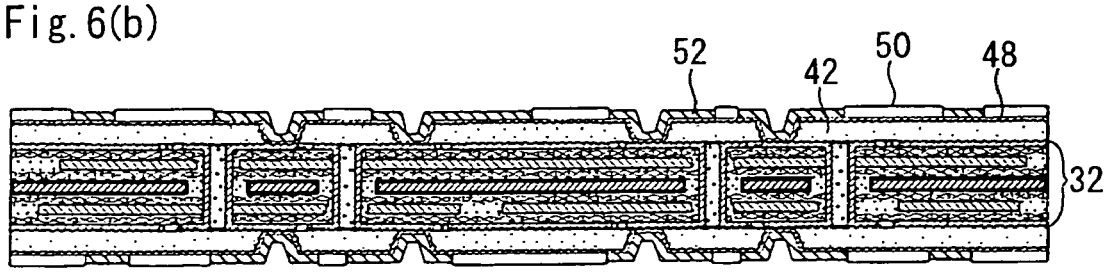

Next, the substrate 32 was subjected to electrolytic copper plating to form an electrolytic copper plating 52 of 5 to 25 μm in the region where the plating resist 50 was formed (see FIG. 6(b)). It should be noted that in this embodiment, the electrolytic copper plating was made with the following plating aqueous solution and under the following conditions to provide an electrolytic copper plating of 20 μm in thickness:

| Electrolytic copper plating aqueous solution: | |
|---|---|
| Sulfuric acid | 2.24 mol/l |
| Copper sulfate | 0.26 mol/l |
| Additive | 19.5 ml/l ("CAPARACID GL" by the ATTEC Japan) |
| Electrolytic plating conditions: | |
| Current density | 1 A/dm$^2$ |
| Time | 90 ± 5 min |
| Temperature | 22 ± 2° C. |

(19) Forming a Conductor Circuit Layer and Viahole

Figure 6C:
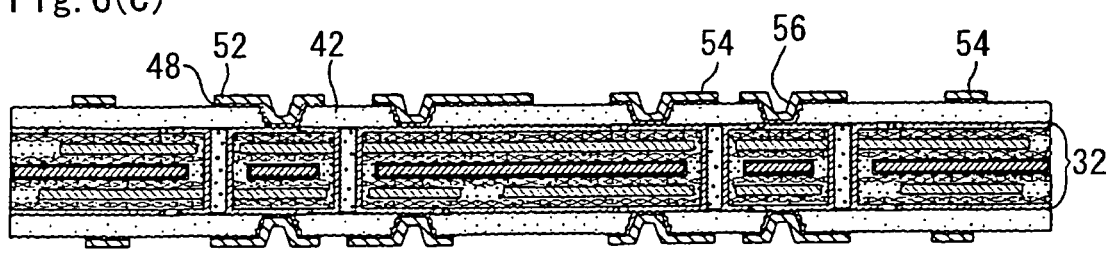
Figure 6D:
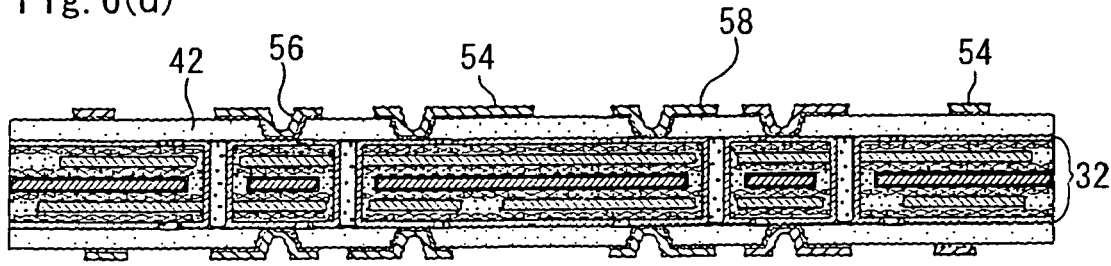

Further, a plating resist 50 was separated and removed in about 5% with KOH, and then the electroless plating 48 under the plating resist was etched away with a mixture of sulfuric acid and hydrogen peroxide to form an independent conductor circuit 54 and viahole 56 (see FIG. 6(c)).

(20) Forming a Roughed Layer

Next, the substrate was subjected to a process similar to step (11) above to form a roughed surface 58 on the surface of each of the upper conductor circuit 54 and viahole 56. In this embodiment, the upper conductor circuit 54 was 20 μm thick (see FIG. 6(d)).

(21) Forming a Multilayer Wiring Board

Figure 7A:
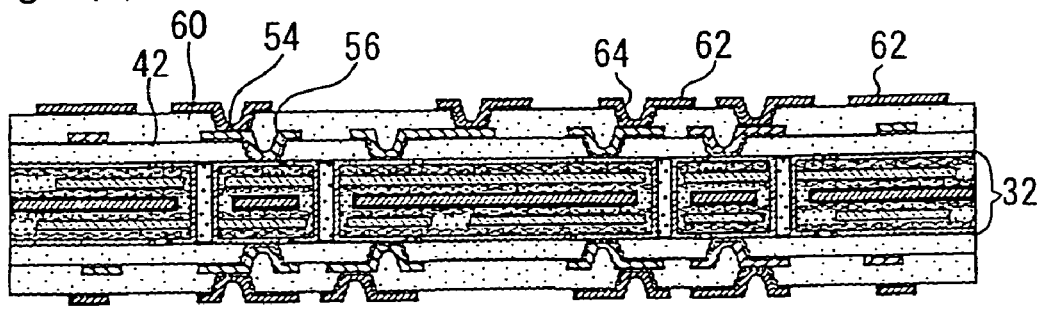
FIGS. 7(a) to 7(d) show some steps of the process of producing the multilayer printed wiring board as the embodiment 1 of the present invention.

Steps (12) to (20) above were repeated to form a second interlayer dielectric resin layer 60, and a further upper conductor circuit 62 and viahole 64 was formed on the interlayer dielectric resin layer 60 to provide a multilayer wiring board (see FIG. 7(a)).

(22) Forming a Solder Resist Layer

Figure 7B:
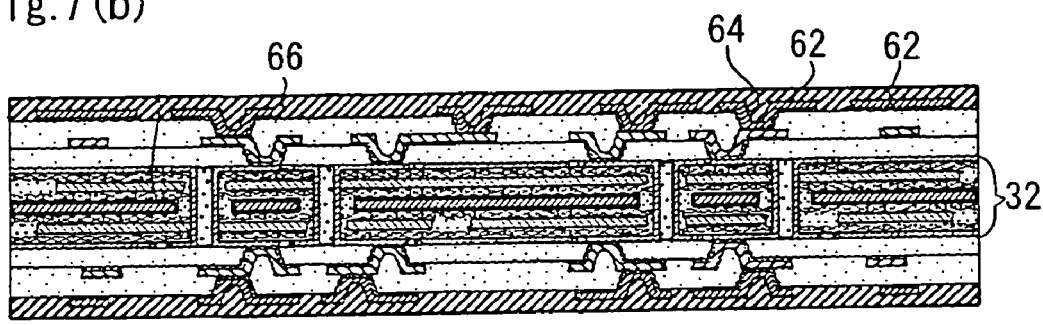
Figure 7C:
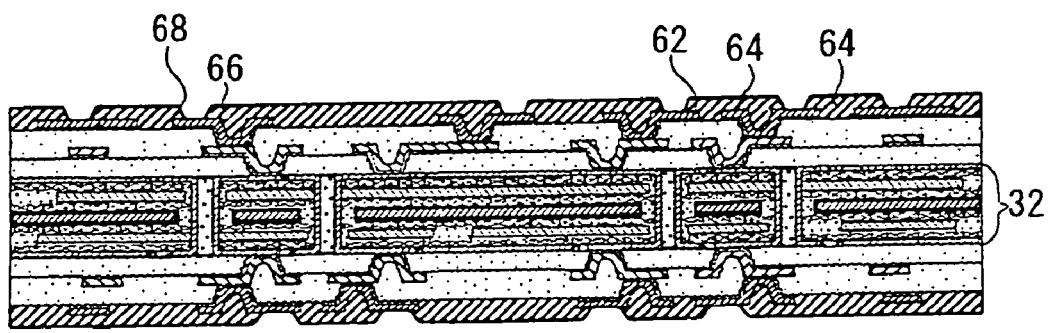

Next, a commercially available solder resist composition was applied to a thickness of 12 to 30 μm on either side of the multilayer wiring board formed in step (21) above and dried at 70° C. for 20 min and then for more 30 min to form a solder resist layer 66 (see FIG. 7(b)). Thereafter, a 5 mm-thick photomask having a solder-resist opening pattern depicted thereon was attached in absolute contact to the solder resist layer 66, the multilayer wiring board was exposed to ultraviolet rays of 1000 mJ/cm$^2$ and developed in a DMTG solution to form an opening 68 of 200 μm in diameter (see FIG. 7(c)).

Further, the multilayer wiring board was heated at 80° C. for 1 hour, 100° C. for 1 hour, 120° C. for 1 hour and then at 150° C. for 3 hours to cure the solder resist layer 66. Thus, there was formed a solder resist pattern layer having formed therein an opening 68 through which the surface of the upper conductor circuit 62 is exposed and that has a thickness of 10 to 25 μm.

(23) Forming a Nickel-Gold Layer

Figure 7D:
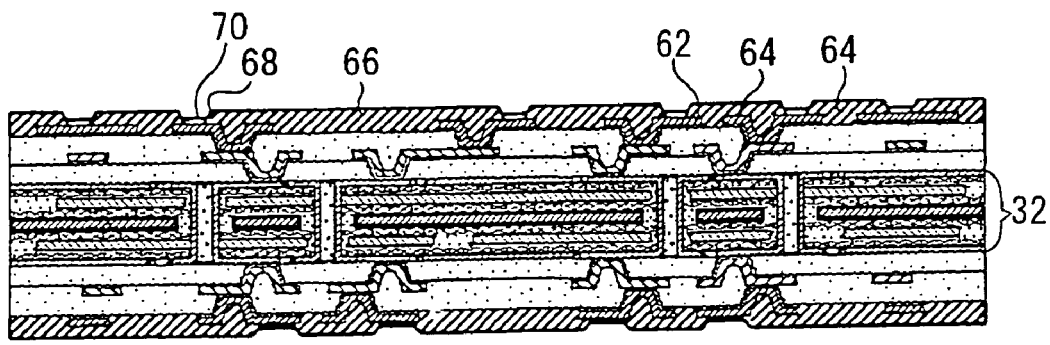
Figure 8:
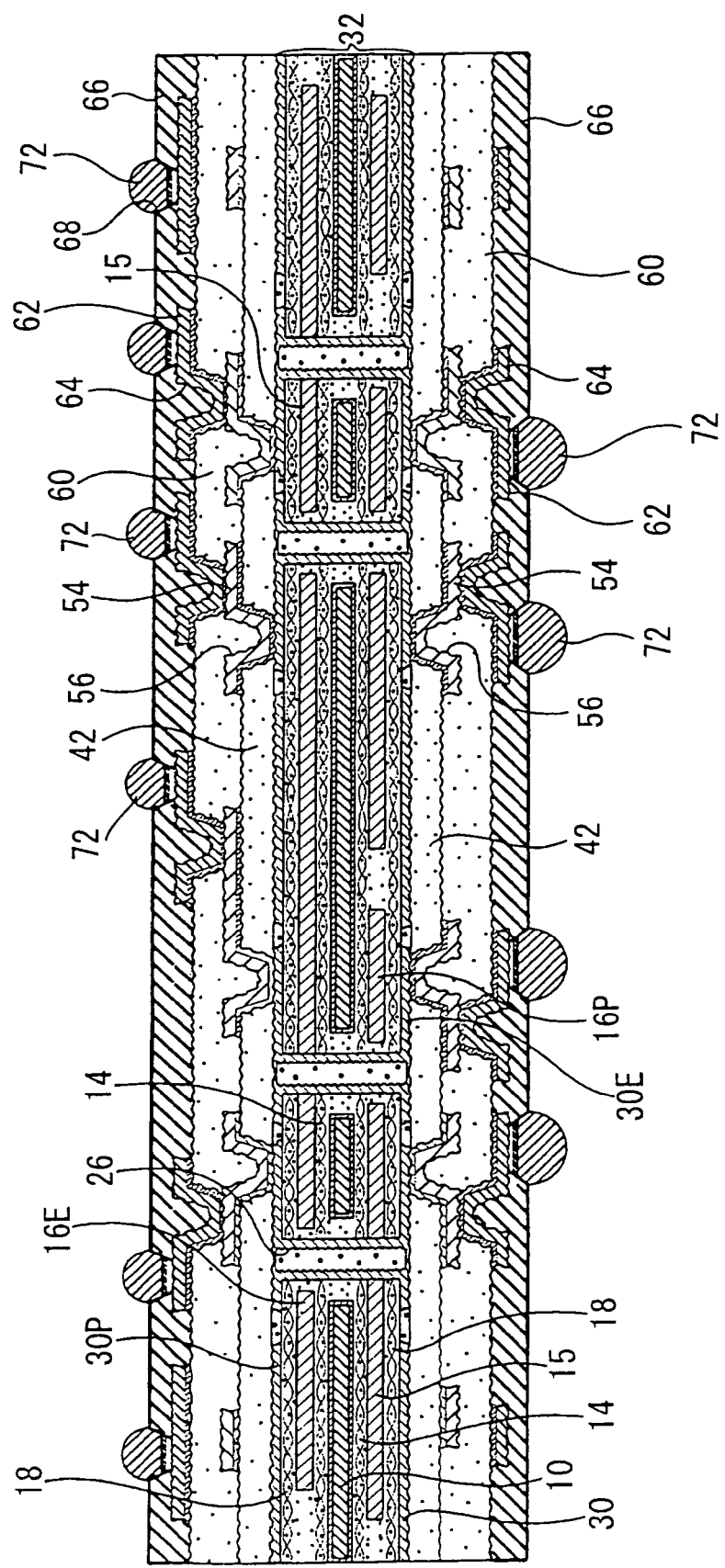
FIG. 8 shows the multilayer printed wiring board as the embodiment 1 of the present invention.

Next, the substrate having the solder resist layer 66 formed thereon was immersed in an electroless nickel plating liquid to form a nickel plating layer having a thickness of 5 μm on the surface of the upper conductor circuit layer 62, exposed through the opening 68, and then immersed in an electroless gold plating liquid to form a gold plating of 0.03 μm in thickness on the nickel plating layer, thereby forming a nickel-gold plating 70 (see FIG. 7(d)). Also, a single layer of tin or noble metal (gold, silver, palladium, platinum or the like) layer may be formed in place of the nickel-gold layer.

(24) Forming Solder Bumps

Thereafter, at one side of the substrate (where an IC chip is to be mounted), a solder paste containing tin and lead was printed on the surface of the upper conductor circuit layer 62, exposed through the opening 68 in the solder resist layer 66. A solder paste containing tin and antimony was printed on the other side of the substrate and then reflowed at 200° C. to form an outer terminal. Thus, a multilayer printed wiring board having solder bumps 72 was produced (see FIG. 8).

An IC chip 74 is mounted on the multilayer printed wiring board on contact with the solder bumps 72 and further a chip capacitor 76 is mounted on the wiring board.

Note that there was formed a circuit to electrically connect the front and read sides of the multilayer wiring board to each other through the viahole and through-hole and there were also prepared five types of connection-resistance evaluation patterns (first to fifth patterns) each of which is connected to the circuit via an IC and electrically connects the front and rear sides of the multilayer wiring board to each other through other viahole and through-hole was formed. The first connection-resistance evaluation pattern was formed from a closed circuit that electrically connects 100 viaholes of 30 μm in opening diameter, while the second to fifth connection-resistance evaluation patterns were formed from closed circuits including 100 viaholes each of 40, 50, 60 and 70 μm, respectively, in opening diameter.

Then, the multilayer printed wiring board having the IC chip 74 and chip capacitor 76 mounted thereon was installed to a mother board 80 via an outer 78 (see FIG. 9).

Embodiment 2

A multilayer printed wiring board was produced similarly to the embodiment 1 except that the flaky particle used was "NANOFIL" (by the TOPY INDUSTRY; 100 to 500 in aspect ratio after the particles are dispersed; 0.1 to 0.5 μm in size; 0.001 μm in minimum particle thickness).

Embodiment 3

A multilayer printed wiring board was produced similarly to the embodiment 1 except that the kneaded mixture containing flaky particles and solution containing epoxy resin were prepared as in processes (A) and (B) below:

(A) Preparing a Kneaded Mixture Containing Flaky Particles

Fifteen grams of flaky particles ("ESPEN C" by the HOJUN; about 500 in aspect ratio when the particles are dispersed; about 0.5 μm in crystal size) was added to a mixed solvent containing 33 g of MEK and 67 g of xylene, and this mixture was kneaded using three rollers to prepare a kneaded mixture containing the flaky particles.

(B) Preparing a Solution Containing Epoxy Resin

Eighty five grams of solid epoxy resin ("EPICOAT 1007" by the Japan Epoxy Resins) was added to the mixed solvent containing 11 g of MEK and 23 g of xylene, and the resin and mixture were mixed together to prepare a solution containing the epoxy resin.

Embodiment 4

A multilayer printed wiring board was produced similarly to the embodiment 1 except that the kneaded mixture containing flaky particles and solution containing epoxy resin were prepared as in processes (A) and (B) below:

(A) Preparing a Kneaded Mixture Containing Flaky Particles

Fifteen grams of flaky particles ("ESPEN C" by the HOJUN; about 500 in aspect ratio when the particles are dispersed; about 0.5 μm in crystal size) was added to a mixed solvent containing 50 g of MEK and 50 g of xylene, and this mixture was kneaded using three rollers to prepare a kneaded mixture containing the flaky particles.

(B) Preparing a Solution Containing Epoxy Resin

Eighty five grams of solid epoxy resin ("EPICOAT 1007" by the Japan Epoxy Resins) was added to the mixed solvent containing 17 g of MEK and 17 g of xylene, and the resin and mixture were mixed together to prepare a solution containing the epoxy resin.

Embodiment 5

A multilayer printed wiring board was produced similarly to the embodiment 1 except that the dielectric film was prepared as in (C) below:

(C) Preparing a Dielectric Film

Fifty five grams of a solid epoxy resin ("EPICOAT 1007" by the YUKA SHELL EPOXY) and 15 g of flaky particles ("ESPEN C" by the HOJUN) were fed to a small extruder ("TEX 30" by the NIPPON SEIKOSHO), melted and kneaded at 100 C and extruded in the shape of a strand, and the strand thus extruded was formed by a pelletizer into pellets.

The pellets were solved in a mixed solvent containing MEK and xylene in the proportion of 1 to 4, and 3.3 g of dicyan diamide ("CG-1200" by the B.T.I. Japan) for 100 g of the solid epoxy resin) as curing agent and 3.3 g of a curing catalyst ("CURESOL 2E4 HZ" by the SHIKOKU KASEI) for 10 g of the solid epoxy resin added to the solvent and sufficiently agitated, then the mixed solution was defoamed to prepare a solution of dielectric resin component. Next, a roll coater was used to apply the dielectric resin component solution was applied to a sheet of polyethylene terephthalate and remove the solvent in this condition, to thereby prepare a dielectric film of 40 μm in thickness.

Embodiment 6

A multilayer printed wiring board was produced similarly to the embodiment 5 except that the mixed amount of the flaky particles was changed from 15 g to 20 g.

Embodiment 7

A multilayer printed wiring board was produced similarly to the embodiment 1 except that the kneaded mixture containing flaky particles and solution containing epoxy resin were prepared as in processes (A) and (B) below:

(A) Preparing a Kneaded Mixture Containing Flaky Particles

Fifteen grams of flaky particles ("ESPEN C" by the HOJUN; about 500 in aspect ratio when the particles are dispersed; about 0.5 μM in crystal size) was added to a mixed solvent containing 80 g of MEK and 20 g of xylene, and this mixture was kneaded using three rollers to prepare a kneaded mixture containing the flaky particles.

(B) Preparing a Solution Containing Epoxy Resin

Eighty five grams of solid epoxy resin ("EPICOAT 1007" by the Japan Epoxy Resins) was added to the mixed solvent containing 27.2 g of MEK and 6.8 g of xylene, and the resin and mixture were mixed together to prepare a solution containing the epoxy resin.

Embodiment 8

A multilayer printed wiring board was produced similarly to the embodiment 1 except that the kneaded mixture containing flaky particles and solution containing epoxy resin were prepared as in processes (A) and (B) below:

(A) Preparing a Kneaded Mixture Containing Flaky Particles

Fifteen grams of flaky particles ("ESPEN C" by the HOJUN; about 500 in aspect ratio when the particles are dispersed; about 0.5 μm in crystal size) was added to 100 g of MEK, and this mixture was kneaded using three rollers to prepare a kneaded mixture containing the flaky particles.

(B) Preparing a Solution Containing Epoxy Resin

Eighty five grams of solid epoxy resin ("EPICOAT 1007" by the Japan Epoxy Resins) was added to 34 g of MEK, and the resin and mixture were mixed together to prepare a solution containing the epoxy resin.

Embodiment 9

A multilayer printed wiring board was produced similarly to the embodiment 5 except that in preparation of a dielectric film, the flaky particle used was "MICROMICA MK-100F" by the COOP CHEMICAL; aspect ratio is 20 to 30 and size is 1 to 3 μm).

Embodiment 10

A multilayer printed wiring board was produced similarly to the embodiment 1 except that the flaky particle used was "ORGANITE D" by the HOJUN (about 2000 in aspect ratio and about 2.0 μm in crystal size when the particles are dispersed).

The minimum particle size of the dispersed flaky particles was observed using a transmission electron microscope (×50,000 to ×100,000 in magnification). The minimum particles size was 0.1 μm. Thus, in this embodiment, the aspect ratio was 100 to 2000.

Embodiment 11

A multilayer printed wiring board was produced similarly to the embodiment 3 except that the solid epoxy resin used was epoxidized butadiene ("EPOREED PB3600" by the DICELL KAGAKU).

Embodiment 12

A multilayer printed wiring board was produced similarly to the embodiment 3 except that epoxidized butadiene and polyether sulfone (PES) were used in place of the solid epoxy resin and in the proportion of 3 to 2 (epoxidized butadiene to polyether sulfone (PES)).

Reference Example 1

A multilayer printed wiring board was produced similarly to the embodiment 5 except that in the preparation of the dielectric film, "POLYFIL DL" by the SANYOH BOEKI (7 to 10 in aspect ratio) was used as the flaky particles.

Reference Example 2

A multilayer printed wiring board was produced similarly to the embodiment 1 except that the flaky particle used was "SOMASHIF MPE" by the COOP CHEMICAL (swelling particles of 5,000 to 7,000 in aspect ratio and 5 to 7 μm in mean size).

Comparative Example 1

A multilayer printed wiring board was produced similarly to the embodiment 5 except that in the preparation of the dielectric film, no flaky particles were used but spherical silica particle "SO-E6" by the ADMATECS was used.

The multilayer printed wiring boards produced as in the aforementioned embodiments 1 to 12, reference examples 1 and 2 and comparative example 1 were tested as follows for evaluation of the cooling/heating cycle resistance (connection reliability), dispersed state of the flaky particles and electrical connection:

Evaluation Test 1: Coefficient of Thermal Expansion

The coefficient of thermal expansion $\alpha_1$ in a domain in which the resin is at a lower temperature than the glass transition temperature Tg and coefficient of thermal expansion $\alpha_2$ in a domain in which the resin is at a higher temperature than the glass transition temperature Tg of the dielectric films prepared as in the aforementioned embodiments 1 and 2, 9 to 12, reference examples 1 and 2 and comparative example 1 were measured using a thermo mechanical analyzer (TMA). The results of measurement are shown in Table 1.

Evaluation Test 2: Shock Resistance

The printed wiring boards produced as in the aforementioned embodiments 1 and 2, 9 to 12, reference examples 1 and 2 and comparative example 1 were tested for shock resistance under the following conditions 1 and 2 in a cooling/heating cycle testing machine:

Condition 1:
Cooling at −55° C. for 30 min and heating at 125° C. for 30 min were taken as one cycle, and each printed wiring board was repeatedly cooled and heated through 3,000 cycles.

Condition 2:
Cooling at 25° C. for 20 sec and heating at 260° C. for 10 sec were taken as one cycle, and each printed wiring board was repeatedly cooled and heated through 300 cycles.

After completion of the cooling/heating cycle test, a light microscope (×10 in magnification) was used to observe the printed wiring board for occurrence of a crack. The test results are shown also in Table 1.

TABLE 1

|  |  | Particle shape | Aspect ratio | Coefficient of thermal expansion | | Shock resistance | |
|---|---|---|---|---|---|---|---|
|  |  |  |  | $\alpha_1$ | $\alpha_2$ | Condition 1 | Condition 2 |
| Embodiments | 1 | Flaky | 100-500 | 43 | 70 | ○ | ○ |
|  | 2 | Flaky | 100-500 | 48 | 73 | ○ | ○ |
|  | 9 | Flaky | 20-30 | 57 | 89 | ○ | ○ |
|  | 10 | Flaky | 100-2000 | 52 | 83 | ○ | ○ |
|  | 11 | Flaky | 100-500 | 36 | 65 | ○ | ○ |
|  | 12 | Flaky | 100-500 | 32 | 60 | ○ | ○ |
| Ref. example 1 |  | Flaky | 7-10 | 76 | 128 | ○ | x |
| Ref. example 2 |  | Flaky | 5000-7000 | 78 | 134 | ○ | x |
| Comparative example 1 |  | Spherical | — | 103 | 280 | x | x |

In Table 1, finding of a crack is indicated with "x" and finding of no crack is indicated with "O". The results of shock resistance test revealed that a difference in shock resistance among the printed wiring boards tested is caused by a difference in shape of the particles mixed in the resin and that mixing of the flaky particles improves the shock resistance. The cooling/heating cycle test done at a temperature higher than the glass transition temperature Tg showed that the aspect ratio of the flaky particle is significant for the shock resistance and the aspect ratio of 20 to 2000 is preferable. Inferably, the interlayer dielectric layer using the spherical particles could not withstand the cooling/heating cycle because $\alpha_1$ and $\alpha_2$ were larger than those of the interlayer dielectric layer in which the flaky particles were dispersed Evaluation Test 3: Cooling/Heating Cycle Test 1

The printed wiring boards produced as in the aforementioned embodiments 1 and 2, 9 to 12, reference examples 1 and 2 and comparative example 1 were tested for shock resistance under the following conditions 1 and 2 in the cooling/heating cycle testing machine:

Condition 1:

Cooling at −55° C. for 30 min and heating at 125° C. for 30 min were taken as one cycle, and each printed wiring board was repeatedly cooled and heated through 1,000 cycles.

Condition 2:

Cooling at 25° C. for 20 sec and heating at 260° C. for 10 sec were taken as one cycle, and each printed wiring board was repeatedly cooled and heated through 100 cycles.

After completion of the cooling/heating cycle test, the printed wiring boards were tested to evaluate variations in connection resistance of the printed wiring board.

Note that the initial resistance of the first to fifth connection-resistance evaluation patterns and resistance of the patterns after the printed wiring boards were subjected to the specified cooling/heating cycles were measured and a variation of connection resistance (=(resistance after the cooling/heating cycle−initial resistance)/initial resistance)) that is less than ±5% is indicated with "O", a variation of over −5% and under −10% or of over 5% and under 10% is indicated with "Δ" and other variations are indicated with "x" in Tables 2-1 and 2-2.

The results of the tests made under the condition 1 are shown in Table 2-1, while the results of the tests made under the condition 2 are shown in Table 2-2. It was found from the test results that a difference in reliability on resistance of the connection through the viahole between the viahole of 60 μm in diameter as tested under the condition 1 and the viahole of 70 μm in diameter as tested under the condition 2 is caused by a difference the particle shapes and that the flaky particles are more preferable than the spherical ones. Also, Tables 2-1 and 2-2 show that as the viahole diameter becomes smaller, the aspect ratio of the flaky particle is significant and that an aspect ratio of 100 to 500 is optimum. The test results concerning the viahole of 30 μm in diameter showed that when the resin in the interlayer dielectric layer is of a lower polarity, the connection reliability on the viahole is more improved. Inferably, the particles would be evenly dispersed, not unevenly, in the resin of the low polarity. Also, it is inferable that the particles would be likely to remain at the bottom of a viahole formed where the particles were not evenly dispersed and the coefficient of thermal expansion of the interlayer dielectric layer varied in such a viahole.

TABLE 2-1

| (condition 1*) | | Particle shape | Aspect ratio | Viahole diameter in connection resistance evaluating pattern (in μm) | | | | |
|---|---|---|---|---|---|---|---|---|
| | | | | 30 | 40 | 50 | 60 | 70 |
| Embodiments | 1 | Flaky | 100-500 | x | o | o | o | o |
| | 2 | Flaky | 100-500 | x | o | o | o | o |
| | 9 | Flaky | 20-30 | x | x | o | o | o |
| | 10 | Flaky | 100-2000 | x | x | o | o | o |
| | 11 | Flaky | 100-500 | o | o | o | o | o |
| | 12 | Flaky | 100-500 | o | o | o | o | o |
| Ref. example 1 | | Flaky | 7-10 | x | x | x | o | o |
| Ref. example 2 | | Flaky | 5000-7000 | x | x | x | o | o |
| Comparative example 1 | | Spherical | | x | x | x | x | o |

NOTE
*Cooling at −55° C. for 30 min and heating at 125° C. for 30 min were taken as one cycle, and each printed wiring board was repeatedly cooled and heated through 1,000 cycles. A variation of connection resistance that is less than ±5% is indicated with "o", a variation of over −5% and under −10% or of over 5% and less than 10% is indicated with "Δ" and other variations are indicated with "x".

TABLE 2-2

| (condition 2*) | | Particle shape | Aspect ratio | Viahole diameter in connection resistance evaluating pattern (in μm) | | | | |
|---|---|---|---|---|---|---|---|---|
| | | | | 30 | 40 | 50 | 60 | 70 |
| Embodiments | 1 | Flaky | 100-500 | x | o | o | o | o |
| | 2 | Flaky | 100-500 | x | o | o | o | o |
| | 9 | Flaky | 20-30 | x | x | o | o | o |
| | 10 | Flaky | 100-2000 | x | x | x | o | o |
| | 11 | Flaky | 100-500 | o | o | o | o | o |
| | 12 | Flaky | 100-500 | o | o | o | o | o |
| Ref. example 1 | | Flaky | 7-10 | x | x | x | x | o |
| Ref. example 2 | | Flaky | 5000-7000 | x | x | x | x | o |
| Comparative example 1 | | Spherical | | x | x | x | x | x |

NOTE
*Condition 2: Cooling at 25° C. for 20 sec and heating at 260° C. for 10 sec were taken as one cycle, and each printed wiring board was repeatedly cooled and heated through 100 cycles.
A variation of connection resistance that is less than ±5% is indicated with "o", a variation of over −5% and under −10% or of over 5% and less than 10% is indicated with "Δ" and other variations are indicated with "x".

Evaluation Test 4: Dispersed State of the Flaky Particles

A fraction of the dielectric film included in each of the embodiments 1, 3 to 8, 11 and 12 was sampled and cured. The cured fraction was observed using a transmission electron microscope (×50,000 to ×100,000 in magnification). The number of flaky particles (X) observable in a predetermined area was measured. The number of flaky particles completely disposed in the area (flaky particles dispersed in a single layer) was taken as Y and the number of flaky particles disposed in less than 5 layers was taken Z. A ratio (%) of the flaky particles completely dispersed was calculated as (Y/X)×100, and a ratio (%) of the flaky particles dispersed in less than 5 layers was calculated as (Z/X)×100. The results are shown in Table 3.

Evaluation Test 5: Cooling/Heating Cycle Test 2

The printed wiring boards produced as in the aforementioned embodiments 1, 3 to 8, 11 and 12 were tested for shock resistance under the following condition in the cooling/heating cycle testing machine:
Condition:
Cooling at −55° C. for 30 min and heating at 125° C. for 30 min were taken as one cycle, and each printed wiring board was repeatedly cooled and heated through 1,000 and 2,000 cycles.

After completion of the cooling/heating cycle test, the printed wiring boards were tested to evaluate variation of the connection resistance. The results are also shown in Table 3.

Note that the initial resistance of the third connection-resistance evaluation pattern and resistance of the patterns after the printed wiring boards were subjected to the specified cooling/heating cycles were measured and a variation of connection resistance (=(resistance after the cooling/heating cycles−initial resistance)/initial resistance)) that is less than ±5% is indicated with "O", a variation of over −5% and under −10% or of over 5% and under 10% is indicated with "Δ" and other variations are indicated with "x" in Table 3.

TABLE 3

|  |  | Dispersed state | | No. of cycles | |
| --- | --- | --- | --- | --- | --- |
|  |  | % of particles in one less layer | % of particles in 5 or less layers | 1000 | 2000 (*) |
| Embodiments | 1 | 95 | 98 | o | o (2.3) |
|  | 3 | 90 | 95 | o | o (3.6) |
|  | 4 | 82 | 85 | o | Δ (5.3) |
|  | 5 | 80 | 83 | o | x (13.5) |
|  | 6 | 70 | 75 | o | x (15.3) |
|  | 7 | 60 | 68 | o | Δ (7.5) |
|  | 8 | 40 | 45 | o | Δ (6.3) |
|  | 11 | 97 | 100 | o | o (1.8) |
|  | 12 | 100 | 100 | o | o (1.2) |

NOTE
(*) The parenthesized numeral indicates a percentage variation.

The TEM observation revealed that in the embodiments 5 and 6, some layered silicate particles had an interlayer distance of more than 5 nm. It is considered that in the long-time cooling/heating cycle test, interlayer separation having occurred in particles in which the interlayer distance was large, which resulted in increase of the connection resistance. The results of the test on the test pieces in which the dispersed state was good (more than 85% of particles were in less than 5 layers) and those in which the dispersed state was poor (less than 68% of particles were in less than 5 layers) were found better than the results of the test on the test pieces in which the dispersed state was neither good or poor. Inferably, when the particles were well dispersed, the layers had already been separated completely from each other during kneading and they would not separate from each other in the subsequent steps of production or steps of testing.

On the other hand, when the particles are poorly dispersed, the adhesion between the particle layers is strong. Also in this case, it is inferred that the particle layers would not separate from each other in the subsequent steps of production or steps of testing. When the particles are neither well nor poorly dispersed, the dispersion during kneading is so insufficient that particles whose interlayer distance is large will remain not dispersed. Inferably, such particles whose interlayer distance was large had the layers thereof separated in the acceleration test and the resin was cracked or otherwise broken, which had led to the increased connection resistance.

Evaluation Test 6: Simultaneous Switching Test

In this test, it was checked whether an IC chip whose driving frequency is 1 GHz (FSB: 100 to 133 MHz) mounted on each of the printed wiring board produced according to the embodiments 1 to 12, reference examples 1 and 2 and the comparative example 1 malfunctioned and also whether an IC chip whose driving frequency is 3 GHz (FSB: 400 to 800 MHz) mounted on the printed wiring board malfunctioned. In this test, the transistor in the IC chip was simultaneously switched repeatedly 100 and 300 times and it was checked if any malfunction had occurred during the 100 and 300 times of simultaneously switching. The test results are shown in Table 4.

Note that in Table 4, "x" indicates a test piece having malfunctioned at least once and "O" indicates a test piece having not malfunctioned.

TABLE 4

|  |  | 100 times of simultaneous switching | | 300 times of simultaneous switching | |
| --- | --- | --- | --- | --- | --- |
|  |  | 1 GHz | 3 GHz | 1 GHz | 3 GHz |
| Embodiments | 1 | o | o | o | o |
|  | 2 | o | o | o | o |
|  | 3 | o | o | o | o |
|  | 4 | o | o | o | o |
|  | 5 | o | o | o | o |
|  | 6 | o | o | o | o |
|  | 7 | o | o | o | o |
|  | 8 | o | o | o | o |
|  | 9 | o | o | o | x |
|  | 10 | o | o | o | o |
|  | 11 | o | o | o | o |
| Ref. example 1 |  | o | o | o | x |
| Ref. example 2 |  | o | o | o | x |
| Comparative example 1 |  | o | x | o | x |

Repetition of the simultaneous switching will cause a momentary flow of a large current through the circuit, and the current flow will result in heat occurrence. It is considered that the malfunction of the comparative example 1 and the embodiments in which flaky particles whose aspect ratio was less than 30 were dispersed was caused as will be described below. That is, in such test pieces, the heat is not well conducted in the interlayer dielectric layer, the heat is thus cumulated in the printed wiring board and the conductor circuit has a higher resistance, and no sufficient power is supplied to the transistor of the IC chip. The result of a simulation made based on the test results revealed that an IC chip in which at least FSB is up to 10 GHz and mounted on the interlayer dielectric layer according to the present invention does not malfunction.

Embodiment 13

This is an embodiment in which a thermosetting resin is used as an interlayer dielectric material.

(A) Preparing a Film for the Interlayer Dielectric Layer (1) Forty parts by weight of bisphenol A-type epoxy resin ("E-1001" by the YUKA SHELL), 60 parts by weight of phenol novolak type epoxy resin ("E-154" by the YUKA SHELL), 5 parts by weight of imidazole type curing agent ("2PHZ" by the SHIKOKU KASEI) and 75 parts by weight of butyl cellosolve acetate were mixed by agitation using three rollers to adjust the film precursor.

(2) The film precursor was applied, using a roll coater (by the THERMATRONICS TRADING), to a polymethyl pentene film (TPX) ("OPURAN X-88" by the MITSUI SEKIYU KAGAKU KOGYO; 180° C. in softening point) of 42 to 45 μm in thickness. Then, the film was cured by drying at 80° C. for 2 hours, 120° C. for 5 hours and then at 150° C. for 2 hours to form a 40 μm-thick resin film for the interlayer dielectric layer.

(B) Preparing a Resin Composition for Filling in a Through-Hole

A hundred parts by weight of bisphenol F-type epoxy monomer ("YL983U" by the YUKA SEHLL; 310 in molecular weight), 72 parts by weight of $SiO_2$ spherical particles ("CRS 1101-CE" by the ADTEC) coated with a silane coupling agent and having a mean size of 1.6 μm and a diameter of less than 15 μm (of largest particle) and 1.5 parts by weight of leveling agent ("PERENOL S4" by the SANNOPCO) were taken in a container and mixed by agitation to prepare a resin filler whose viscosity of 30 to 60 Pa·s at 23±1° C. It should be noted that 6.5 parts by weight of imidazole curing agent ("2E4MZ-CN" by the SHIKOKU KASEI) was used as the curing agent.

Figure 10A:
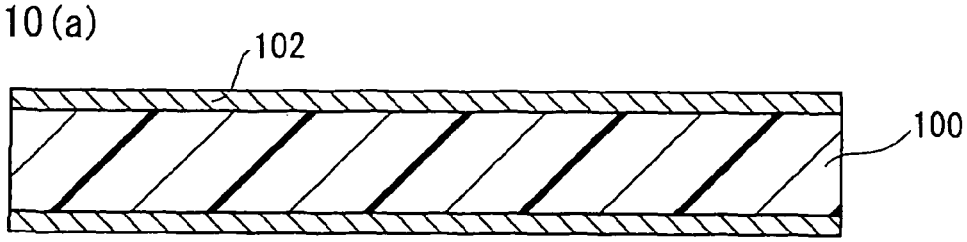
FIGS. 10(a) to 10(e) shows show some steps of the process of producing the multilayer printed wiring board as an embodiment 13 of the present invention.

(C) Producing a Multilayer Printed Wiring Board (1) A copper-clad laminate having 12 μm-thick copper foil 102 laminated on either side of a dielectric substrate 100 formed from a 0.8 mm-thick glass epoxy resin or BT (bismaleimide triazine) was used a starting material (see FIG. 10(a)).

(2) First, a hole was formed, by drilling, in the copper-clad laminate. The laminate was electroless-plated and then electro-plated. Then the laminate was etched in the form of a pattern to form a lower conductor circuit 104 and through-hole 106 on either side of the substrate 100.

Figure 10B:
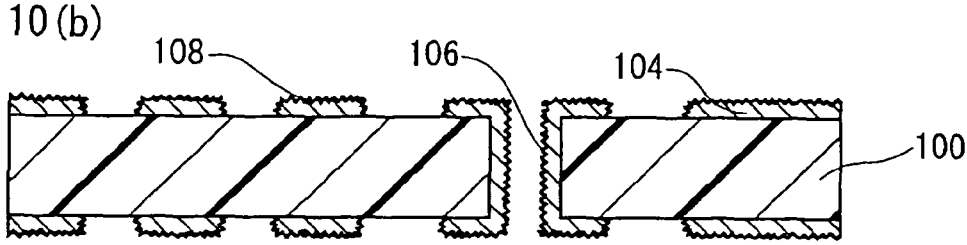

(3) The substrate 100 having the lower conductor layer 104 and through-hole 106 was blackened in a blackening bath (oxidizing bath) that was an aqueous solution containing NaOH (10 g/l), $NaClO_2$ (40 g/l) and $Na_3PO_4$ (6 g/l) and deoxidized in a reducing bath that was an aqueous solution containing NaOH (10 g/l) and $NaBH_4$ (6 μl) to form a roughed surface 108 on the surface of the lower conductor circuit 104 and through-hole 106 (see FIG. 10(b)).

Figure 10C:
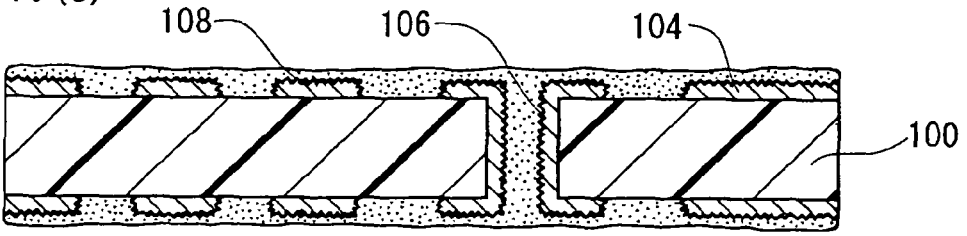
Figure 10D:
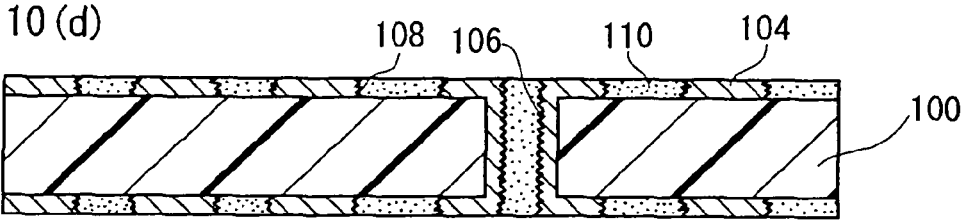

(4) Next, a squeegee was used to fill the through-hole filling resin composition prepared by the process (B) above in the space between the lower conductor circuit and through-hole (see FIG. 10(c)), and then the substrate 100 was dried at 100° C. for 20 min. The lower surface of the substrate was flattened by polishing until the surface of the lower conductor circuit 104 and land surface of the through-hole 106 were exposed (see FIG. 10(d)), and the substrate was heated at 100° C. for 1 hour and then at 150° C. for 1 hour to cure the filling resin component. A resin filler layer 110 and resin-filled through-hole 106 were formed. Thereafter, the surface of the conductor circuit 104 and land surface of the through-hole 106 were blackened (not shown).

Figure 10E:
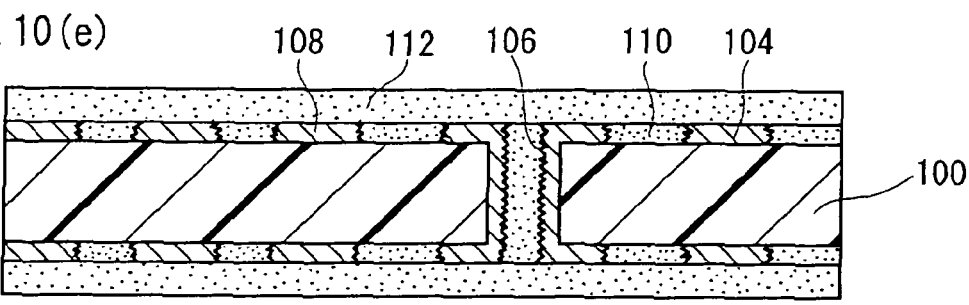

(5) Next, the resin film for interlayer dielectric material prepared by the process (A) above was attached to the substrate by vacuum-compression lamination under a pressure of 0.5 MPa while being heated up to a temperature of 50 to 150° C. to form a yet-to-cure interlayer dielectric layer 112 (see FIG. 10(e)).

Figure 11A:
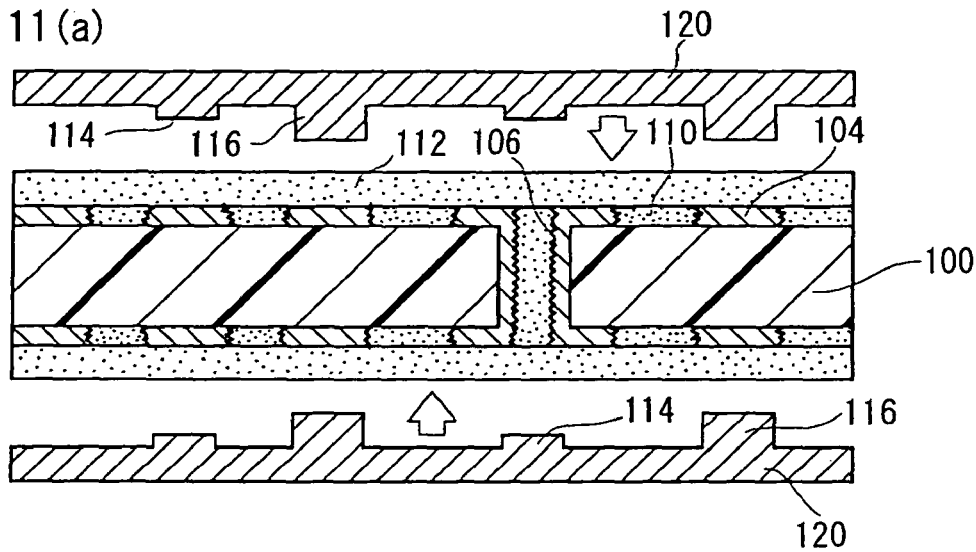
FIGS. 11(a) to 11(d) shows show some steps of the process of producing the multilayer printed wiring board as an embodiment 13 of the present invention.
Figure 11B:
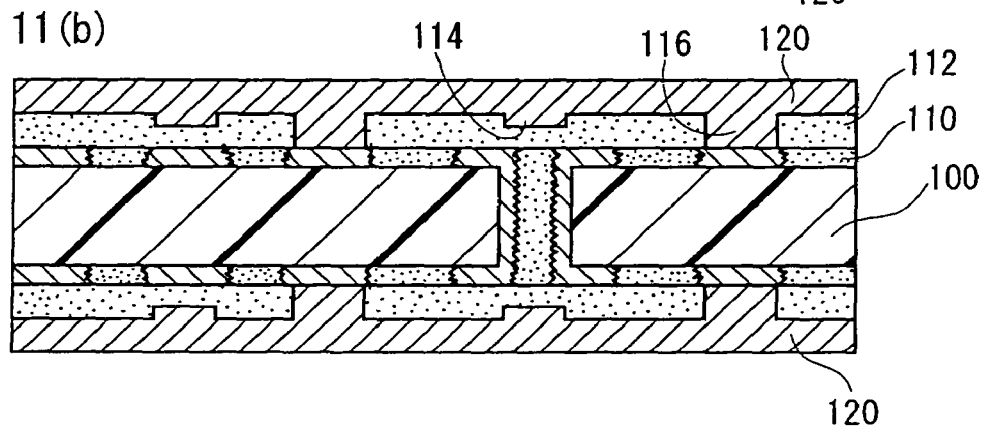
Figure 11C:
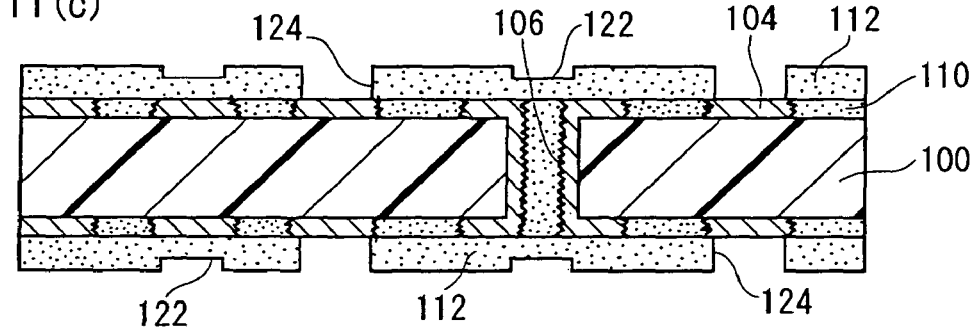

(6) Next, there was prepared a mold 120 having convexities 114 and 116 for forming a wiring pattern corresponding to an upper conductor circuit and a viahole, respectively (see FIG. 11(a)). With the viscosity of the resin film for interlayer insulation being measured in advance (by an instrument by the ALLES RHEOMETRIC SCIENTIFIC F. E.), the mold 120 was pressed in the yet-to-cure interlayer dielectric layer 112 at a temperature within a range of ±10° C. in relation to a temperature for the lowest melt viscosity of the layer 112 for 3 min under a pressure of 0.8 MPa (see FIG. 1(b)). Thereafter, the assembly was cooled, and when it attained a temperature 30° C. lower than the temperature for the lowest melt viscosity, the mold 120 was removed from the interlayer dielectric layer (see FIG. 11(c)).

The convexity 114 of the mold 120 (of nickel, for example) was formed to have a wiring pattern of 5 μm in minimum line width and 5 μm in minimum interline space (L/S=5/5 μm), and the convexity 114 was projected 20 μM. Also, the convexity 116 corresponding to the viahole-forming groove was formed to have a cylindrical shape whose diameter was 30 to 70 μm, and was projected 45 μm (corresponding to the depth of the viahole).

Note that to measure the insulation resistance, a convexity corresponding to a groove for forming a comb pattern of L/S=5/5 μm as a test pattern was formed on the mold 120.

(7) Next, the substrate 100 was heat-treated at 150° C. for 3 hours to completely cure the interlayer dielectric layer 112.

(8) The substrate 100 having transcribed thereto a wiring pattern-forming groove 122 and viahole-forming groove 124 was immersed in a swelling liquid, rinsed in water and immersed in a solution containing 60 g/l of permanganic acid at 80° C. for 10 min to rough the surface (including the inner walls of the grooves 112 and 124) of the interlayer dielectric layer 122 (the roughed surface is not illustrated).

(9) Next, the substrate 100 having been processed as above was immersed in a neutralizing solution (by the SIPLAY) and then rinsed in water. Further, palladium catalyst was applied to the surface of the interlayer dielectric layer 112 to attach the catalyst nucleus to the surface (including the inner walls of the grooves 122 and 124) of the interlayer dielectric layer 112 (not shown). More specifically, the catalyst was applied to the surface of the interlayer dielectric layer 112 by immersing the substrate 100 in a catalyst liquid containing palladium chloride ($PbCl_2$) and stannous chloride ($SnCl_2$) to separate out the palladium metal.

(10) Next, the substrate 100 was immersed in an electroless copper plating aqueous solution composed as will be specified below to form an electroless copper plating of 0.6 to 3.0 μm in thickness over the surface (including the inner walls of the grooves 122 and 124) of the interlayer dielectric layer 112.

Electroless Copper Plating Aqueous Solution:

| Electroless copper plating aqueous solution: | |
|---|---|
| Copper sulfate | 0.030 mol/l |
| EDTA | 0.200 mol/l |
| HCHO | 0.18 g/l |
| NaOH | 0.100 mol/l |
| α,α'-bipyridyl | 100 mg/l |
| Polyethylene glycol (PEG) | 0.10 g/l |
| Plating conditions: | |
| 34° C. for 40 min | |

Figure 11D:
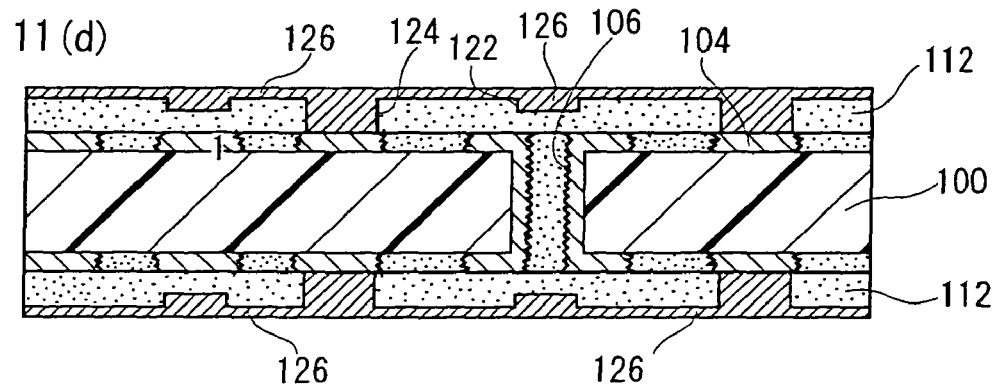

(11) Next, an electrolytic copper plating of 50 μm in thickness was formed on the electroless copper plating formed in step (10) above under the following conditions to completely fill the electrolytic copper in the transcribed grooves 122 and 124 and form a conductor layer 126 over the surface of the substrate 100 (see FIG. 11(d)):

Electroless Copper Plating Aqueous Solution:

| Electrolytic copper plating aqueous solution: | |
|---|---|
| Sulfuric acid | 2.24 mol/l |
| Copper sulfate | 0.26 mol/l |
| Additive | 19.5 ml/l ("CAPARACID GL" by the ATTEC Japan) |
| Electrolytic plating conditions: | |
| Current density | 3 A/dm² |
| Time | 75 min |
| Temperature | 22 ± 2° C. |

Figure 12A:
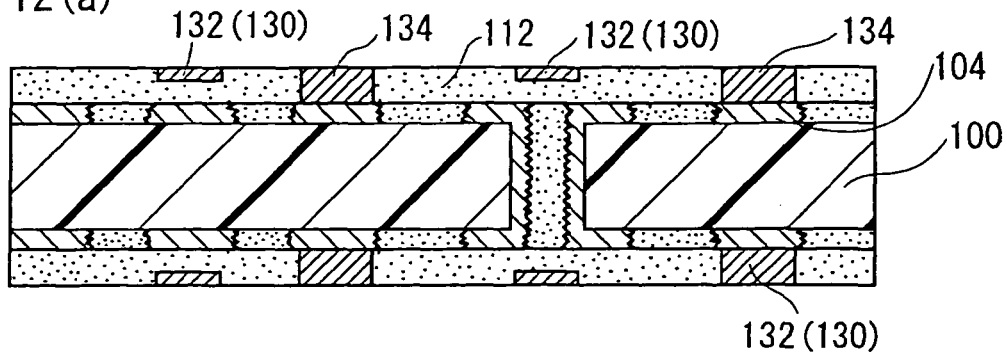
FIGS. 12(a) to 12(c) shows show some steps of the process of producing the multilayer printed wiring board as an embodiment 13 of the present invention.

(12) The substrate surface plated in step (11) above was flattened by polishing until the surface of the interlayer dielectric layer 112 was exposed and the upper ends of the upper conductor circuit 132 having the wiring pattern 130 and the viahole 134 were also exposed (see FIG. 12(a)).

(13) The substrate having the wiring pattern formed thereon was blackened in a blackening bath (oxidizing bath) that was an aqueous solution containing NaOH (10 g/l), NaClO$_3$ (40 g/l) and Na$_3$PO$_4$ (6 g/l) and deoxidized in a reducing bath that was an aqueous solution containing NaOH (10 g/l) and NaBH$_4$ (6 g/l) to form a roughed surface (not shown) on the surface of the upper conductor circuit 132.

Figure 12B:
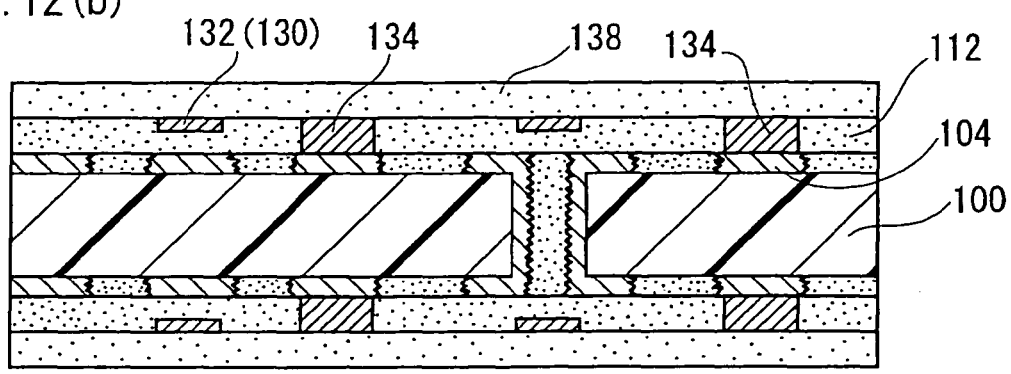

(14) Next, the resin film for interlayer dielectric material prepared by the process (A) above was attached to the substrate 100 prepared in step (13) above by vacuum-compression lamination under a pressure of 0.5 MPa while being heated up to a temperature of 50 to 150° C. to form a yet-to-cure interlayer dielectric layer 138 (see FIG. 12(b)).

Figure 12C:
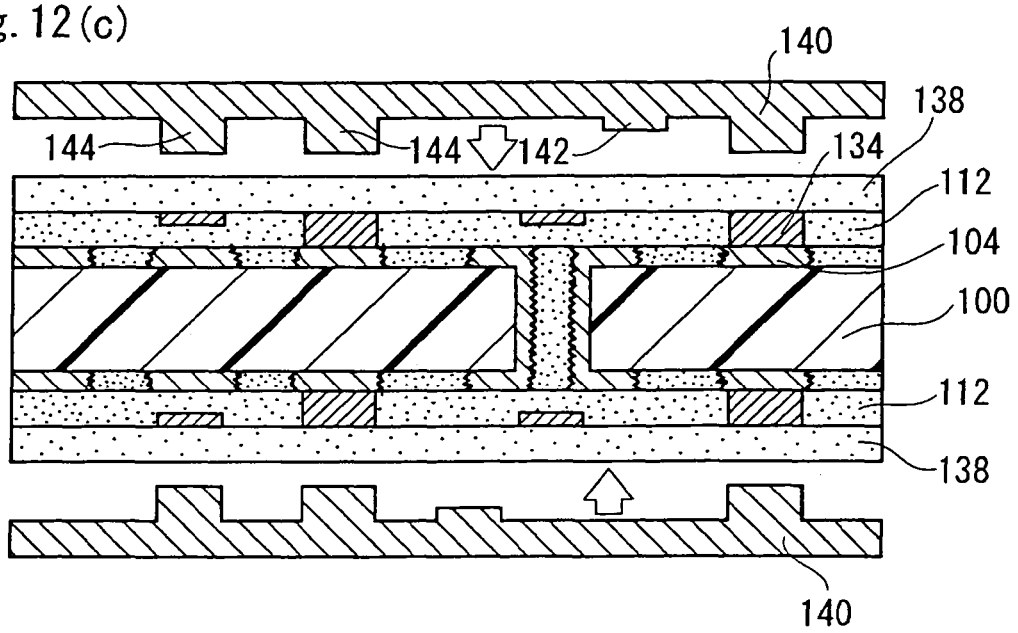
Figure 13A:
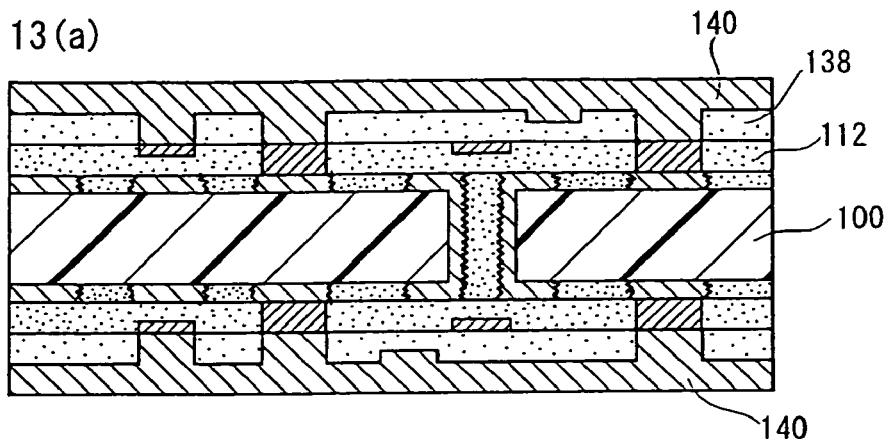
FIGS. 13(a) to 13(d) shows show some steps of the process of producing the multilayer printed wiring board as an embodiment 13 of the present invention.
Figure 13B:
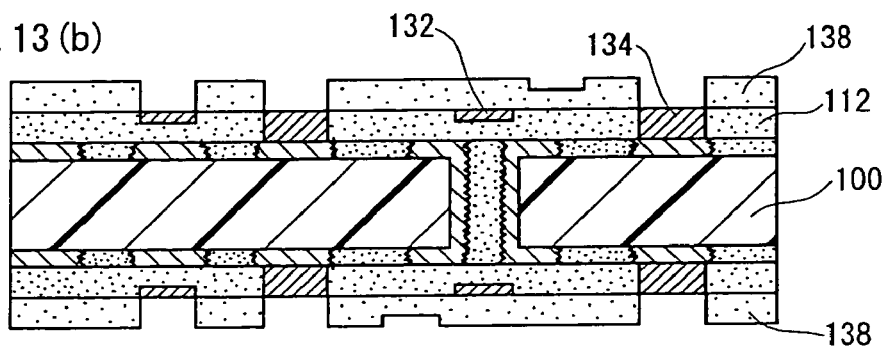

(15) Next, there was prepared another mold 140 having convexities 142 and 144 for forming a wiring pattern corresponding to an upper conductor circuit and a viahole, respectively (see FIG. 12(c)) as in step (6) above. The mold 140 was pressed in the interlayer dielectric layer 138 at a temperature with a range of ±10° C. in relation to a temperature for the lowest melt viscosity of the layer 138 for 3 min under a pressure of 0.8 MPa (see FIG. 13(a)). Thereafter, the assembly was cooled, and when it attained a temperature 30° C. lower than the temperature for the lowest melt viscosity, the mold 140 was removed from the interlayer dielectric layer 138. See FIG. 13(b).

Figure 13C:
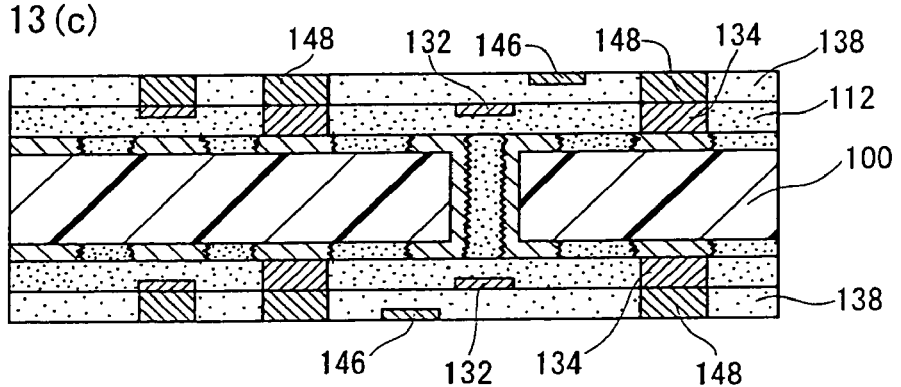

(16) The interlayer dielectric layer 138 having grooves formed thereon via transcription from the mold 140 was repeatedly subjected to steps (7) to (13) above to form a further upper conductor layer 146 and viahole 148 (see FIG. 13(c)).

Figure 13D:
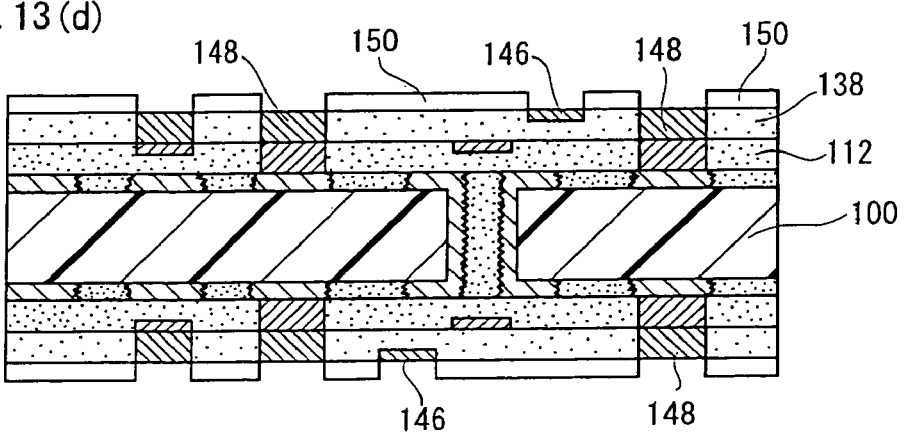

(17) A commercially available solder resist composition was applied to a thickness of 20 μm on either side of the substrate 100 prepared in step (16) above. Next, the substrate 100 was dried at 70° C. for 20 min and then at 70° C. for 30 min, a 5 mm-thick soda lime glass substrate having a circular pattern (mask pattern) of a solder resist opening depicted thereon with a chrome layer was placed on the substrate 100 with the chrome pattern-formed side thereof being in close contact on the solder resist layer, ultraviolet rays of 1000 mJ/cm$^2$ were irradiated to the substrate 100, and then the substrate 100 was developed in a DMTG solution. Further, the substrate 100 was heat-treated at 80° C. for 1 hour, 100° C. for 1 hour, 120° C. for 1 hour and then at 150° C. for 3 hours to form a pattern of a solder resist layer 150 (of 20 μm in thickness) open at the viahole and its land portion (180 μm in opening diameter) on the solder pad surface (see FIG. 13(d)).

(18) Next, the substrate having the solder resist layer 150 formed thereon was immersed in an electroless nickel plating liquid comprising 30 g/l of nickel chloride, 10 g/l of sodium hypophosphite and 10 g/l of sodium citrate and having a pH of 5 for 20 min to form a 5 μm-thick nickel plating (not shown) in the opening. Further, the substrate was immersed in an electroless gold plating liquid comprising 2 g/l of potassium gold cyanide, 75 g/l of ammonium chloride, 50 g/l of sodium citrate and 10 g/l of sodium hypophosphite at 93° C. for 23 sec to form a 0.03 μm-thick gold plating (not shown) on the nickel plating.

Figure 14:
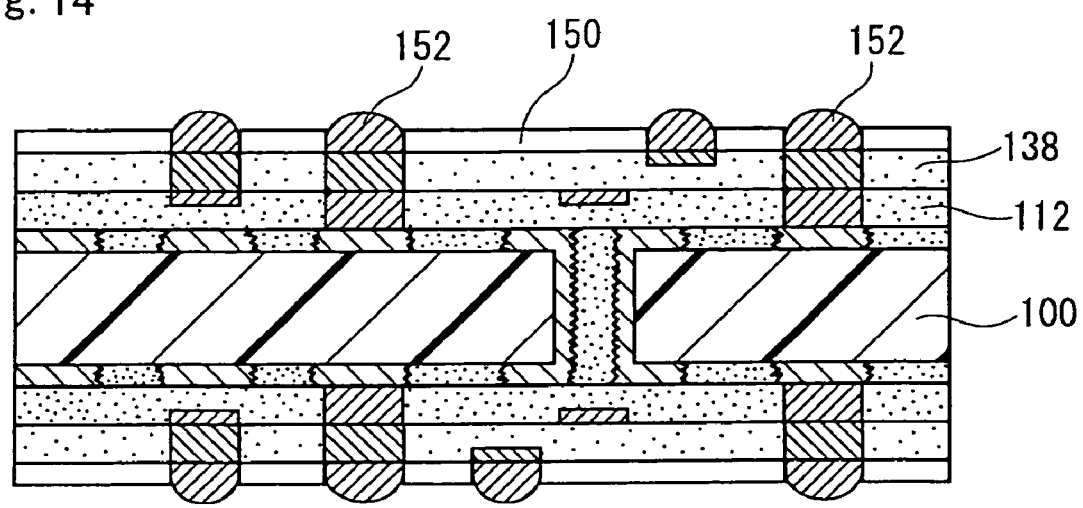
FIG. 14 shows the multilayer printed wiring board as the embodiment 13 of the present invention.

(19) Then, a solder paste was printed in the opening in the solder resist layer 150 and reflowed at 200° C. to form solder bumps 152. Thus, a multilayer printed wiring board having the solder bumps was produced (see FIG. 14). The multilayer printed wiring board is to have an IC chip mounted thereon on contact with the solder bumps 152.

The multilayer printed wiring board was produced through steps (1) to (19) above using the molds 120 and 140 having a convexity that resulted in the wiring pattern of L/S=5/5 μm. In addition, there were prepared different molds having formed thereon convexities for wiring patterns of L/S=2.5/2.5 μm, 7.5/7.5 μm, 10/10 μm, 12.5/12.5 μm and 15/15 μm, respectively, and these molds were used to produce multilayer printed wiring boards having wiring patterns, respectively, different in L/S from each other through steps (1) to (19) above.

However, the multilayer printed wiring board having the wiring pattern of L/S=2.5/2.5 μm was not subjected to the evaluation test because short-circuiting was found therein.

Note that in step (6) above, comb patterns of L/S=7.5/7.5 μm, 10/10 μm, 12.5/12.5 μm and 15/15 μm were formed on each of the molds 120 to measure the insulation resistance, and that in steps (6) and (15), convexities corresponding to grooves for forming successive patterns with a viahole interposed between them were formed on each of the molds 120 and 140 to measure the connection resistance.

As successive connection resistance evaluating patterns with a viahole interposed between them, a circuit was prepared each of which provided electrical connection between the front and rear sides of the multilayer printed wiring board through the viahole and through-hole, and five types of connection resistance evaluating patterns (sixth to tenth patterns) were prepared each of which was connected to the circuit via an IC and provided electrical connection between the front and rear sides of the wiring board through other viahole and through-hole. The sixth connection resistance evaluating pattern was formed from a closed circuit comprised of 100 viaholes of 30 μm in opening diameter, electrically connected to each other. Similarly, each of the seventh to tenth connection resistance evaluating patterns were formed each from a closed circuit comprised of 100 viaholes each of 40, 50, 60 and 70 μm in opening diameter.

Embodiment 14

This embodiment uses a resin mixture of thermosetting resin and thermoplastic resin as the interlayer dielectric material, and a multilayer printed wiring board was produced similarly to the embodiment 13 except that the film prepared through steps (1) and (2) by the process (A) below was used as the interlayer dielectric material.

(A) Preparing a Film for the Interlayer Dielectric Material (1) Sixty five parts by weight of cresol novolak type epoxy resin ("EOCN-104S" by the NIHON KAYAKU; 220 in epoxy equivalent and 5000 in molecular weight), 40 parts by weight of polyether sulfone (PES) ("VICTOREX" by the ICI; 17000 in molecular weight) and 5 parts by weight of imidazole curing agent ("2E4MZ-CN" by the SHIKOKU KASEI) were mixed together, and adjusted by agitation with a "HOMODISPER" agitator to a viscosity of 120 CPS while NMP (normal methylpyrrolidone) was being added, to thereby prepare a film precursor.

(2) The film precursor was applied, using a roll coater (by the THERMATRONICS TRADING), to a 50 μm-thick polymethyl pentene film (TPX) ("OPURAN X-88" by the MITSUI SEKIYU KAGAKU KOGYO; 180° C. in softening point). Then, the film was cured by drying at 80° C. for 2 hours, 120° C. for 5 hours and then at 150° C. for 2 hours to form a 40 μm-thick resin film for the interlayer dielectric layer.

Embodiment 15

In this embodiment, a photosensitized thermosetting resin was used as the interlayer dielectric material.

(A) Preparing a Film for the Interlayer Dielectric Material (1) Fifty six parts by weight of 25% acrylic compound of cresol novolak type epoxy resin (by the NIHON KAYAKU; 2500 in molecular weight) solved in DMDG (dimethyl glycol dimetyl ether), 2 parts by weight of imidazole curing agent ("2E4MZ-CN" by the SHIKOKU KASEI), 4 parts by weight of caprolactone denatured tris(acroxyethyl)isocyanuric acid ("ARONIX M315" by the TOA GOSEI) that is a photosensitive monomer, 2 parts by weight of photoinitiator ("IRGACURE 907" by the CHIBA GEIGEE) and 0.2 part by weight of photosensitizer ("DETX-S" by the NIHON KAYAKU) were mixed. Then, these components were mixed together while 30.0 parts by weight of NMP (normal methylpyrrolidone) was being added, adjusted by agitation with a "HOMODISPER" agitator to a viscosity of 7 Pa·s and then kneaded by three rolls to prepare a film precursor.

(2) The film precursor was applied, using a roll coater (by the THERMATRONICS TRADING), to a polymethyl pentene film (TPX) ("OPURAN X-88" by the MITSUI SEKIYU KAGAKU KOGYO; 180° C. in softening point) of 42 to 45 μm in thickness. Then, the film was cured by drying at 80° C. for 2 hours, 120° C. for 5 hours and then at 150° C. for 2 hours to form a 40 μm-thick resin film for the interlayer dielectric layer.

(B) Preparing a Resin Composition for Filling in a Through-Hole

A resin composition for filling in the through-hole was prepared similarly to that in the embodiment 13.

(C) Producing a Multilayer Printed Wiring Board (1) There were taken steps similar to those (1) to (6) above for the embodiment 13.

(2) Next, the interlayer dielectric layer 112 having formed thereon the wiring pattern-forming groove 122 and viahole-forming groove 124 was photo-cured by irradiating ultraviolet rays of 1500 mJ/cm$^2$ were irradiated to the entire surface of the layer 112, and then the layer 112 was heat-treated at 150° C. for 3 hours for complete drying.

(3) The substrate 112 prepared in step (2) above was immersed in a solution containing 60 g/l of permanganic acid at 70° C. for 10 min to rough the surface (including the side and bottom walls of the grooves) of the interlayer dielectric layer 112 (the roughed surface is not shown).

(4) There were taken steps similar to those (9) to (19) for the embodiment 13 to produce a multilayer printed wiring board.

Embodiment 16

In this embodiment, a mixture of thermosetting resin and flaky particles was used as an interlayer dielectric material. According to this embodiment, a multilayer printed wiring board was produced similarly to the embodiment 13 except that a film prepared through the following processes (A) to (C) was used as the interlayer dielectric material.

(A) Preparing a Kneaded Mixture Containing Flaky Particles

Fifteen grams of flaky particles ("ESPEN C" by the HOJUN; about 500 in aspect ratio when the particles are dispersed; about 0.5 μM in crystal size) was added to a mixed solvent containing 20 g of methyl ethyl ketone (will be referred to as "MEK" hereunder) and 80 g of xylene, and this mixture was kneaded using three rollers to prepare a kneaded mixture containing the flaky particles.

(B) Preparing a Solution Containing Epoxy Resin

Eighty five grams of solid epoxy resin ("EPICOAT 1007" by the Japan Epoxy Resin) was added to the mixed solvent containing 6.8 g of MEK and 27.2 g of xylene, and the resin and mixture were mixed together to prepare a solution containing the epoxy resin.

(C) Preparing a Resin Film for the Interlayer Dielectric Layer

The kneaded mixture containing the flaky particles, prepared in step (A) above, the solution containing the epoxy resin, prepared in step (B), dicyan diamide ("CG-1200" by the B.T.I. Japan; 3.3 g for 10 g of the solid epoxy resin) as curing agent and a curing catalyst ("CURESOL 2E4 HZ" by the SHIKOKU KASEI); 3.3 g for 100 g of the solid epoxy resin) were blended for the flaky particles to share 20% by weight of the cured interlayer dielectric layer and kneaded together using three rollers to provide an adhesive solution.

The adhesive solution was applied to a sheet of polyethylene terephthalate using a roll coater (by the THERMATRONICS), and then the sheet was dried by heating at 160° C. for 5 min to remove solvent from the sheet. Thus, a dielectric film of 40 μm in thickness was prepared.

A transmission electron microscope (×50,000 to ×100,000 in magnification) was used to observe the minimum crystal size of the flaky particles in the film. The microscopy showed that the minimum crystal size when the particles were dispersed was 0.1 μm. Thus, the aspect ratio of the flaky particle in this embodiment is 100 to 500.

Embodiment 17

In this embodiment, a thermosetting resin is used as the interlayer dielectric material and the step of transcribing the shape of a mold to the interlayer dielectric layer and step of hot-curing are effected successively, (A) Preparing a Film for the Interlayer Dielectric Material A resin film for the interlayer dielectric material was prepared similarly to that in the embodiment 13.

(B) Preparing a Resin Composition for Filling in a Through-Hole

A resin composition for filling in the through-hole was prepared similarly to that in the embodiment 13.

(C) Producing a Multilayer Printed Wiring Board (1) There were taken steps similar to those (1) to (5) for the embodiment 13.

(2) Next, there was prepared a mold 120 having convexities 114 and 116 for forming a wiring pattern corresponding to an upper conductor circuit and a viahole, respectively (see FIG. 11(a)). The mold 120 was pressed in the interlayer dielectric layer 112 at a temperature within a range of ±10° C. in relation to a temperature for the lowest melt viscosity of the layer 112 for 3 min under a pressure of 0.8 MPa (see FIG. 11(b)). Thereafter, the temperature of the assembly was elevated with the mold 120 being left pressed in the layer 112, and at a temperature 30° C. higher than the temperature for the lowest melt viscosity, the mold 120 was removed from the interlayer dielectric layer 112 (see FIG. 11(c)).

The mold 120 is similar shape to the shape of the mold in the embodiment 1, and has a convexity corresponding to the groove for the test pattern as in the embodiment 1.

(3) The resin film was processed through steps similar to those (7) to (14) for the embodiment 1.

(4) Next, there was also prepared another mold 140 having convexities 142 and 144 for forming a wiring pattern corresponding to an upper conductor circuit and a viahole, respectively (see FIG. 12(c)). The mold 140 was pressed in the interlayer dielectric layer 138 at a temperature of 110° C. with a range of ±10° C. in relation to a temperature for the lowest melt viscosity of the interlayer dielectric layer 138 for 3 min under a pressure of 0.8 MPa (see FIG. 13(a)). Thereafter, the temperature of the assembly was elevated with the mold 140 being left pressed in the layer 138, and at a temperature 30° C. higher than the temperature for the lowest melt viscosity, the mold 140 was removed from the interlayer dielectric layer 138 (see FIG. 13(b)).

The mold 140 is similar shape to the shape of the mold in the embodiment 1, and has a convexity corresponding to the groove for the test pattern as in the embodiment 1.

(5) There were taken steps similar to those (16) to (19) for the embodiment 13 to produce a multilayer printed wiring board.

Embodiment 18

In this embodiment, the interlayer dielectric material was a resin mixture of thermosetting resin and thermoplastic resin, having particles soluble in a roughing liquid mixed therein.

(A) Preparing a Film for the Interlayer Dielectric Layer (1) Sixty five parts by weight of cresol novolak type epoxy resin ("EOCN-104S" by the NIHON KAYAKU; 220 in epoxy equivalent and 5000 in molecular weight), 40 parts by weight of polyether sulfone (PES) ("VICTOREX" by the ICI; 17000 in molecular weight), 5 parts by weight of imidazole curing agent ("2E4MZ-CN" by the SHIKOKU KASEI) and 15 parts by weight of fine particles of epoxy resin ("TREPANOL" by the TORAY; 1.0 µm in mean size) were mixed together, and adjusted by agitation with a "HOMO-DISPER" agitator to a viscosity of 120 CPS while NMP (normal methylpyrrolidone) was being added, to thereby prepare a film precursor.

(2) The film precursor was applied, using a roll coater (by the THERMATRONICS TRADING), to a 50 µm-thick polymethyl pentene film (TPX) ("OPURAN X-88" by the MITSUI SEKIYU KAGAKU KOGYO; 180° C. in softening point). Then, the film was cured by drying at 80° C. for 2 hours, 120° C. for 5 hours and then at 150° C. for 2 hours to form a 40 µm-thick resin film for the interlayer dielectric layer.

(B) Preparing a Resin Composition for Filling in a Through-Hole

A resin composition for filling in the through-hole was prepared similarly to that in the embodiment 13.

(C) Producing a Multilayer Printed Wiring Board (1) There were taken steps similar to those (1) to (7) above for the embodiment 13.

(2) Next, the substrate 100 resulted from complete curing of the interlayer dielectric layer 112 was immersed in a solution containing 800 g/l of chromic acid at 80° C. for 10 min to rough the surface (including the inner walls of the grooves 122 and 124) of the interlayer dielectric layer 112 (the roughed surface is not illustrated).

(3) There were taken steps similar to those (9) to (19) for the embodiment 13 to produce a multilayer printed wiring board.

Embodiment 19

In this embodiment, the interlayer dielectric material was a resin mixture of thermosetting resin and thermoplastic resin, having particles soluble in a roughing liquid mixed therein.

(A) Preparing a Film for the Interlayer Dielectric Layer (1) There were fixed 40 parts by weight of bisphenol A-type epoxy resin ("E-1001" by the YUKA SHELL), 60 parts by weight of phenol novolak type epoxy resin ("E-154" by the YUKA SHELL), 5 parts by weight of imidazole type curing agent ("2PHZ" by the SHIKOKU KASEI), 20% by weight of swelling fluorinated mica particles ("MAE-100" by the COOP CHEMICAL; 0.2 µm in mean size; 0.003 µm in mean thickness) and 20 parts by weight of $SiO_2$ particles whose mean size was 1 µm. The mixture was mixed while 30.0 parts by weight of NMP (normal methylpyrrolidone) were being added, adjusted by agitation with a "HOMODISPER" agitator to a viscosity of 7 Pa·s, and then kneaded using three rollers to provide a film precursor.

(2) The film precursor was applied, using a roll coater (by the THERMATRONICS TRADING), to a 50 µm-thick polymethyl pentene film (TPX) ("OPURAN X-88" by the MITSUI SEKIYU KAGAKU KOGYO; 180° C. in softening point). Then, the film was cured by drying at 80° C. for 2 hours, 120° C. for 5 hours and then at 150° C. for 2 hours to form a 40 µm-thick resin film for the interlayer dielectric layer.

(B) Preparing a Resin Composition for Filling in a Through-Hole

A resin composition for filling in the through-hole was prepared similarly to that in the embodiment 13.

(C) Producing a Multilayer Printed Wiring Board (1) There were taken steps similar to those (1) to (7) for the embodiment 13.

(2) Next, the substrate 100 resulted from complete curing of the interlayer dielectric layer 112 was immersed in a solution containing 60 g/l of permanganic acid at 70° C. for 10 min to rough the surface (including the inner walls of the grooves 122 and 124) of the interlayer dielectric layer 112 (the roughed surface is not illustrated).

(3) There were taken steps similar to those (9) to (19) for the embodiment 13 to produce a multilayer printed wiring board.

Embodiment 20

The interlayer dielectric material used in this embodiment was a photo-curable thermosetting resin in which flaky particles were mixed. A multilayer printed wiring board was produced similarly to the embodiment 15 except that a film prepared through the following processes (A) to (C) was used to prepare the interlayer dielectric layer.

(A) Preparing a Kneaded Mixture Containing Flaky Particles

Fifteen grams of flaky particles ("ESPEN C" by the HOJUN; about 500 in aspect ratio when the particles are dispersed; about 0.5 µm in crystal size) was added to a mixed solvent containing 20 g of methyl ethyl ketone (will be referred to as "MEK" hereunder) and 80 g of xylene, and this mixture was kneaded using three rollers to prepare a kneaded mixture containing the flaky particles.

(B) Preparing a Solution Containing Epoxy Resin (1) Fifty six parts by weight of 25% acrylic compound of cresol novolak type epoxy resin (by the NIHON KAYAKU; 2500 in molecular weight) solved in DMDG (dimethyl glycol dimetyl ether), 2 parts by weight of imidazole curing agent ("2E4MZ-CN" by the SHIKOKU KASEI), 4 parts by weight of caprolactone denatured tris(acroxyethyl)isocyanuric acid ("ARONIX M315" by the TOA GOSEI) that is a photosensitive monomer, 2 parts by weight of photoinitiator ("IRGACURE 907" by the CHIBA GEIGIE) and 0.2 part by weight of photosensitizer ("DETX-S" by the NIHON KAYAKU) were mixed. Then, these components Was mixed together while 30.0 parts by weight of NMP (normal methylpyrrolidone) was being added, and adjusted by agitation with a "HOMODISPER" agitator to a viscosity of 7 Pa·s.

(C) Preparing a Resin Film for the Interlayer Dielectric Layer

The kneaded mixture containing the flaky particles, prepared in process (A) above, the solution containing the epoxy resin, prepared in process (B), dicyan diamide ("CG-1200" by the BTI Japan; 3.3 g for 100 g of the solid epoxy resin) as curing agent and a curing catalyst ("CURESOL 2E4 HZ" by the SHIKOKU KASEI); 3.3 g for 10 g of the solid epoxy resin) were blended for the flaky particles to share 20% by weight of the cured interlayer dielectric layer and then kneaded using three rollers to provide an adhesive solution.

The adhesive solution was applied to a sheet of polyethylene terephthalate using a roll coater (by the THERMATRONICS), and then the sheet was dried by heating at 160° C. for 5 min to remove solvent from the sheet. Thus, a dielectric film of 40 µm in thickness was prepared.

Embodiment 21

In this embodiment, a mixture of thermosetting resin and flaky particles was used as the interlayer dielectric material. A multilayer printed wiring board was produced similarly to the embodiment 16 except that the components were blended for the flaky particles to share 3% by weight of the cured interlayer dielectric layer (20% by weight in process (C) for the embodiment 16).

Embodiment 22

In this embodiment, a mixture of thermosetting resin and flaky particles was used as the interlayer dielectric material as in the embodiment 21. A multilayer printed wiring board was produced similarly to the embodiment 16 except that the components were blended for the flaky particles to share 5% by weight of the cured interlayer dielectric layer (20% by weight in process (C) for the embodiment 16).

Embodiment 23

In this embodiment, a mixture of thermosetting resin and flaky particles was used as the interlayer dielectric material as in the embodiment 21. A multilayer printed wiring board was produced similarly to the embodiment 16 except that the components were blended for the flaky particles to share 35% by weight of the cured interlayer dielectric layer (20% by weight in process (C) for the embodiment 16).

Embodiment 24

In this embodiment, a mixture of thermosetting resin and flaky particles was used as the interlayer dielectric material as in the embodiment 21. A multilayer printed wiring board was produced similarly to the embodiment 16 except that the components were blended for the flaky particles to share 50% by weight of the cured interlayer dielectric layer (20% by weight in process (C) for the embodiment 16).

Embodiment 25

In this embodiment, a mixture of thermosetting resin and flaky particles was used as the interlayer dielectric material as in the embodiment 21. A multilayer printed wiring board was produced similarly to the embodiment 16 except that the components were blended for the flaky particles to share 55% by weight of the cured interlayer dielectric layer (20% by weight in process (C) for the embodiment 16).

Embodiment 26

In this embodiment, the interlayer dielectric material was a mixture of thermosetting resin and particles (5 parts by weight of $SiO_2$ of 1 µm in mean size) soluble in a roughing liquid. A multilayer printed wiring board was produced nearly similarly to the embodiment 18 except that the film for the interlayer dielectric layer as in process (A) for the embodiment 18 was prepared as will be described below and hydrofluoric acid was used as the roughing liquid.

(A) Preparing a Film for the Interlayer Dielectric Layer (1) Forty parts by weight of bisphenol A-type epoxy resin ("E-1001" by the YUKA SHELL), 60 parts by weight of phenol novolak type epoxy resin ("E-154" by the YUKA SHELL), 5 parts by weight of imidazole type curing agent ("2PHZ" by the SHIKOKU KASEI) and 5 parts by weight of $SiO_2$ particles of 1 µm in mean size were mixed together. The components were mixed while 30.0 parts by weight of NMP (normal methylpyrrolidone) was being added, adjusted by agitation with a "HOMODISPER" agitator to a viscosity of 7 Pa·s, and kneaded with three rolls to prepare a film precursor.

(2) The film precursor was applied, using a roll coater (by the THERMATRONICS TRADING), to a polymethyl pentene film (TPX) ("OPURAN X-88" by the MITSUI SEKIYU KAGAKU KOGYO; 180° C. in softening point) of 42 to 45 µm in thickness. Then, the film was cured by drying at 80° C. for 2 hours, 120° C. for 5 hours and then at 150° C. for 2 hours to form a 40 µm-thick resin film for the interlayer dielectric layer.

Embodiment 27

In this embodiment, the interlayer dielectric material was a mixture of thermosetting resin and particles (10 parts by weight of $SiO_2$ of 1 µm in mean size) soluble in a roughing liquid. A multilayer printed wiring board was produced nearly similarly to the embodiment 26 except that the film for the interlayer dielectric layer as in process (A) for the embodiment 26 was prepared as will be described below and hydrofluoric acid was used as the roughing liquid.

(A) Preparing a Film for the Interlayer Dielectric Layer (1) Forty parts by weight of bisphenol A-type epoxy resin ("E-1001" by the YUKA SHELL), 60 parts by weight of phenol novolak type epoxy resin ("E-154" by the YUKA SHELL), 5 parts by weight of imidazole type curing agent ("2PHZ" by the SHIKOKU KASEI) and 10 parts by weight of $SiO_2$ particles of 1 µm in mean size were mixed together. The components were mixed while 30.0 parts by weight of NMP (normal methylpyrrolidone) was being added, adjusted by agitation with a "HOMODISPER" agitator to a viscosity of 7 Pa·s, and kneaded with three rolls to prepare a film precursor.

(2) The film precursor was applied, using a roll coater (by the THERMATRONICS TRADING), to a polymethyl pentene film (TPX) ("OPURAN X-88" by the MITSUI SEKIYU KAGAKU KOGYO; 180° C. in softening point) of 42 to 45 µm in thickness. Then, the film was cured by drying at 80° C. for 2 hours, 120° C. for 5 hours and then at 150° C. for 2 hours to form a 40 µm-thick resin film for the interlayer dielectric layer.

Embodiment 28

In this embodiment, the interlayer dielectric material was a mixture of thermosetting resin and particles (70 parts by weight of $SiO_2$ of 1 µm in mean size) soluble in a roughing liquid. A multilayer printed wiring board was produced nearly similarly to the embodiment 26 except that the film for the interlayer dielectric layer as in process (A) for the embodiment 26 was prepared as will be described below and hydrofluoric acid was used as the roughing liquid.

(A) Preparing a Film for the Interlayer Dielectric Layer (1) Forty parts by weight of bisphenol A-type epoxy resin ("E-1001" by the YUKA SHELL), 60 parts by weight of phenol novolak type epoxy resin ("E-154" by the YUKA SHELL), 5 parts by weight of imidazole type curing agent ("2PHZ" by the SHIKOKU KASEI) and 70 parts by weight of $SiO_2$ particles of 1 μm in mean size were mixed together. The components were mixed while 30.0 parts by weight of NMP (normal methylpyrrolidone) was being added, adjusted by agitation with a "HOMODISPER" agitator to a viscosity of 7 Pa·s, and kneaded with three rolls to prepare a film precursor.

(2) The film precursor was applied, using a roll coater (by the THERMATRONICS TRADING), to a polymethyl pentene film (TPX) ("OPURAN X-88" by the MITSUI SEKIYU KAGAKU KOGYO; 180° C. in softening point) of 42 to 45 μm in thickness. Then, the film was cured by drying at 80° C. for 2 hours, 120° C. for 5 hours and then at 150° C. for 2 hours to form a 40 μm-thick resin film for the interlayer dielectric layer.

Embodiment 29

In this embodiment, the interlayer dielectric material was a mixture of thermosetting resin and particles (100 parts by weight of $SiO_2$ of 1 μm in mean size) soluble in a roughing liquid. A multilayer printed wiring board was produced nearly similarly to the embodiment 26 except that the film for the interlayer dielectric layer as in process (A) for the embodiment 26 was prepared as will be described below and hydrofluoric acid was used as the roughing liquid.

(A) Preparing a Film for the Interlayer Dielectric Layer (1) Forty parts by weight of bisphenol A-type epoxy resin ("E-1001" by the YUKA SHELL), 60 parts by weight of phenol novolak type epoxy resin ("E-154" by the YUKA SHELL), 5 parts by weight of imidazole type curing agent ("2PHZ" by the SHIKOKU KASEI) and 100 parts by weight of $SiO_2$ particles of 1 μm in mean size were mixed together. The components were mixed while 30.0 parts by weight of NMP (normal methylpyrrolidone) was being added, adjusted by agitation with a "HOMODISPER" agitator to a viscosity of 7 Pa·s, and kneaded with three rolls to prepare a film precursor.

(2) The film precursor was applied, using a roll coater (by the THERMATRONICS TRADING), to a polymethyl pentene film (TPX) ("OPURAN X-88" by the MITSUI SEKIYU KAGAKU KOGYO; 180° C. in softening point) of 42 to 45 μm in thickness. Then, the film was cured by drying at 80° C. for 2 hours, 120° C. for 5 hours and then at 150° C. for 2 hours to form a 40 μm-thick resin film for the interlayer dielectric layer.

Embodiment 30

In this embodiment, the interlayer dielectric material was a mixture of thermosetting resin and particles (3 parts by weight of $SiO_2$ of 1 μm in mean size) soluble in a roughing liquid. A multilayer printed wiring board was produced nearly similarly to the embodiment 26 except that the film for the interlayer dielectric layer as in process (A) for the embodiment 26 was prepared as will be described below and hydrofluoric acid was used as the roughing liquid.

(A) Preparing a Film for the Interlayer Dielectric Layer (1) Forty parts by weight of bisphenol A-type epoxy resin ("E-1001" by the YUKA SHELL), 60 parts by weight of phenol novolak type epoxy resin ("E-154" by the YUKA SHELL), 5 parts by weight of imidazole type curing agent ("2PHZ" by the SHIKOKU KASEI) and 3 parts by weight of $SiO_2$ particles of 1 μm in mean size were mixed together. The components were mixed while 30.0 parts by weight of NMP (normal methylpyrrolidone) was being added, adjusted by agitation with a "HOMODISPER" agitator to a viscosity of 7 Pa·s, and kneaded with three rolls to prepare a film precursor.

(2) The film precursor was applied, using a roll coater (by the THERMATRONICS TRADING), to a polymethyl pentene film (TPX) ("OPURAN X-88" by the MITSUI SEKIYU KAGAKU KOGYO; 180° C. in softening point) of 42 to 45 μm in thickness. Then, the film was cured by drying at 80° C. for 2 hours, 120° C. for 5 hours and then at 150° C. for 2 hours to form a 40 μm-thick resin film for the interlayer dielectric layer.

Embodiment 31

In this embodiment, the interlayer dielectric material was a mixture of thermosetting resin and particles (105 parts by weight of $SiO_2$ of 1 μm in mean size) soluble in a roughing liquid. A multilayer printed wiring board was produced nearly similarly to the embodiment 26 except that the film for the interlayer dielectric layer as in process (A) for the embodiment 26 was prepared as will be described below and hydrofluoric acid was used as the roughing liquid.

(A) Preparing a Film for the Interlayer Dielectric Layer (1) Forty parts by weight of bisphenol A-type epoxy resin ("E-1001" by the YUKA SHELL), 60 parts by weight of phenol novolak type epoxy resin ("E-154" by the YUKA SHELL), 5 parts by weight of imidazole type curing agent ("2PHZ" by the SHIKOKU KASEI) and 105 parts by weight of $SiO_2$ particles of 1 μm in mean size were mixed together. The components were mixed while 30.0 parts by weight of NMP (normal methylpyrrolidone) was being added, adjusted by agitation with a "HOMODISPER" agitator to a viscosity of 7 Pa·s, and kneaded with three rolls to prepare a film precursor.

(2) The film precursor was applied, using a roll coater (by the THERMATRONICS TRADING), to a polymethyl pentene film (TPX) ("OPURAN X-88" by the MITSUI SEKIYU KAGAKU KOGYO; 180° C. in softening point) of 42 to 45 μm in thickness. Then, the film was cured by drying at 80° C. for 2 hours, 120° C. for 5 hours and then at 150° C. for 2 hours to form a 40 μm-thick resin film for the interlayer dielectric layer.

Embodiment 32

A multilayer printed wiring board was produced nearly similarly to the embodiment 13 except that the interlayer dielectric layer was prepared adopting the processes (A) "Preparing a kneaded mixture containing flaky particles", (B) "Preparing a solution containing epoxy resin" and (C) "Preparing a resin film for the interlayer dielectric layer" for the embodiment 1.

Embodiment 33

A multilayer printed wiring board was produced nearly similarly to the embodiment 13 except that the dielectric film as in the embodiment 5 was prepared using the micro mica MK-100F as in the embodiment 9 as the flaky particles.

Embodiment 34

A multilayer printed wiring board was produced nearly similarly to the embodiment 13 except that the film for the interlayer dielectric layer was prepared using ORGANITE D as in the embodiment 10 as the flaky particles and adopting the processes (A) "Preparing a kneaded mixture containing flaky particles", (B) "Preparing a solution containing epoxy resin" and (C) "Preparing a resin film for the interlayer dielectric layer" for the embodiment 1.

Embodiment 35

A multilayer printed wiring board was produced nearly similarly to the embodiment 13 except that the resin film prepared as in the embodiment 11 was used as the interlayer dielectric layer.

Embodiment 36

A multilayer printed wiring board was produced nearly similarly to the embodiment 13 except that the resin film prepared as in the embodiment 12 was used as the interlayer dielectric layer.

Embodiment 37

A multilayer printed wiring board was produced nearly similarly to the embodiment 32 except that the convexities of the mold, corresponding to the signal circuits, were modified and all the signal circuits were formed to have L/S=5/5 μm.

Embodiment 38

A multilayer printed wiring board was produced nearly similarly to the embodiment 32 except that the convexities of the mold, corresponding to the signal circuits, were modified and all the signal circuits were formed to have L/S=12.5/12.5 μm.

Comparative Example 2

This comparative example uses PMMA (polymethyl methacrylate) that is a thermoplastic resin as the interlayer dielectric layer, and was produced through processes nearly similar to those for the embodiment 13 which are shown in FIGS. 10 to 14.

(A) Preparing a Film for the Interlayer Dielectric Layer

PMMA was applied to a polymethyl pentene film (TPX) ("OPURAN X-88" by the MITSUI SEKIYU KAGAKU KOGYO; 180° C. in softening point) of 40 to 45 μm in thickness. Then, the film was cured by drying to provide a 40 μm-thick resin film for the interlayer dielectric layer.

(B) Preparing a Resin Composition for Filling in a Through-Hole

The resin composition for filling in the through-hole as in the embodiment 13 was prepared.

(C) Producing a Multilayer Printed Wiring Board (1) Steps similar to those (1) to (4) for the embodiment 13 were adopted.

(2) The resin composition was filled in the space between the lower conductor circuits and through-hole, the PMMA film prepared in process (A) above was attached to the flattened substrate by vacuum-compression lamination at 160° C. under a pressure of 1 MPa to form an interlayer dielectric layer 112 (see FIG. 10(e)).

(3) Next, a mold 120 having convexities 114 and 116 for forming a wiring pattern corresponding to an upper conductor circuit and a viahole, respectively (see FIG. 11(a)) was prepared as in the embodiment 13. The mold 120 was pressed in the interlayer dielectric layer 112 of PMMA at 210° C. for 3 min under a pressure of 14.2 MPa (see FIG. 11(b)). Thereafter, the assembly was cooled until it attained a temperature of 150° C. Then, the mold 120 was removed from the interlayer dielectric layer 112 (see FIG. 11(c)).

The shaped of the mold 120 was similar to that in the embodiment 13, and the mold 120 has formed thereon the convexity for the test pattern groove as in the embodiment 13.

(4) Steps similar to those (8) to (13) for the embodiment 13 were adopted.

(5) Next, the resin film for interlayer dielectric material prepared by the process (A) above was attached to the substrate 100 prepared in step (4) above by vacuum-compression lamination at 160° C. under a pressure of 1 MPa to form an interlayer dielectric layer 138 (see FIG. 12(b)).

(6) Next, another mold 140 having convexities for forming a wiring pattern corresponding to an upper conductor circuit and a viahole, respectively, was prepared as in step (3) above (see FIG. 12(c)). The mold 140 was pressed in the interlayer dielectric layer 138 at 210° C. for 3 min under a pressure of 14.2 MPa (see FIG. 13(a)). Thereafter, the assembly was cooled, and when it attained a temperature 150° C., the mold 140 was removed from the PMMA-made interlayer dielectric layer 138. See FIG. 13(b).

Note that to measure the connection resistance, there were formed also on the mold convexities corresponding to grooves for forming successive patterns with a viahole interposed between them.

Similar steps to those, (16) to (19) for the embodiment 13 were adopted to produce a multilayer printed wiring board.

Reference Example 3

A printed wiring board was produced similarly to the embodiment 5 except that for preparation of the film for the interlayer dielectric layer, "POLYFIL DL" by the SANYOH BOEKI (7 to 10 in aspect ratio) was used as the flaky particles.

Reference Example 4

A printed wiring board was produced similarly to the embodiment 13 except that the resin film for the interlayer dielectric layer was prepared using "SOMASHIF MPE" by the COOP CHEMICAL (swelling particles of 5,000 to 7,000 in aspect ratio and 5 to 7 μm in mean size) as the flaky particles as the flaky particles and adopting the processes (A) "Preparing a kneaded mixture containing flaky particles", (B) "Preparing a solution containing epoxy resin" and (C) "Preparing a resin film for the interlayer dielectric layer" for the embodiment 1.

Comparative Example 3

A printed wiring board was produced similarly to the embodiment 13 except that the dielectric film was prepared using spherical silica particles ("SO-E6" by the ADMATECS), not any flaky particles, and as in the embodiment 5.

Comparative Example 4

A multilayer printed wiring board was produced nearly similarly to the comparative example 3 except that the convexities of the mold, corresponding to the signal circuits, were modified and all the signal circuits were formed to have L/S=5/5 μm.

Comparative Example 5

A multilayer printed wiring board was produced nearly similarly to the comparative example 3 except that the convexities of the mold, corresponding to the signal circuits, were modified and all the signal circuits were formed to have L/S=12.5/12.5 μm.

The multilayer printed wiring boards produced as in the aforementioned embodiments 13 to 38, reference examples 3 and 4 and comparative examples 2 to 5 were tested to evaluate their electrical properties such as the insulation resistance, connection resistance, finished precision of the wiring pattern, IC malfunction, etc. Prior to the evaluation, the mixture of thermosetting resin and flaky particles, used as the interlayer dielectric material, was tested for comparison of its viscosity with that of the PMMA used in the comparative example 2 as will be described below:

Temperature Dependency:

(1) First, a piece of 30 mm in diameter was cut from the resin film for the interlayer dielectric layer (mixture of epoxy resin and flaky particles) prepared in the process (C) for the embodiment 16, and taken as a viscosity measuring sample. Using an instrument (by the ALLES RHEOMETRIC SCIENTIFIC F.E.) The resin viscosity of the sample was measured while the sample temperature was being elevated at a rate of 4° C./min.

(2) Next, the PMMA used in the comparative example 2 was applied to a 50 μm-thick film of a polymethyl pentene film (TPX) ("OPURAN X-88" by the MITSUI SEKIYU KAGAKU KOGYO; 180° C. in softening point), and the film was cured by drying to form a 40 μm-thick resin film for the interlayer dielectric layer.

(3) A piece of 30 mm in diameter was cut from the resin film for the interlayer dielectric layer, formed in step (2) above, and taken as a viscosity measuring sample. Using an instrument (by the ALLES RHEOMETRIC SCIENTIFIC F.E.) The resin viscosity of the sample was measured while the sample temperature was being elevated at a rate of 4° C./min. The test results are shown in FIG. 15.

Figure 15:
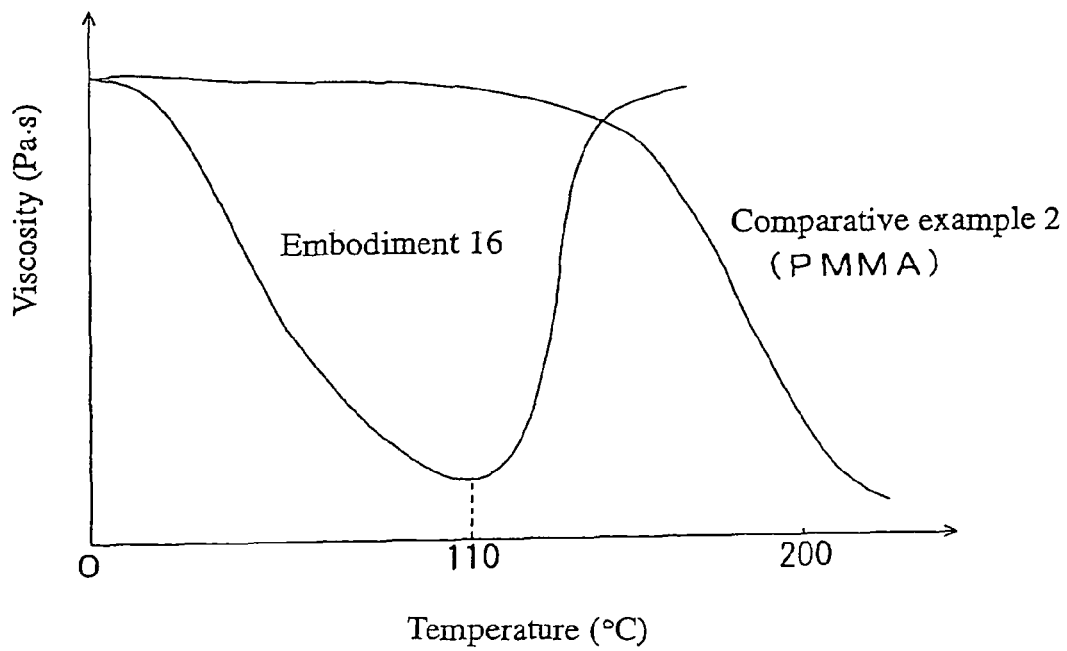
FIG. 15 shows the temperature dependency of the viscosity of each of a thermosetting resin having flaky particles mixed therein and a thermoplastic resin (PMMA).

As seen from FIG. 15, the thermoplastic resin used in the comparative example is only softened when heated but the resin used in the embodiment 16 is completely cured when heated at a temperature over its softening point. Therefore, it was confirmed that the resin like the one used in the embodiment 16 will not be softened even when heated during multilayering and can thus be multilayered.

Pressure Dependency:

(1) First, a piece of 30 mm in diameter was cut from the resin film for the interlayer dielectric layer prepared in the process (C) for the embodiment 16, and taken as a viscosity measuring sample. Variation of the resin viscosity was measured with the pressure applied to the sample being changed.

(2) A piece of 30 mm in diameter was cut from the resin film for the interlayer dielectric layer, prepared in the process (A) for the embodiment 13, and taken as a viscosity measuring sample. Variation of the resin viscosity was measured with the pressure applied to the sample being changed.

Figure 16:
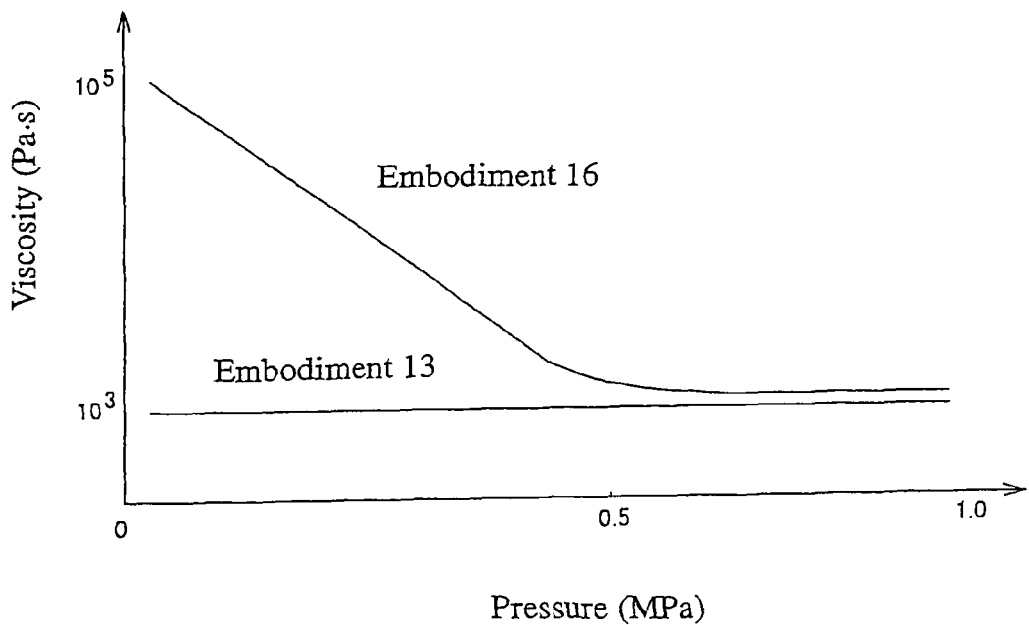
FIG. 16 shows the pressure dependency of the viscosity of each of a thermosetting resin having flaky particles mixed therein and the thermosetting resin itself.

The test results are shown in FIG. 16.

As seen from FIG. 16, mixing of the flaky particles in the resin will lead to a higher viscosity of the resin when no external force is applied, while leading to a lower viscosity of the resin when an external force is applied, which means that the mold can be pressed into the resin layer under a lower pressure. Namely, it was confirmed that the mixture of thermosetting resin and flaky particles was suitable for use in the imprint method.

Next, the multilayer printed wiring boards produced as in the aforementioned embodiments 13 to 31 and comparative example 2 were tested to check the insulation resistance of the comb pattern formed on the interlayer dielectric layer of a thermosetting resin by transcription from a mold, connection resistance of the wiring pattern including the viahole and finished precision of the wiring pattern. The overall evaluation of the test results are shown in Table 5. In the "Insulation resistance" and "Connection resistance" columns of Table 5, "○" indicates insulation resistance and connection resistance better than a target value, "x" indicates insulation resistance and connection resistance inferior to the target value. Also, in the "Finished precision" column, "○" indicates such a precision that the deviation from the dimensions of the convexity on the mold is less than 2 μm and "x" indicates other results.

TABLE 5

| | | Base resin | Additive resin | Photo-curing component added | Photo-curing | Flaky particles | Roughed surface forming particles | Resin temperature At press-in* | At removal* | Insulation resistance | Connection resistance | Finished precision |
|---|---|---|---|---|---|---|---|---|---|---|---|---|
| Embodiments | 13 | Thermosetting resin | No | No | No | No | No | T1 | T2 | ○ | ○ | ○ |
| | 14 | " | Thermoplastic resin | No | No | No | No | T1 | T2 | ○ | ○ | ○ |
| | 15 | " | No | Yes | Yes | No | No | T1 | T2 | ○ | ○ | ○ |
| | 16 | " | No | No | No | 20 wt % | No | T1 | T2 | ○ | ○ | ○ |
| | 17 | " | No | No | No | No | No | T1 | T2 | ○ | ○ | ○ |
| | 18 | " | Thermoplastic resin | No | No | No | 15 parts by weight | T1 | T2 | ○ | ○ | ○ |
| | 19 | " | No | No | No | 20 wt % | 20 parts by weight | T1 | T2 | ○ | ○ | ○ |
| | 20 | " | No | Yes | Yes | 20 wt % | No | T1 | T2 | ○ | ○ | ○ |
| | 21 | " | No | No | No | 3 wt % | No | T1 | T2 | ○ | ○ | ○ |
| | 22 | " | No | No | No | 5 wt % | No | T1 | T2 | ○ | ○ | ○ |
| | 23 | " | No | No | No | 35 wt % | No | T1 | T2 | ○ | ○ | ○ |
| | 24 | " | No | No | No | 50 wt % | No | T1 | T2 | ○ | ○ | ○ |

TABLE 5-continued

|  | Base resin | Additive resin | Photo-curing component added | Photo-curing | Flaky particles | Roughed surface forming particles | Resin temperature At press-in* | Resin temperature At removal* | Insulation resistance | Connection resistance | Finished precision |
|---|---|---|---|---|---|---|---|---|---|---|---|
| 25 | " | No | No | No | 55 wt % | No | T1 | T2 | ○ | ○ | ○ |
| 26 | " | No | No | No | No | 5 parts by weight | T1 | T2 | ○ | ○ | — |
| 27 | " | No | No | No | No | 10 parts by weight | T1 | T2 | ○ | ○ | — |
| 28 | " | No | No | No | No | 70 parts by weight | T1 | T2 | ○ | ○ | — |
| 29 | " | No | No | No | No | 100 parts by weight | T1 | T2 | ○ | ○ | — |
| 30 | " | No | No | No | No | 3 parts by weight | T1 | T2 | ○ | ○ | — |
| 31 | " | No | No | No | No | 105 parts by weight | T1 | T2 | ○ | ○ | — |
| Comparative example 2 | Thermoplastic resin | No | No | No | No | No | 210° C. | 150° C. | x | x | x |

NOTE:
*T1: Temperature for lowest melt viscosity of resin ±10° C.
T2: Temperature for lowest melt viscosity of resin −30° C.
T3: Temperature for lowest melt viscosity of resin +30° C.

As seen from Table 5, the multilayer printed wiring boards according to the present invention in which the wiring pattern is formed on the interlayer dielectric layer of the thermosetting resin by transcription from the mold are confirmed to be considerably improved in all of insulation resistance, connection resistance and finished precision of the wiring pattern as compared with the multilayer printed wiring board formed by the conventional patterning method in which a wiring pattern is formed on a dielectric resin layer of only a thermoplastic resin by transcription from a mold.

The tests to check the insulation resistance, connection resistance and finished precision of the wiring pattern and results of the tests will be described in detail hereinbelow. The embodiments 13 to 31 and comparative example 2 were tested to check the insulation resistance and connection resistance, the embodiments 13 to 25 and comparative example 2 were tested to check the finished precision of the wiring pattern, and the embodiment 16 and comparative example 2 were tested to check the life of the mold.

(A) Evaluation Test 1: Insulation Resistance

The initial insulation resistance of each of the multilayer printed wiring boards as the embodiments 13 to 31 and comparative example 2 produced using respective molds corresponding to the comb patterns of L/S (5/5 μm, 7.5/7.5 μm, 10/10 μm, 12.5/12.5 μm and 15/15 μm) was measured. Then, they were subjected to HAST test (bias test with a voltage of 3.3 V at a temperature of 85° C. and humidity of 85%) and the insulation resistance of the test pieces was measured at elapse of 50 hours, 100 hours, 150 hours and 200 hours, respectively.

Note however that of the above embodiments 13 to 31, the embodiments 26 to 31 produced using a mold corresponding to a comb pattern of L/S=5/5 μm alone were tested as above.

The results of measurement are shown in Tables 6 to 10. It should be noted that the target value of insulation resistance is more than $10^7 \Omega$ as measured at elapse of 50 hours.

TABLE 6

Insulation resistance after start of HAST test (L/S = 5/5 μm)

|  |  | Elapsed time |  |  |  |  |
|---|---|---|---|---|---|---|
|  |  | 0 hour | 50 hours | 100 hours | 150 hours | 200 hours |
| Embodiments | 13 | ○ | ○ | x | x | x |
|  | 14 | ○ | ○ | x | x | x |
|  | 15 | ○ | ○ | ○ | x | x |
|  | 16 | ○ | ○ | ○ | ○ | x |
|  | 17 | ○ | ○ | x | x | x |
|  | 18 | ○ | ○ | x | x | x |
|  | 19 | ○ | ○ | ○ | x | x |
|  | 20 | ○ | ○ | ○ | ○ | x |
|  | 21 | ○ | ○ | ○ | x | x |
|  | 22 | ○ | ○ | ○ | x | x |
|  | 23 | ○ | ○ | ○ | x | x |
|  | 24 | ○ | ○ | ○ | x | x |
|  | 25 | ○ | ○ | x | x | x |
|  | 26 | ○ | ○ | x | x | x |
|  | 27 | ○ | ○ | x | x | x |
|  | 28 | ○ | ○ | x | x | x |
|  | 29 | ○ | ○ | x | x | x |
|  | 30 | ○ | ○ | x | x | x |
|  | 31 | ○ | ○ | x | x | x |
| Comparative example 2 |  | x | x | x | x | x |

NOTE:
* "○" indicates that insulation resistance after start of HAST test is more than $10^7 \Omega$ and "x" indicates that the insulation resistance is less than $10^7 \Omega$.

TABLE 7

Insulation resistance after start of HAST test (L/S = 7.5/7.5 μm)

|  |  | Elapsed time |  |  |  |  |
|---|---|---|---|---|---|---|
|  |  | 0 hour | 50 hours | 100 hours | 150 hours | 200 hours |
| Embodiments | 13 | ○ | ○ | x | x | x |
|  | 14 | ○ | ○ | x | x | x |
|  | 15 | ○ | ○ | ○ | ○ | x |
|  | 16 | ○ | ○ | ○ | ○ | x |

TABLE 7-continued

Insulation resistance after start of HAST test (L/S = 7.5/7.5 μm)

| | | \multicolumn{5}{c}{Elapsed time} | | | | |
|---|---|---|---|---|---|---|
| | | 0 hour | 50 hours | 100 hours | 150 hours | 200 hours |
| | 17 | o | o | o | x | x |
| | 18 | o | o | x | x | x |
| | 19 | o | o | o | o | x |
| | 20 | o | o | o | o | o |
| | 21 | o | o | o | o | x |
| | 22 | o | o | o | o | x |
| | 23 | o | o | o | o | x |
| | 24 | o | o | o | o | x |
| | 25 | o | o | o | x | x |
| Comparative example 2 | | x | x | x | x | x |

NOTE:
* "o" indicates that insulation resistance after start of HAST test is more than $10^7 \Omega$ and "x" indicates that the insulation resistance is less than $10^7 \Omega$.

TABLE 8

Insulation resistance after start of HAST test (L/S = 10/10 μm)

| | | 0 hour | 50 hours | 100 hours | 150 hours | 200 hours |
|---|---|---|---|---|---|---|
| Embodiments | 13 | o | o | x | x | x |
| | 14 | o | o | x | x | x |
| | 15 | o | o | o | o | x |
| | 16 | o | o | o | o | o |
| | 17 | o | o | o | x | x |
| | 18 | o | o | x | x | x |
| | 19 | o | o | o | o | o |
| | 20 | o | o | o | o | o |
| | 21 | o | o | o | o | o |
| | 22 | o | o | o | o | o |
| | 23 | o | o | o | o | o |
| | 24 | o | o | o | o | o |
| | 25 | o | o | o | o | x |
| Comparative example 2 | | x | x | x | x | x |

NOTE:
* "o" indicates that insulation resistance after start of HAST test is more than $10^7 \Omega$ and "x" indicates that the insulation resistance is less than $10^7 \Omega$.

TABLE 9

Insulation resistance after start of HAST test (L/S = 12.5/12.5 μm)

| | | 0 hour | 50 hours | 100 hours | 150 hours | 200 hours |
|---|---|---|---|---|---|---|
| Embodiments | 13 | o | o | o | x | x |
| | 14 | o | o | o | x | x |
| | 15 | o | o | o | o | o |
| | 16 | o | o | o | o | o |
| | 17 | o | o | o | o | x |
| | 18 | o | o | o | x | x |
| | 19 | o | o | o | o | o |
| | 20 | o | o | o | o | o |
| | 21 | o | o | o | o | o |
| | 22 | o | o | o | o | o |
| | 23 | o | o | o | o | o |

TABLE 9-continued

Insulation resistance after start of HAST test (L/S = 12.5/12.5 μm)

| | | 0 hour | 50 hours | 100 hours | 150 hours | 200 hours |
|---|---|---|---|---|---|---|
| | 24 | o | o | o | o | o |
| | 25 | o | o | o | o | o |
| Comparative example 2 | | x | x | x | x | x |

NOTE:
* "o" indicates that insulation resistance after start of HAST test is more than $10^7 \Omega$ and "x" indicates that the insulation resistance is less than $10^7 \Omega$.

TABLE 10

Insulation resistance after start of HAST test (L/S = 15/15 μm)

| | | 0 hour | 50 hours | 100 hours | 150 hours | 200 hours |
|---|---|---|---|---|---|---|
| Embodiments | 13 | O | O | O | O | O |
| | 14 | O | O | O | O | O |
| | 15 | O | O | O | O | O |
| | 16 | O | O | O | O | O |
| | 17 | O | O | O | O | O |
| | 18 | O | O | O | O | O |
| | 19 | O | O | O | O | O |
| | 20 | O | O | O | O | O |
| | 21 | O | O | O | O | O |
| | 22 | O | O | O | O | O |
| | 23 | O | O | O | O | O |
| | 24 | O | O | O | O | O |
| | 25 | O | O | O | O | O |
| Comparative example 2 | | X | X | X | X | X |

NOTE:
* "O" indicates that insulation resistance after start of HAST test is more than $10^7 \Omega$ and "X" indicates that the insulation resistance is less than $10^7 \Omega$.

The results of the evaluation test 1 proved that all the embodiments 13 to 31 had the insulation resistance of more than $10^7 \Omega$ at elapse of 50 hours, which is the target value independently of the line width/interline space (L/S) and that the insulation resistance of the comparative example 2 was less than the target value. It is seen that in case the L/S is 15/15 μm, the insulation resistance of the embodiments 13 to 25 at elapse of 200 hours exceeds the target value of $10^7 \Omega$. Also it is seen that in case L/S is 10/10 μm, the insulation resistance of the embodiments 15 to 17 and embodiments 19 to 25 at elapse of 100 hours exceeds the target value of $10^7 \Omega$.

That is, it was known that the embodiments 15 and 20 in which the interlayer dielectric layer includes the thermosetting resin and at least the photo-curing component, embodiment 17 in which the thermosetting resin was used as the interlayer dielectric material and the steps of transcription of the mold shape and hot-curing were adopted and embodiments 16 and 19 to 25 in which the interlayer dielectric layer was formed from a mixture of thermosetting resin and at least flaky resins were extremely excellent in insulation resistance.

Therefore, the multilayer printed wiring board according to the present invention had been confirmed to be much more excellent in insulation between the wiring patterns that the conventional multilayer printed wiring boards.

(B) Evaluation Test 2: Connection Resistance

Of the embodiments 13 to 31 and comparative example 2, the initial connection resistance of a succession of the eighth connection resistance evaluating patterns with a viahole interposed between them was measured. Then, the embodiments were subjected to a cooling/heating cycle (thermo cycle) test in which cooling at −55° C. for 5 min and heating at 120° C. for 5 min were taken as one cycle. The connection resistance of each of the embodiments having been subjected to 500, 1000, 1500 and 2000 cycles of the test was measured.

The results of measurement are shown in Table 11. It should be noted that the target value of connection resistance is a variation in connection resistance of less than ±10% as measured after the test piece had been subjected to 1000 cycles of the test.

TABLE 11

Connection resistance after cooling/heating cycle test

| | | No. of test cycles | | | |
|---|---|---|---|---|---|
| | | 0 cycle | 500 cycles | 1000 cycles | 1500 cycles | 2000 cycles |
| Embodiments | 13 | ○ | Δ | X | X | X |
| | 14 | ○ | Δ | X | X | X |
| | 15 | ○ | ○ | Δ | X | X |
| | 16 | ○ | ○ | ○ | ○ | Δ |
| | 17 | ○ | ○ | X | X | X |
| | 18 | ○ | ○ | X | X | X |
| | 19 | ○ | ○ | ○ | ○ | Δ |
| | 20 | ○ | ○ | ○ | ○ | ○ |
| | 21 | ○ | ○ | ○ | ○ | Δ |
| | 22 | ○ | ○ | ○ | ○ | Δ |
| | 23 | ○ | ○ | ○ | ○ | Δ |
| | 24 | ○ | ○ | ○ | ○ | Δ |
| | 25 | ○ | ○ | ○ | X | X |
| | 26 | ○ | ○ | X | X | X |
| | 27 | ○ | ○ | X | X | X |
| | 28 | ○ | ○ | X | X | X |
| | 29 | ○ | ○ | X | X | X |
| | 30 | ○ | ○ | X | X | X |
| | 31 | ○ | ○ | X | X | X |
| Comparative example 2 | | X | X | X | X | X |

NOTE:
* "○" indicates that variation in connection insulation is less than ±5%, "Δ" indicates that the variation is over 5% and under 10% in absolute value, and "X" indicates that the variation exceeds ±10%.

Of the embodiments 32 to 36, reference examples 3 and 4 and comparative example 3, the initial connection resistance of the sixth to tenth connection resistance evaluating patterns was measured. Then, the test pieces were subjected to a cooling/heating cycle (thermo cycle) test in which cooling at −55° C. for 30 min and heating at 120° C. for 30 min were taken as one cycle. The connection resistance of each of the test pieces having been subjected to 1000 cycles of the test was measured.

The results of measurement are shown in Table 12. It should be noted that the target value of connection resistance is a variation in connection resistance of less than ±10% as measured after the test piece had been subjected to 1000 cycles of the test.

TABLE 12

Connection resistance after cooling/heating cycle test

| | | | Viahole diameter (in μm) | | | | |
|---|---|---|---|---|---|---|---|
| | | Aspect ratio | 30 | 40 | 50 | 60 | 70 |
| Embodiments | 32 | 100-500 | X | ○ | ○ | ○ | ○ |
| | 33 | 20-30 | X | X | ○ | ○ | ○ |
| | 34 | 100-2000 | X | X | ○ | ○ | ○ |
| | 35 | 100-500 | ○ | ○ | ○ | ○ | ○ |
| | 36 | 100-500 | ○ | ○ | ○ | ○ | ○ |
| Ref. example 3 | | 7-10 | X | X | X | ○ | ○ |
| Ref. example 4 | | 5000-7000 | X | X | X | ○ | ○ |
| Comparative example 3 | | Spherical | X | X | X | X | ○ |

Note:*
"○" indicates that variation in connection resistance is less than ±5%, "Δ" indicates that the variation is over 5% and under 10% in absolute value, and "X" indicates the variation is over ±10%.

As revealed from the results of the evaluation test 2, the variation in connection resistance of the embodiments 13 to 31, measured after 1000 cycles, meets the target value while the variation of the comparative example 2 does not meet the target value.

Further, as the test results show, the variation in connection resistance, measured after 1500 cycles, of the embodiments 16 and 19 to 24 of which the interlayer dielectric layer was formed from the thermosetting resin containing 3 to 50% by weight of flaky particles is less than ±5%. That is, these embodiments have an extremely excellent connection resistance. The comparison of the embodiment 13 with the embodiments 26 to 31 revealed that the multilayer printed wiring board in which the interlayer dielectric layer was formed from a resin containing particles for forming the roughed surface was superior in connection resistance.

Therefore, it was made sure that the multilayer printed wiring board according to the present invention was rather more excellent in connection of wiring patterns via viaholes than the conventional multilayer printed wiring board.

Figure 17:
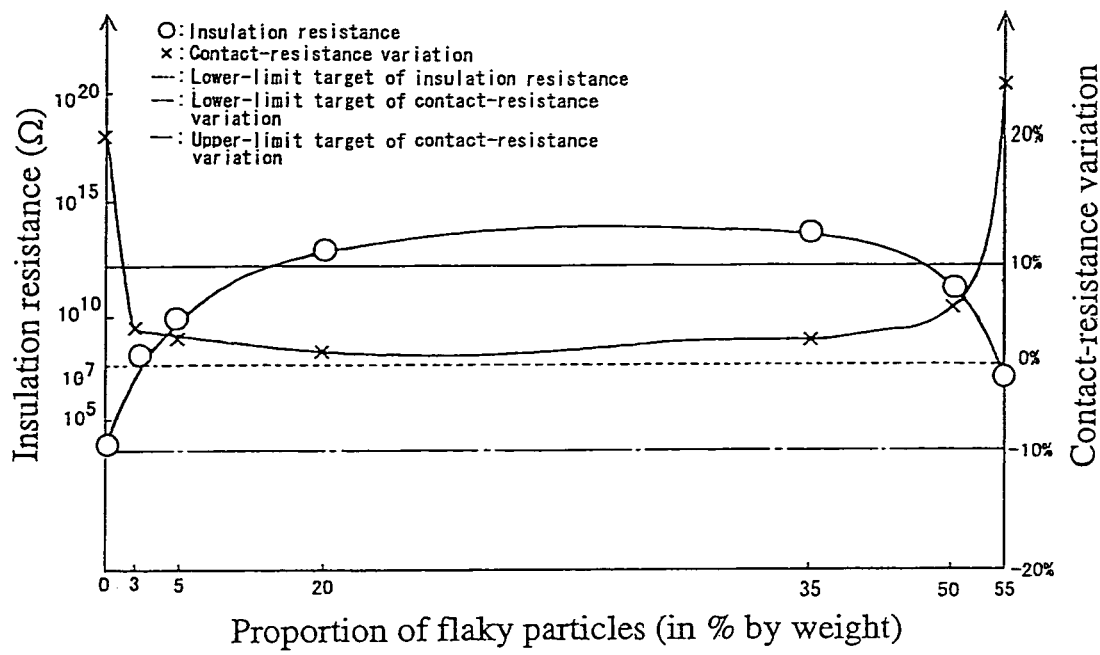
FIG. 17 shows the relation among the proportion (in % by weight) of the flaky particles mixed in the thermosetting resin, insulation resistance of a comb pattern of L/S=5/5 μm, measured in 100 hours after HAST test, and variation in connection resistance of successive patterns via viaholes, measured after 1500 cycles of cooling/heating.
Figure 18:
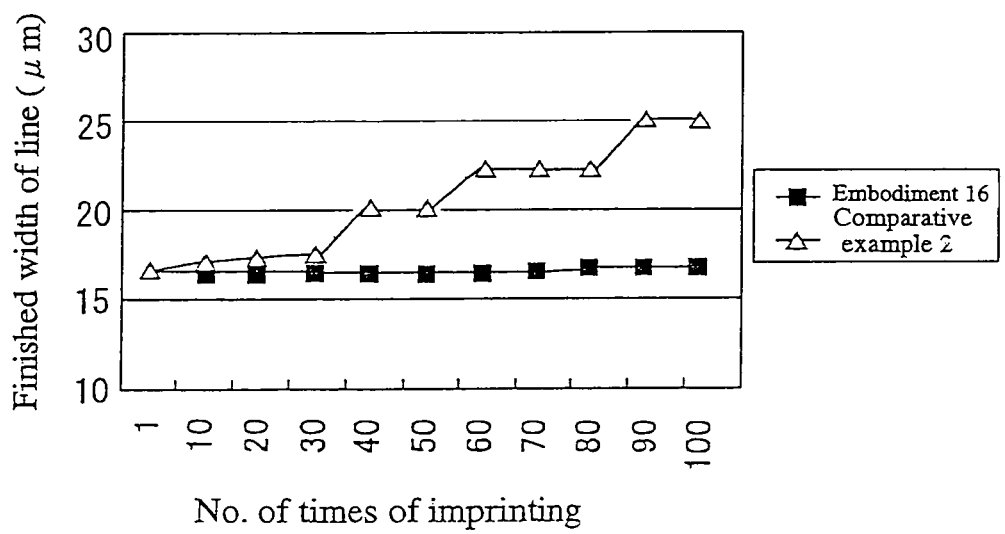
FIG. 18 shows the relation between the number of times the same mold has been used (number of times of imprinting) and finished width of the wiring pattern.
Figure 19A:
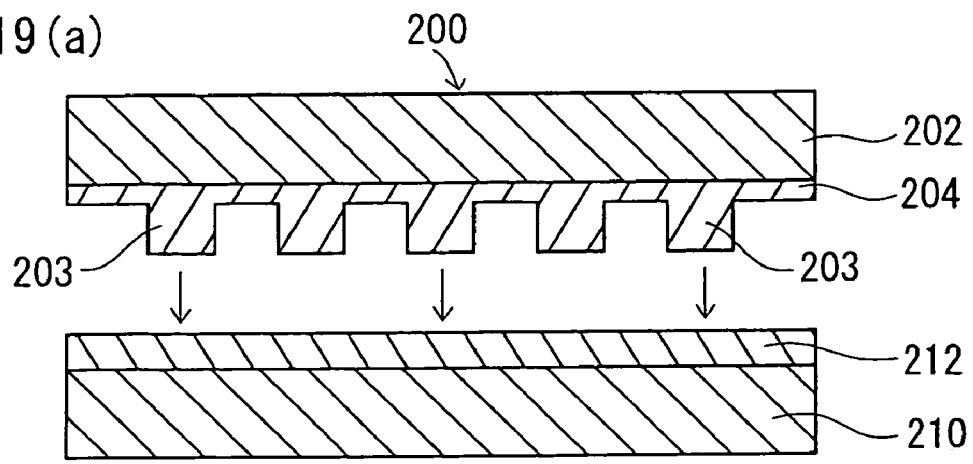
FIGS. 19(a) to 19(c) explain how to a wiring pattern by the conventional imprint method.
Figure 19B:
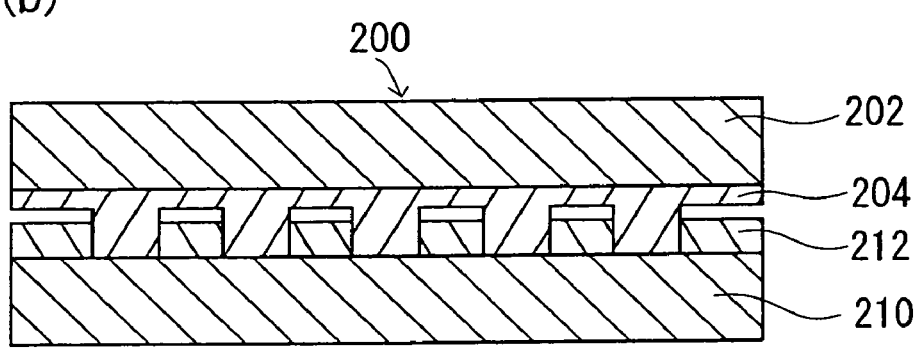
Figure 19C:
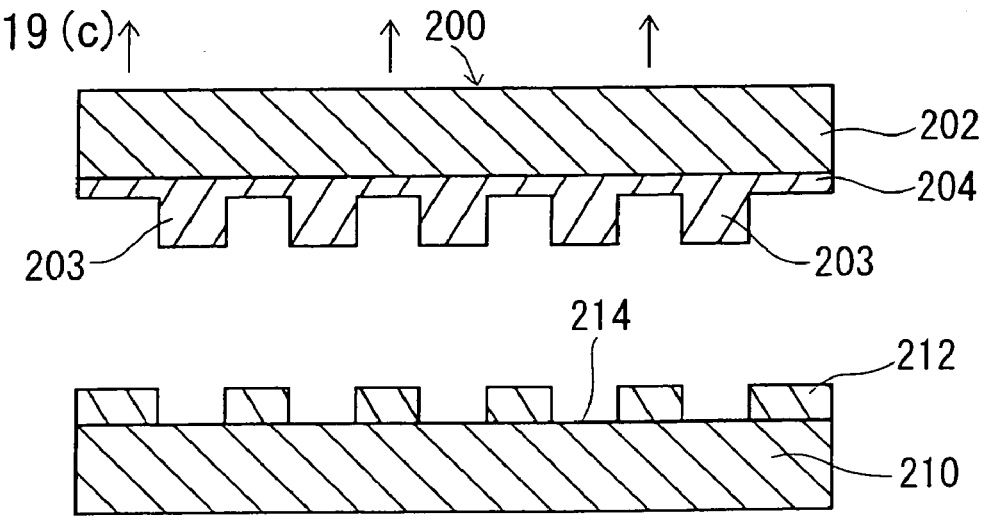

Referring now to FIG. 17, there will be explained the relation among the proportion (in % by weight) of the flaky particles mixed in the thermosetting resin, insulation resistance of a comb pattern of L/S=5/5 μm, measured in 100 hours after the HAST test, and variation in connection resistance of successive connection resistance evaluating pattern, measured after 1500 cooling/heating.

As will be seen from FIG. 17, in case the proportion of the flaky particles is within a range of 3 to 50% by weight, both the insulation resistance and connection reliability requirements for the printed wiring board are satisfied. When the proportion of the flaky particles exceeds 50% by weight, the insulation resistance was lower than the specification because the surface roughness of the interlayer dielectric layer was excessively large and the insulation gap was insufficient. Alternatively, it is inferable that since the proportion of the flaky particles was too large, the particles pressed the resin excessively when the mold was being pressed into the layer, resulting in a smaller insulation gap, namely, a smaller interline space of the wiring pattern. On the other hand, when the proportion of the flaky particles was less than 3% by weight, the shape of the groove formed in the interlayer dielectric layer could not be well maintained so that the interline space was reduced, resulting in the low insulation resistance. Also, it is inferable that when the proportion of the flaky particles was less than 3% by weight, the surface roughness of the interlayer dielectric layer was so low that the viahole was caused to separate from the interlayer dielectric layer. On the other hand, it is inferable that when the proportion was over 50% by weight, the particles remained on the bottom of the viahole so that a separation occurred between the viahole (indicated with a reference numeral 134 in FIG. 12(a)) and viahole pad (indicated with a reference numeral 104 in FIG. 12(a)).

Also, the test results shown in Table 12 revealed that the reliability on the connection via the viahole varies depending upon the shape of the particles dispersed in the interlayer dielectric layer and the flaky particles were more preferable than the spherical ones. Also, it was found that when the viahole is smaller in diameter, the aspect ratio of the flaky particles becomes more important and that the test results that the aspect ratio should preferably be 100 to 500. The result of the test made on the printed wiring board having a viahole of 30 μm in diameter proved that when the resin of the interlayer dielectric layer is of a lower polarity, the reliability on the connection via the viahole is further improved. Inferably, the particles will be uniformly dispersed, not unevenly, because the resin is of a low polarity. Also, it is inferable that when the mold is pressed into a portion, where the particles are unevenly dispersed, of the interlayer dielectric layer, the particles are likely to remain on the bottom of the viahole and the interlayer dielectric layer will vary coefficient of thermal expansion from one to another portion thereof.

(C) Evaluation Test 3: Finished Dimensions (Precision)

Concerning the embodiments 13 to 25 and comparative example 2, a graduated microscope was used to make cross-section observation of a multilayer printed wiring board produced using a mold corresponding to L/S=15/15 μm in order to measure the line width and interline space (L/S) of an actually finished wiring pattern with a magnification of 1000 times. The results of measurement are shown in Table 13.

As will be seen from the results of the evaluation test 3, the deviation of the finished L/S from the L/S=15/15 μm (mold dimensions) was less than 2 μm in all the embodiments 13 to 25. Especially in case the interlayer dielectric layer was formed from the thermosetting resin having the flaky particles mixed therein, the L/S deviation was less than 1 μm which means an extremely excellent finished precision.

TABLE 13

L/S Finished dimensions

| | | Base resin | Additive resin | Photo-curing component added | Photo-curing | Flaky particles | Roughed surface forming particles | Resin temperature | | L/S finished dimension (μm) |
|---|---|---|---|---|---|---|---|---|---|---|
| | | | | | | | | At press-in* | At removal* | |
| Embodiments | 13 | Thermo-setting resin | No | No | No | No | No | T1 | T2 | 16.5/13.5 |
| | 14 | Thermo-setting resin | Thermo-plastic resin | No | No | No | No | T1 | T2 | 16.5/13.5 |
| | 15 | Thermo-setting resin | No | Yes | Yes | No | No | T1 | T2 | 15.5/14.5 |
| | 16 | Thermo-setting resin | No | No | No | 20 wt % | No | T1 | T2 | 15.3/14.7 |
| | 17 | Thermo-setting resin | No | No | No | No | No | T1 | T2 | 16.0/14.0 |
| | 18 | Thermo-setting resin | Thermo-plastic resin | No | No | No | 15 parts by weight | T1 | T2 | 16.5/13.5 |
| | 19 | Thermo-setting resin | No | No | No | 20 wt % | 20 parts by weight | T1 | T2 | 15.3/14.7 |
| | 20 | Thermo-setting resin | No | Yes | Yes | 20 wt % | No | T1 | T2 | 15.0/14.0 |
| | 21 | Thermo-setting resin | No | No | No | 3 wt % | No | T1 | T2 | 15.7/14.3 |
| | 22 | Thermo-setting resin | No | No | No | 5 wt % | No | T1 | T2 | 15.5/14.5 |
| | 23 | Thermo-setting resin | No | No | No | 30 wt % | No | T1 | T2 | 15.3/14.7 |
| | 24 | Thermo-setting resin | No | No | No | 50 wt % | No | T1 | T2 | 15.5/14.5 |
| | 25 | Thermo-setting resin | No | No | No | 55 wt % | No | T1 | T2 | 16.0/14.0 |
| Comparative example 2 | | Thermo-plastic resin | No | No | No | No | No | 210° C. | 150° C. | Short |

NOTE:
*T1: Temperature for lowest melt viscosity of resin ±10° C. T2: Temperature for lowest melt viscosity of resin −30° C. T3: Temperature for lowest melt viscosity of resin +30° C.

In addition to the aforementioned evaluation tests on the electrical properties (A) to (C), a test for making a comparison between the life of the mold used for production of the multilayer printed wiring board according to the present invention and the life of the mold used in the conventional pattern forming method was conducted as in the following:

Life of the mold used in production of the embodiment 16:

(1) The copper-clad laminate in which a 12 μm-thick copper foil is laminated on either side of a dielectric substrate of a 0.8 mm-thick glass epoxy resin was used as a starting material.

(2) The above substrate was blackened.

(3) The resin film for the interlayer dielectric layer prepared in the process (A) for the embodiment 16 was laminated on the substrate.

(4) The base material formed through steps (1) to (3) above was made to the number of 100, and these base materials were numbered 1 to 100.

(5) The base material numbered 1 was taken out of those prepared in step (4) above, and a mold (made of nickel) having formed thereon a convexity (20 μm in projection) corresponding to a wiring pattern of L/S=15/15 μm was pressed into the interlayer dielectric layer of the base material at 100° C. for 3 min under a pressure of 0.8 MPa. The interlayer dielectric layer was cooled until 70° C. was reached. Then, the mold was removed from the film layer.

(6) Thereafter, the same mold was used to form a wiring pattern on each of the interlayer dielectric layers numbered 2 to 100 under the same conditions as in step (5) above.

(7) After forming the wiring patterns, a microscope was used to make cross-section observation of the base materials numbered 1, 10, 20, . . . , 90 and 100 to measure L/S of the pattern transcribed to the interlayer dielectric layer.

The test results are shown in Table 14.

Life of the mold used in production of the comparative example 2:

(1) The copper-clad laminate in which a 12 μm-thick copper foil is laminated on either side of a dielectric substrate of a 0.8 mm-thick glass epoxy resin was used as a starting material.

(2) The substrate was blackened.

(3) The PMMA film used in the comparative example 2 was attached to the substrate.

(4) The base material formed through steps (1) to (3) above was prepared to the number of 100, and these base materials were numbered 1 to 100.

(5) The base material numbered 1 was taken out of those prepared in step (4) above, and a mold (made of nickel) having formed thereon a convexity (20 μm in projection) corresponding to a wiring pattern of L/S=15/15 μm was pressed into the interlayer dielectric layer of the base material at 210° C. for 3 min under a pressure of 14.2 MPa. The interlayer dielectric layer was cooled until a temperature of 150° C. was reached. Then, the mold was removed from the film layer.

(6) Thereafter, the same mold was used to form a wiring pattern on each of the interlayer dielectric layers numbered 2 to 100 under the same conditions as in step (4) above.

(7) After forming the wiring patterns, a microscope was used to make cross-section observation of the base materials numbered 1, 10, 20, . . . , 90 and 100 to measure L/S of the pattern transcribed to the interlayer dielectric layer.

The test results are shown in Table 14.

TABLE 14

| No. of times of imprinting | Finished line width (μm) | |
|---|---|---|
| | Embodiment 16 | Comparative example 2 |
| 1 | 16.5 | 16.7 |
| 10 | 16.5 | 17 |
| 20 | 16.5 | 17.5 |
| 30 | 16.5 | 17.5 |
| 40 | 16.5 | 20 |
| 50 | 16.5 | 20 |
| 60 | 16.5 | 22.5 |
| 70 | 16.5 | 22.5 |
| 80 | 16.7 | 22.5 |
| 90 | 16.7 | 25 |
| 100 | 16.7 | 25 |

The results of the comparison test revealed that in case the interlayer dielectric layer was formed from the PMMA (thermoplastic resin) as in the comparative example 2, since the resin temperature (210° C.) and pressure (14.2 MPa) when the mold was pressed into the layer were considerably higher than those in the embodiment 16, the convexity formed on the mold was crushed when so pressed (imprinting). Especially, when the mold used in the comparative example 2 was imprinted 100 times, it was so crushed that the finished line width was nearly 10 μm thicker. On the other hand, in the case of the mold used in the embodiment 16, the finished line width was found only 0.2 μm thicker. Namely, since the mold used in the present invention has the convexity thereof changed in shape considerably less than the mold used in the conventional method, so it has a longer life.

Evaluation of High-Speed Transmission:

Any one of five types of IC chips (IC chip Nos. 1 to 5) whose driving frequencies and FSB (front side bus) are as shown in Table 15 was mounted on each of the printed wiring boards as the embodiments 37 and 38 and comparative examples 4 and 5. Each of the printed wiring boards was tested as follows:

TABLE 15

| IC chip | Driving frequency (GHz) | FSB (MHz) |
|---|---|---|
| No. 1 | 3.6 | 800 |
| No. 2 | 2.8 | 533 |
| No. 3 | 2.0 | 400 |
| No. 4 | 1.4 | 133 |
| No. 5 | 1.0 | 100 |

A test signal was supplied to a terminal (input terminal; indicated with a reference numeral 148 in FIG. 13(*d*)) on the rear side of the printed wiring board, connected to the signal electrode of the IC chip, and a pulse pattern generator/error detector (e.g., "D3186/3286" by the ADVANTEST) was used to measure the signal having arrived at a terminal (output terminal; indicated with a reference numeral 146 in FIG. 13(*d*)) on the rear side of the printed wiring board after having traveled from the input terminal through a signal circuit (including the viahole and through-hole in the printed wiring board, IC chip and signal circuit to the output terminal. The results of measurement are shown in Table 16.

TABLE 16

|  | IC chip mounted on printed wiring board | | | | |
| --- | --- | --- | --- | --- | --- |
|  | No. 1 | No. 2 | No. 3 | No. 4 | No. 5 |
| Embodiment 37 | ○ | ○ | ○ | ○ | ○ |
| Embodiment 38 | ○ | ○ | ○ | ○ | ○ |
| Comparative example 4 | X | X | X | ○ | ○ |
| Comparative example 5 | X | X | X | ○ | X |

NOTE:
"○" indicates that the IC chip did not malfunction; and
"X" indicates that the IC chip malfunctioned.

As seen from the test results shown in Table 16, no malfunction of the IC chips was found in the printed wiring boards each having a circuit formed in the interlayer dielectric layer in which the flaky particles were dispersed. Inferably, the interlayer dielectric layer was excellent in dimensional precision of the circuit and thus was excellent in impedance matching. Alternatively, the signal circuits were nearly equal in resistance to each other, and thus the signal could be transmitted at a nearly same rate through the signal circuits. Otherwise, it is inferred that the crosstalk was not likely to occur because the flaky particles oriented in all directions existed between the signal circuits. A simulation was made based on the test results. The simulation result showed that on the interlayer dielectric layer according to the present invention, IC chips of which at least FSB were up to 10 GHz would not malfunction.

INDUSTRIAL APPLICABILITY

As having been described in the foregoing, the present invention provides an interlayer dielectric layer intended for use to make a printed wiring board, in which flaky particles are dispersed in a curable resin, and a printed wiring board excellent in cooling/heating cycle (thermo cycle) resistance and packaging reliability without deterioration of the heat resistance, electrical insulation, heat liberation, connection reliability and chemical stability. According to the present invention, the multilayer printed wiring board is produced by the imprint method using a mold having formed thereon a convexity corresponding to a wiring pattern, not by the optical transcription or complicated etching for forming a wiring pattern and viahole. Since the imprint method can be used to transcribe a wiring pattern and viahole easily and accurately to the interlayer dielectric layer, the printed wiring board using this interlayer dielectric layer is excellent in insulation resistance and interlayer connection. Thus, it is possible to produce a multilayer printed wiring board excellent in insulation resistance and interlayer connection and having a finer wiring pattern formed therein extremely easily, at a lower cost and larger scale.

The invention claimed is:

1. An interlayer dielectric layer for use in a printed wiring board, said layer formed on a lower interlayer insulating layer and said lower interlayer insulating layer having a through-hole formed therein, comprising:
  a curable resin disposed on the lower interlayer insulating layer and having a viahole opening with a diameter which is between 40 and 70 μm; and
  flaky particles dispersed in the curable resin,
  wherein at least one of the flaky particles has a ratio of the mean length to the mean width which is 1 to 20,
  the flaky particles have an aspect ratio of mean length to thickness falling with a range of 100 to 500,
  the interlayer dielectric layer is in contact with a conductive wiring pattern disposed on the lower interlayer insulating layer, and
  the conductive wiring pattern has an interline spacing of 12.5 μm or less.

2. The interlayer dielectric layer according to claim 1, wherein at least one of the flaky particles has a mean length ranging from 0.01 to 3 μm, a mean width B ranging from 0.01 to 3 μm and a thickness D ranging from 0.001 to 1 μm.

3. The interlayer dielectric layer according to claim 1, wherein the content of the flaky particles is 1 to 50% by weight in relation to the total including the resin and particles.

4. The interlayer dielectric layer according to claim 1, wherein the flaky particle is a lamination of layered silicate of which the mean interlayer distance is 3 nm or more as determined by the wide-angle X-ray diffractometry or transmission electron microscopy and part or all includes less than 5 layers.

5. The interlayer dielectric layer according to claim 1, wherein the resin for the interlayer dielectric layer is at least one selected from among a thermosetting resin, a mixture of thermosetting resin and thermoplastic resin, a photosensitized thermosetting resin, a mixture of photosensitized thermosetting resin and thermoplastic resin, and a photosensitive resin.

6. The interlayer dielectric layer according to claim 5, wherein the thermosetting resin contains at least a compound containing an epoxy group and a curing agent.

7. The interlayer dielectric layer according to claim 6, wherein the compound containing epoxy group is of a conjugated diene structure.

8. The interlayer dielectric layer according to claim 6, wherein the curing agent has a phenol skeleton.

9. The interlayer dielectric layer according to claim 1, wherein the interlayer dielectric layer is compatible with chip device operational frequencies of 3 to 10 GHz.

10. The interlayer dielectric layer according to claim 1, wherein said through-hole in the lower interlayer insulating layer is formed by drilling, and said viahole opening in the curable resin is formed by imprinting.

* * * * *